US012796045B2

United States Patent
Liu et al.

(10) Patent No.: US 12,796,045 B2
(45) Date of Patent: Nov. 10, 2026

(54) STRUCTURE OF MULTI-GATE SEMICONDUCTOR DEVICES FORMED BY GATE-FIRST PROCESS

(71) Applicant: Taiwan Semiconductor Manufacturing Company, Ltd., Hsin-Chu (TW)

(72) Inventors: Ko-Cheng Liu, Hsinchu City (TW); Chang-Miao Liu, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 559 days.

(21) Appl. No.: 18/157,448

(22) Filed: Jan. 20, 2023

(65) Prior Publication Data

US 2024/0162331 A1 May 16, 2024

Related U.S. Application Data

(60) Provisional application No. 63/383,555, filed on Nov. 14, 2022.

(51) Int. Cl.
*H10D 64/01* (2025.01)
*H10D 30/01* (2025.01)
(Continued)

(52) U.S. Cl.
CPC ......... *H10D 64/017* (2025.01); *H10D 30/014* (2025.01); *H10D 30/43* (2025.01);
(Continued)

(58) Field of Classification Search
CPC .. H10D 64/017; H10D 64/018; H10D 64/691; H10D 30/014; H10D 30/43;
(Continued)

(56) References Cited

U.S. PATENT DOCUMENTS 8,772,109 B2 7/2014 Colinge
8,785,285 B2 7/2014 Tsai et al.
(Continued)

FOREIGN PATENT DOCUMENTS

TW 201801319 A 1/2018
TW 202221844 A 6/2022

*Primary Examiner* — Duy T Nguyen
*Assistant Examiner* — Jiyoung Oh
(74) *Attorney, Agent, or Firm* — HAYNES AND BOONE, LLP

(57) ABSTRACT

The present disclosure provides a method that includes forming a stack including first and second semiconductor layers over a semiconductor substrate, the first and second semiconductor layers having different material compositions and alternating with one another within the stack; forming a dummy gate structure over the stack, the dummy gate structure wrapping around top and sidewall surfaces of the stack; forming a gate spacer on sidewalls of the dummy gate structure and disposed on the top of the stack; forming a dielectric layer with the dummy gate embedded therein; removing the dummy gate structure, resulting in a gate trench; removing the second semiconductor layers through the gate trench such that the first semiconductor layers form semiconductor sheets; forming a metal gate wrapping around the semiconductor sheets; and thereafter, forming a source/drain feature adjacent the metal gate and connecting to the semiconductor sheets.

20 Claims, 55 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 64/68*** | (2025.01) |
| ***H10D 84/83*** | (2025.01) |

(52) U.S. Cl.

CPC ..... *H10D 30/6735* (2025.01); *H10D 30/6757* (2025.01); *H10D 62/121* (2025.01); *H10D 64/018* (2025.01); *H10D 64/691* (2025.01); *H10D 84/83* (2025.01)

(58) Field of Classification Search

CPC ........... H10D 30/6735; H10D 30/6757; H10D 62/121; H10D 62/116; H10D 62/151; H10D 84/83

USPC .......................................................... 257/288

See application file for complete search history.

(56) References Cited

U.S. PATENT DOCUMENTS

| | | | | |
|---|---|---|---|---|
| 8,816,444 | B2 | 8/2014 | Wann et al. | |
| 8,823,065 | B2 | 9/2014 | Wang et al. | |
| 8,860,148 | B2 | 10/2014 | Hu et al. | |
| 9,105,490 | B2 | 8/2015 | Wang et al. | |
| 9,236,267 | B2 | 1/2016 | De et al. | |
| 9,236,300 | B2 | 1/2016 | Liaw | |
| 9,520,482 | B1 | 12/2016 | Chang et al. | |
| 9,576,814 | B2 | 2/2017 | Wu et al. | |
| 2014/0106556 | A1* | 4/2014 | Schram .............. | H10D 84/0177 438/592 |
| 2018/0198000 | A1* | 7/2018 | Romanescu ....... | H10D 30/0217 |
| 2020/0381545 | A1* | 12/2020 | Chiang ................ | H10D 30/014 |
| 2021/0273096 | A1* | 9/2021 | Yang .................. | H10D 30/0217 |
| 2022/0238385 | A1* | 7/2022 | Chang .................. | H10D 30/014 |
| 2022/0336461 | A1* | 10/2022 | Chung ................. | H10D 30/014 |
| 2022/0359701 | A1 | 11/2022 | Chiang et al. | |
| 2022/0367462 | A1* | 11/2022 | Chiang .............. | H10D 30/0198 |

* cited by examiner

STRUCTURE OF MULTI-GATE SEMICONDUCTOR DEVICES FORMED BY GATE-FIRST PROCESS

PRIORITY DATA

This application claims priority to U.S. Provisional Patent Application Ser. No. 63/383,555 filed on Nov. 14, 2022, the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing, and for these advancements to be realized, similar developments in IC processing and manufacturing are needed.

For example, multi-gate devices have been introduced in an effort to improve gate control by increasing gate-channel coupling, reduce OFF-state current, and reduce short-channel effects (SCEs). One such multi-gate device is a gate-all-around (GAA) transistor, whose gate structure extends around its channel region, thereby providing access to the channel region on all sides. Such GAA transistors are compatible with conventional complementary metal-oxide-semiconductor (CMOS) processes, allowing them to be aggressively scaled down while maintaining gate control and mitigating SCEs. However, conventional methods for GAA devices may experience challenges, including epitaxial loss in the source/drain region, variation of channel lengths, and weak regions of gate electrodes, and gate work function shifting, especially as device size is scaled down. Therefore, although conventional GAA devices have been generally adequate for their intended purposes, they are not satisfactory in every respect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
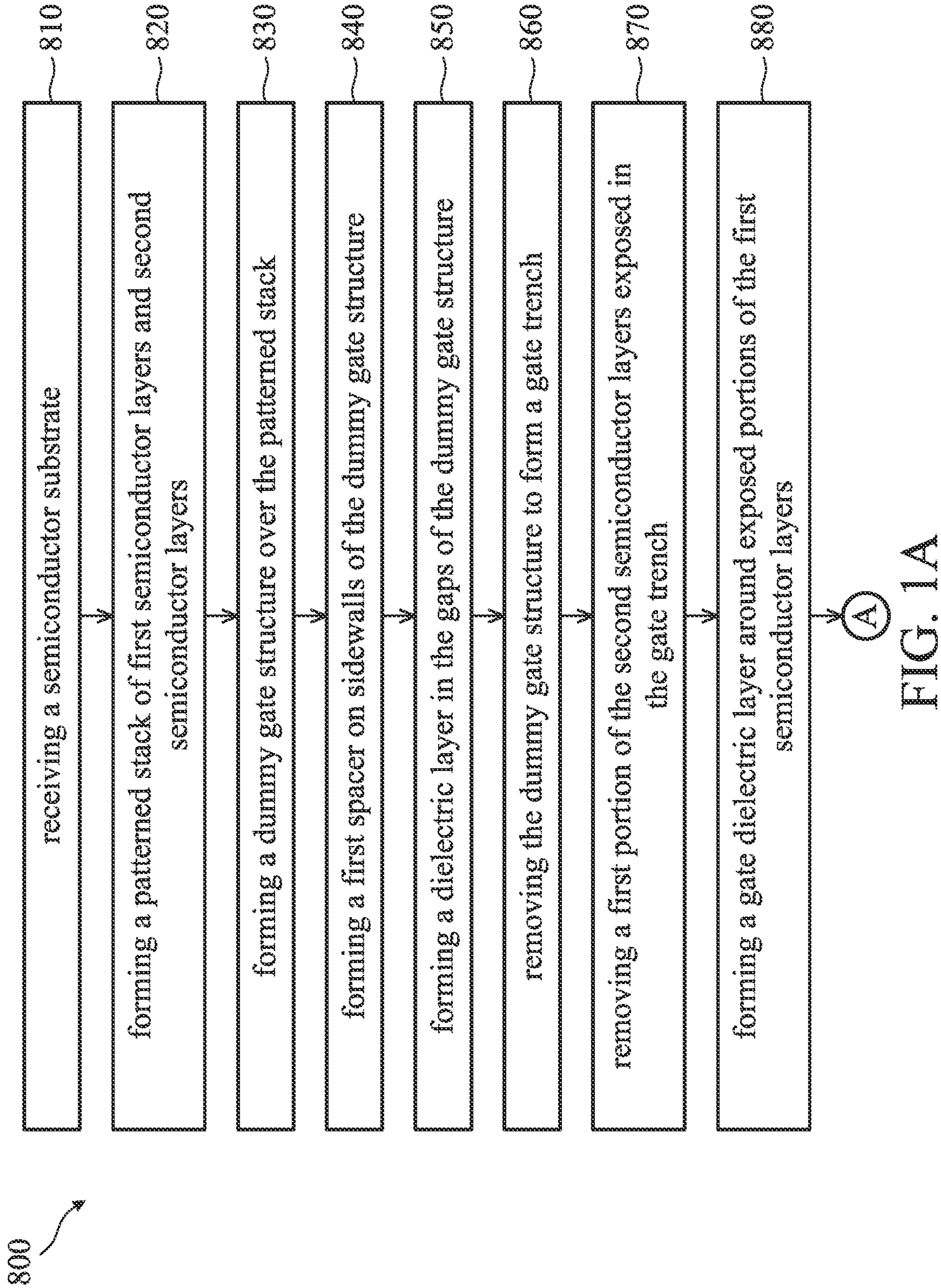
FIGS. 1A, 1B, and 1C are flow charts of an example method for fabricating an embodiment of a GAA device according to some embodiments of the present disclosure.

The following disclosure provides many different embodiments, or examples, for implementing different features. Reference numerals and/or letters may be repeated in the various examples described herein. This repetition is for the purpose of simplicity and clarity and does not in itself dictate a relationship between the various disclosed embodiments and/or configurations. Further, specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. Moreover, the formation of a feature on, connected to, and/or coupled to another feature in the present disclosure may include embodiments in which the features are formed in direct contact, and may also include embodiments in which additional features may be formed interposing the features, such that the features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one feature relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described, or other values as understood by person skilled in the art. For example, the term "about 5 nm" encompasses the dimension range from 4.5 nm to 5.5 nm.

The present disclosure relates generally to an integrated circuit (IC) structure and a method making the same, and more particularly, to a multi-gate semiconductor device. Multi-gate devices (e.g. gate-all-around (GAA) devices) have been introduced in an effort to improve gate control by increasing gate-channel coupling, reduce OFF-state current, and reduce short-channel effects (SCEs). GAA devices can be aggressively scaled down while maintaining gate control and mitigating SCEs. However, conventional methods for GAA devices may experience challenges, including epitaxial loss in the source/drain region, variation of channel length, and weak regions of gate electrodes, and gate work function shifting. These drawbacks are exacerbated as device size is scaled down.

The present disclosure is generally related to ICs and semiconductor devices and methods of forming the same. More particularly, the present disclosure is related to GAA devices. A GAA device includes any device that has its gate structure, or portions thereof, formed around all-sides of a channel region (e.g. surrounding a portion of a channel region). In some instances, a GAA device may also be referred to as a quad-gate device where the channel region has four sides and the gate structure is formed on all four sides. The channel region of a GAA device may include one or more semiconductor layers, each of which may be in one of many different shapes, such as wire (or nanowire), sheet (or nanosheet), bar (or nano-bar), and/or other suitable shapes. In embodiments, the channel region of a GAA device may have multiple horizontal semiconductor layers (such as nanowires, nanosheets, or nano-bars) (hereinafter collectively referred to as "nanochannels") vertically spaced, making the GAA device a stacked horizontal GAA device. The GAA devices presented herein may be a complementary metal-oxide-semiconductor (CMOS) GAA device, a p-type metal-oxide-semiconductor (pMOS) GAA device, or an n-type metal-oxide-semiconductor (nMOS) GAA device. Further, the GAA devices may have one or more channel regions associated with a single, contiguous gate structure, or multiple gate structures. One of ordinary skill may recognize other examples of semiconductor devices that may benefit from aspects of the present disclosure. For example, other types of metal-oxide semiconductor field effect transistors (MOSFETs), such as planar MOSFETs, FinFETs, other multi-gate FETs may benefit from the present disclosure. The GAA devices and methods of manufacture that are proposed in the present disclosure exhibit desirable properties, examples being: (1) a metal gate-first process that forms metal gate electrodes that are free of work function shifting and maintain strong control to the gate corners; (2) eliminated or reduced epitaxial loss of the source/drain features; and (3) decreased variation of channel lengths.

In the illustrated embodiments, the IC device includes a GAA device 100. The GAA device 100 may be fabricated during processing of the IC, or a portion thereof, that may include static random access memory (SRAM) and/or logic circuits, passive components such as resistors, capacitors, and inductors, and active components such as p-type field effect transistors (pFETs), n-type FETs (nFETs), FinFETs, MOSFETs, CMOS, bipolar transistors, high voltage transistors, high frequency transistors, other memory cells, and combinations thereof.

Figure 1B:
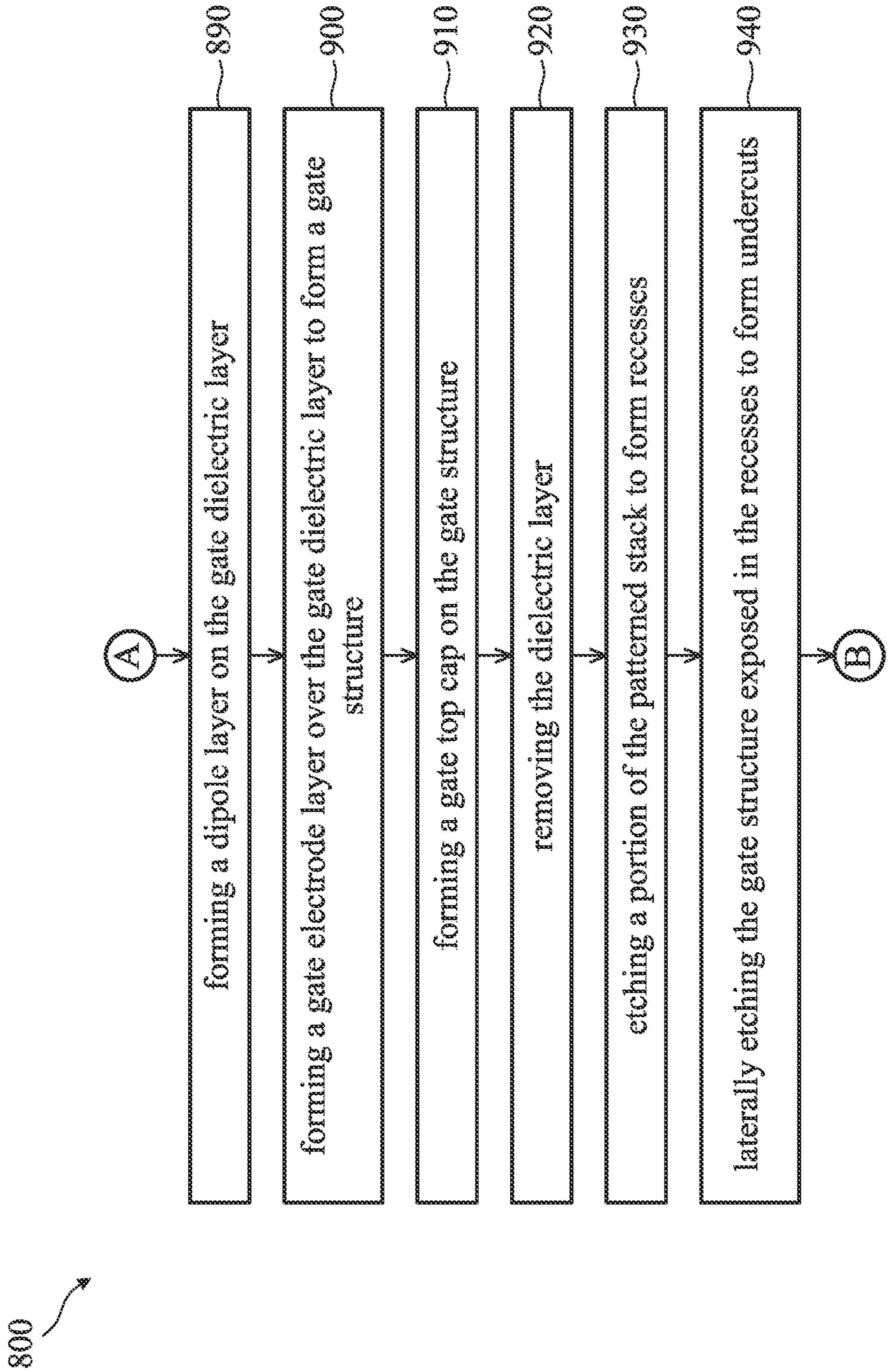
Figure 1C:
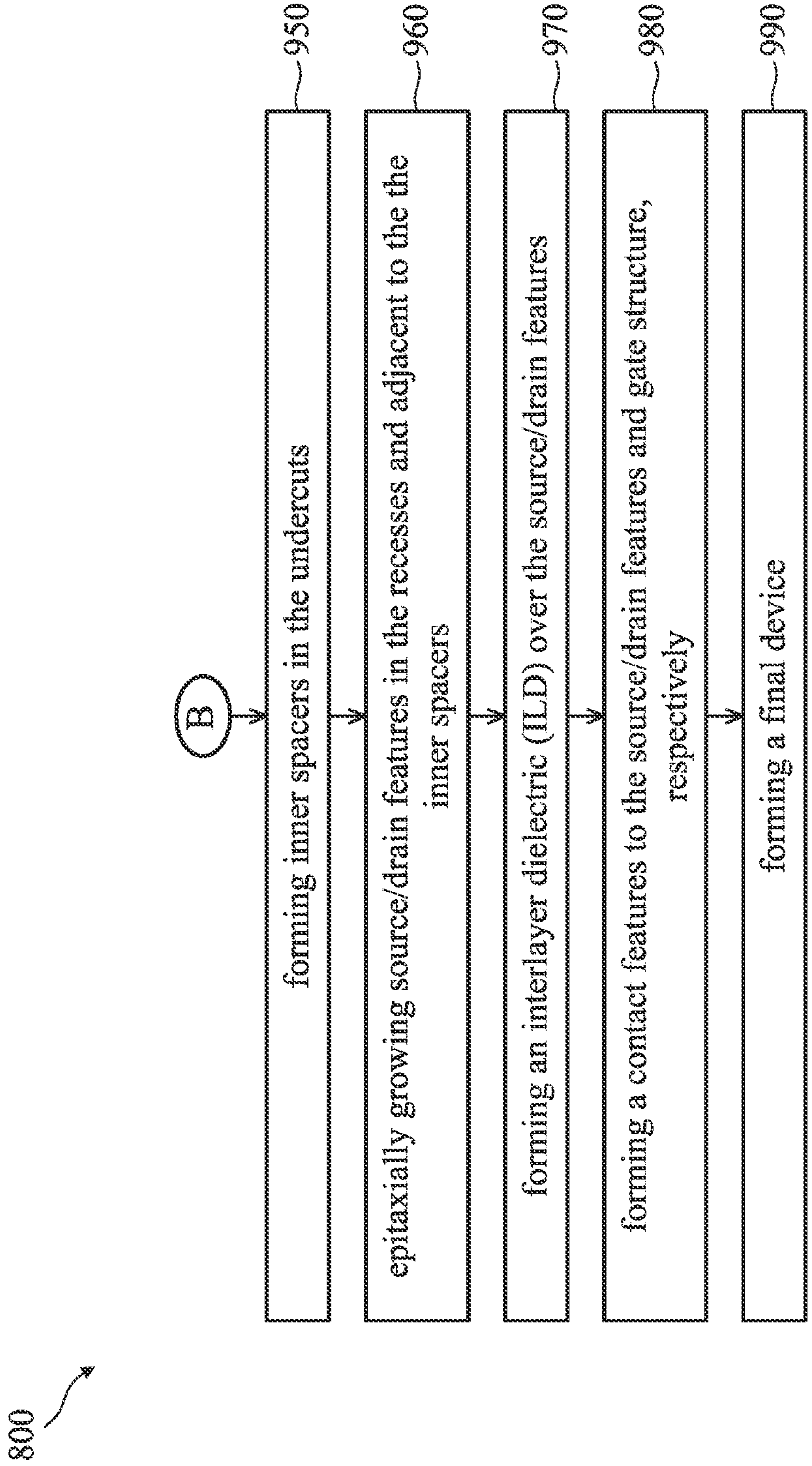
Figure 2A:
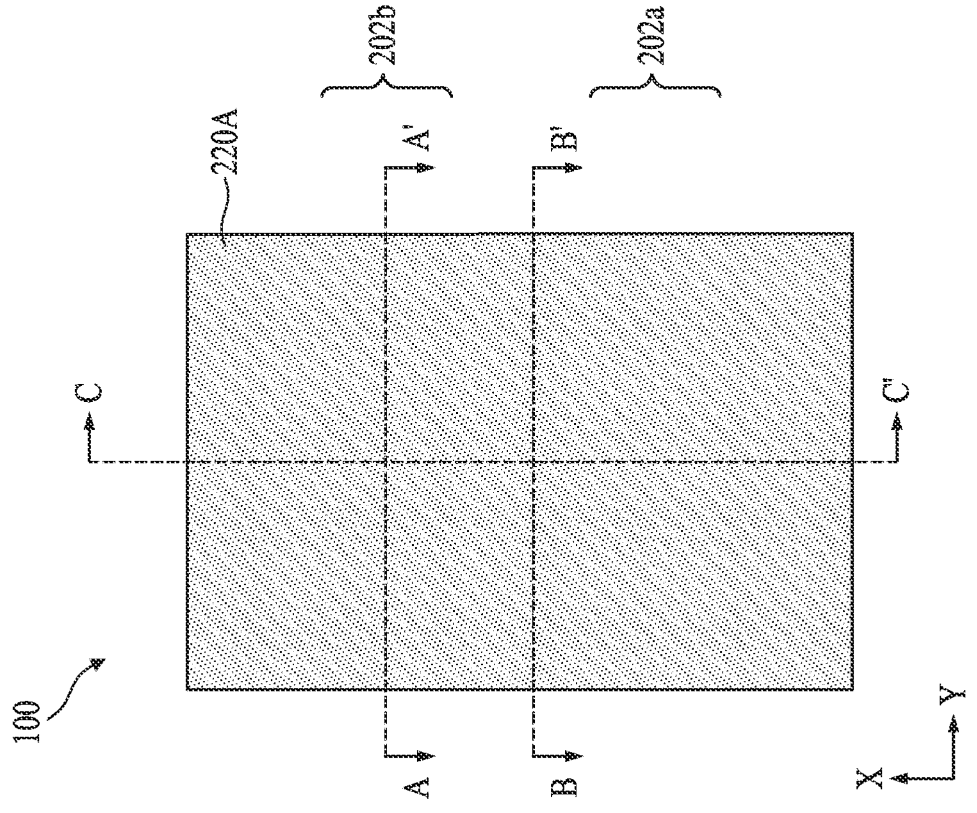
FIGS. 2A, 3A, 4A, 5A, 6A, 7A, 8A, 9A, 10A, 11A, 13A, 14A, 15A, 16A, 17A, 18A, 19A, 20A, 21A, 22A, 23A, and 24A are top views of embodiments of GAA devices of the present disclosure constructed at various fabrication stages according to some embodiments of the present disclosure.
Figure 2B:
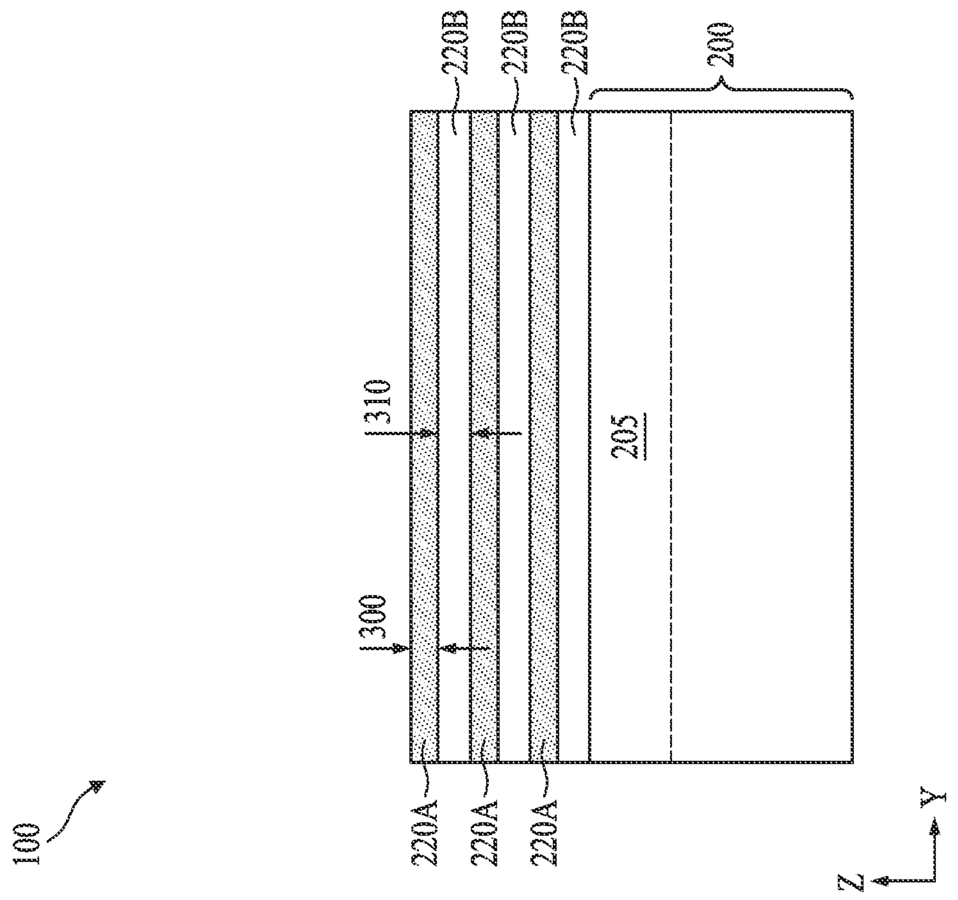
FIGS. 2B, 3B, 4B, 5B, 6B, 7B, 8B, 9B, 10B, 11B, 13B, 14B, 15B, 16B, 17B, 18B, 19B, 20B, 21B, 22B, 23B, and 24B are cross sectional views of embodiments of GAA devices of the present disclosure along the line A-A' in FIGS. 2A-11A and 13A-24A, respectively, according to some embodiments of the present disclosure.
Figure 2D:
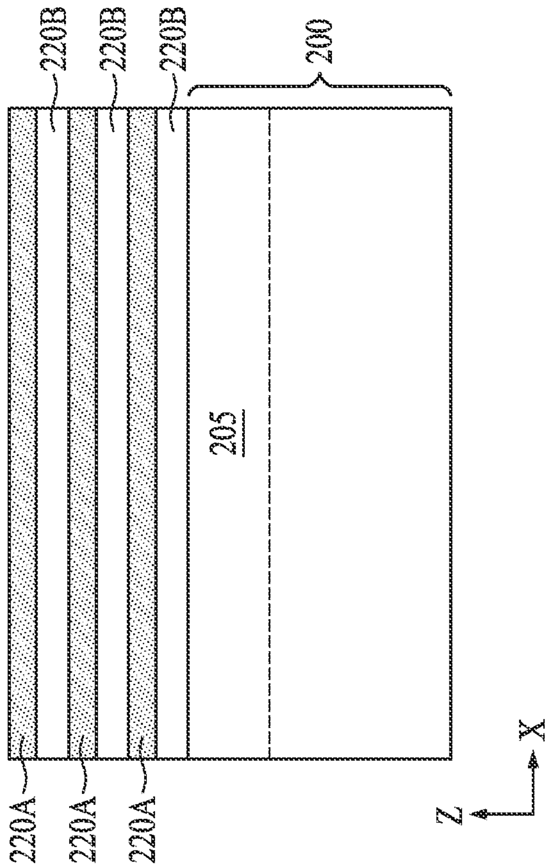
FIGS. 2D, 3D, 4D, 5D, 6D, 7D, 8D, 9D, 10D, 11D, 13D, 14D, 15D, 16D, 17D, 18D, 19D, 20D, 21D, 22D, 23D, and 24D are cross sectional views of embodiments of GAA devices of the present disclosure along the line C-C' in FIGS. 2A-11A and 13A-24A, respectively, according to some embodiments of the present disclosure.
Figure 2C:
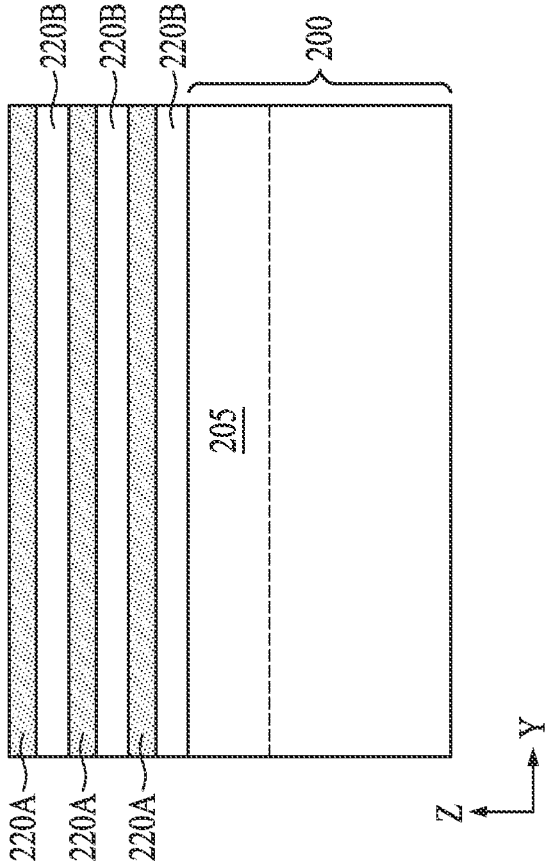
FIGS. 2C, 3C, 4C, 5C, 6C, 7C, 8C, 9C, 10C, 11C, 13C, 14C, 15C, 16C, 17C, 18C, 19C, 20C, 21C, 22C, 23C, and 24C are cross sectional views of embodiments of GAA devices of the present disclosure along the line B-B' in FIGS. 2A-11A and 13A-24A, respectively, according to some embodiments of the present disclosure.
Figure 10B:
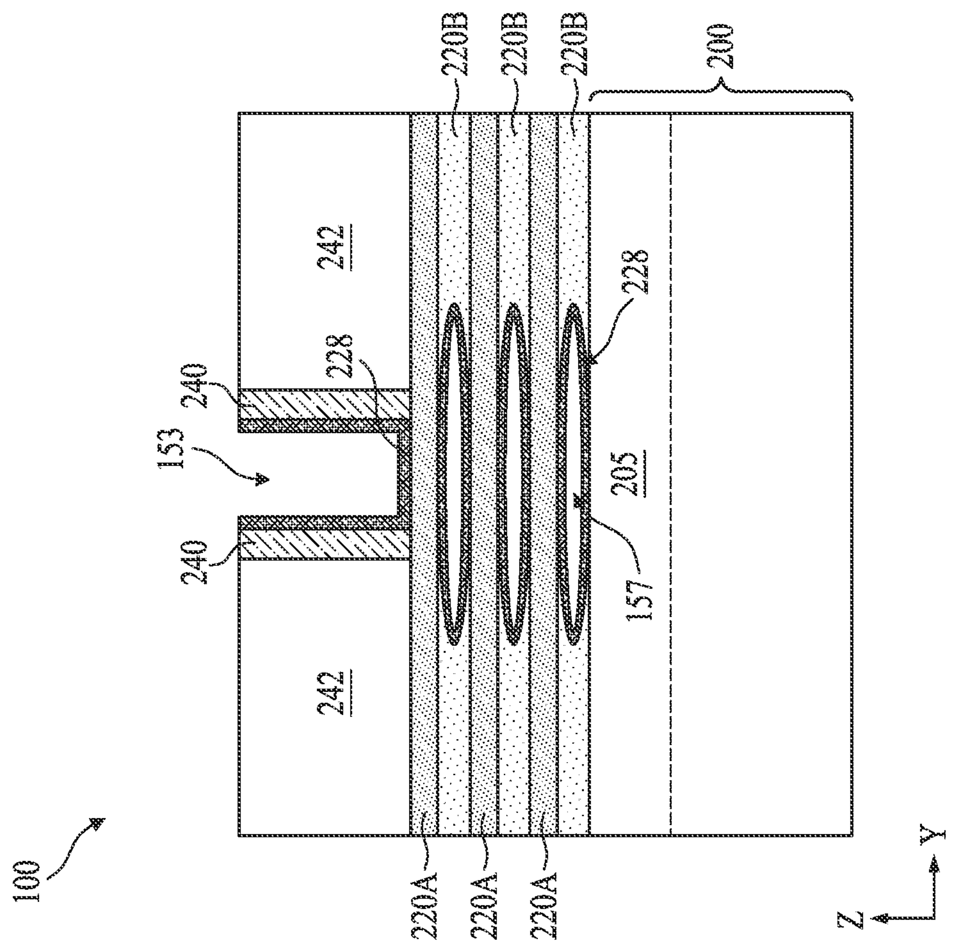
Figure 10A:
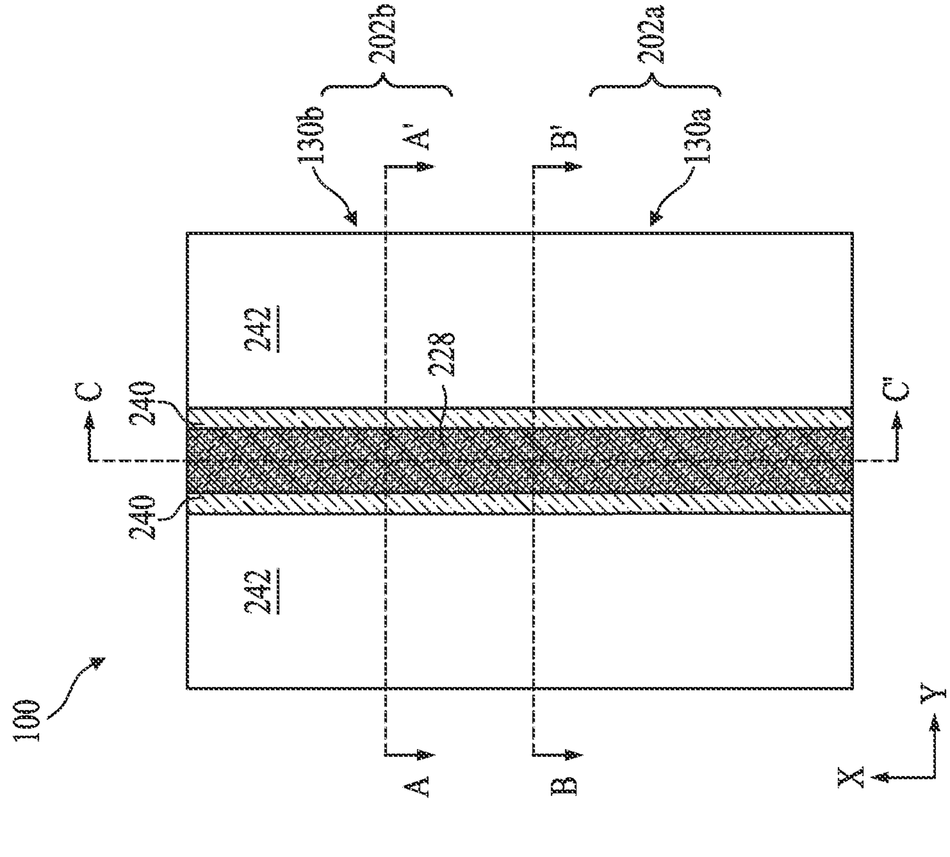
Figure 10C:
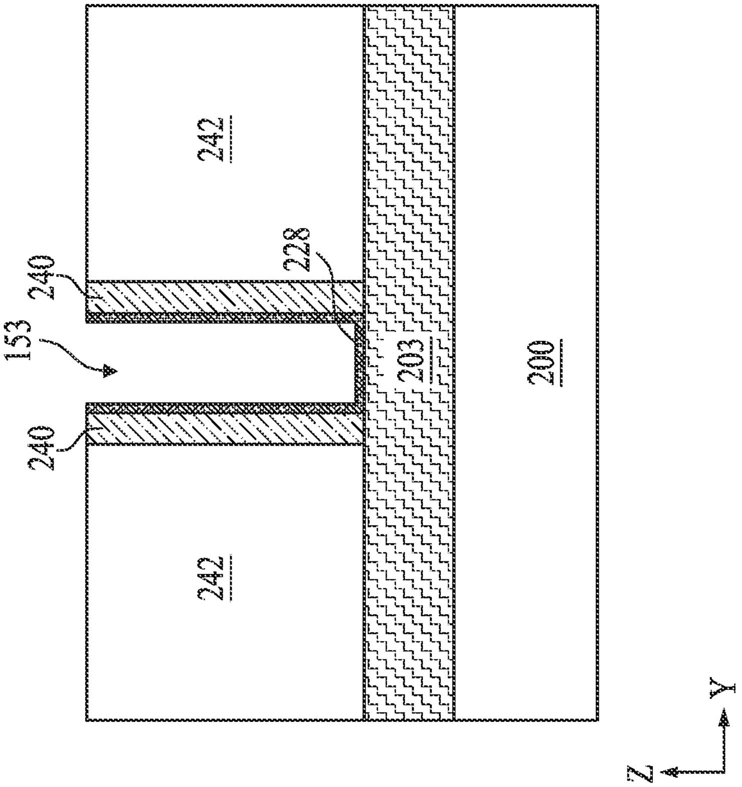
Figure 10D:
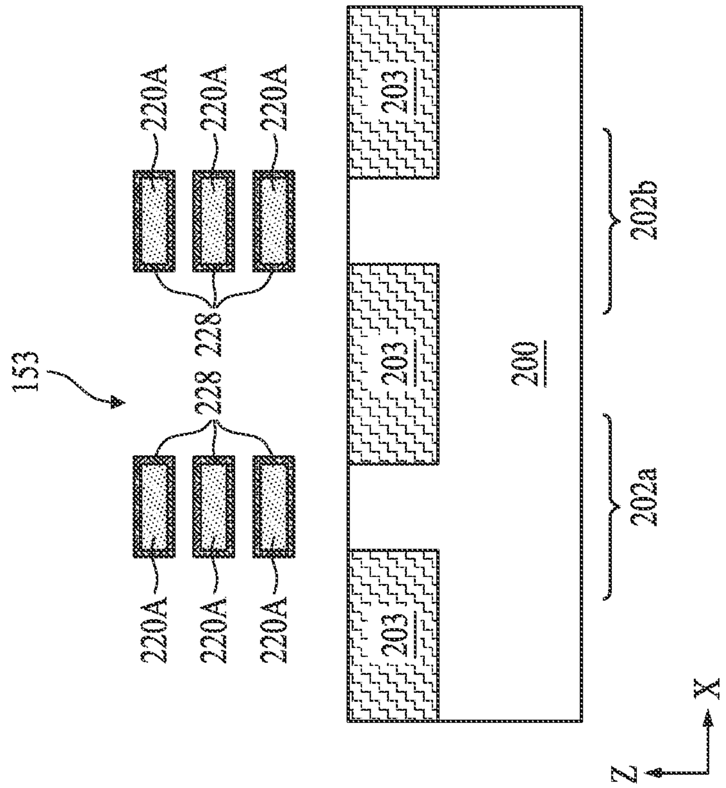
Figure 10F:
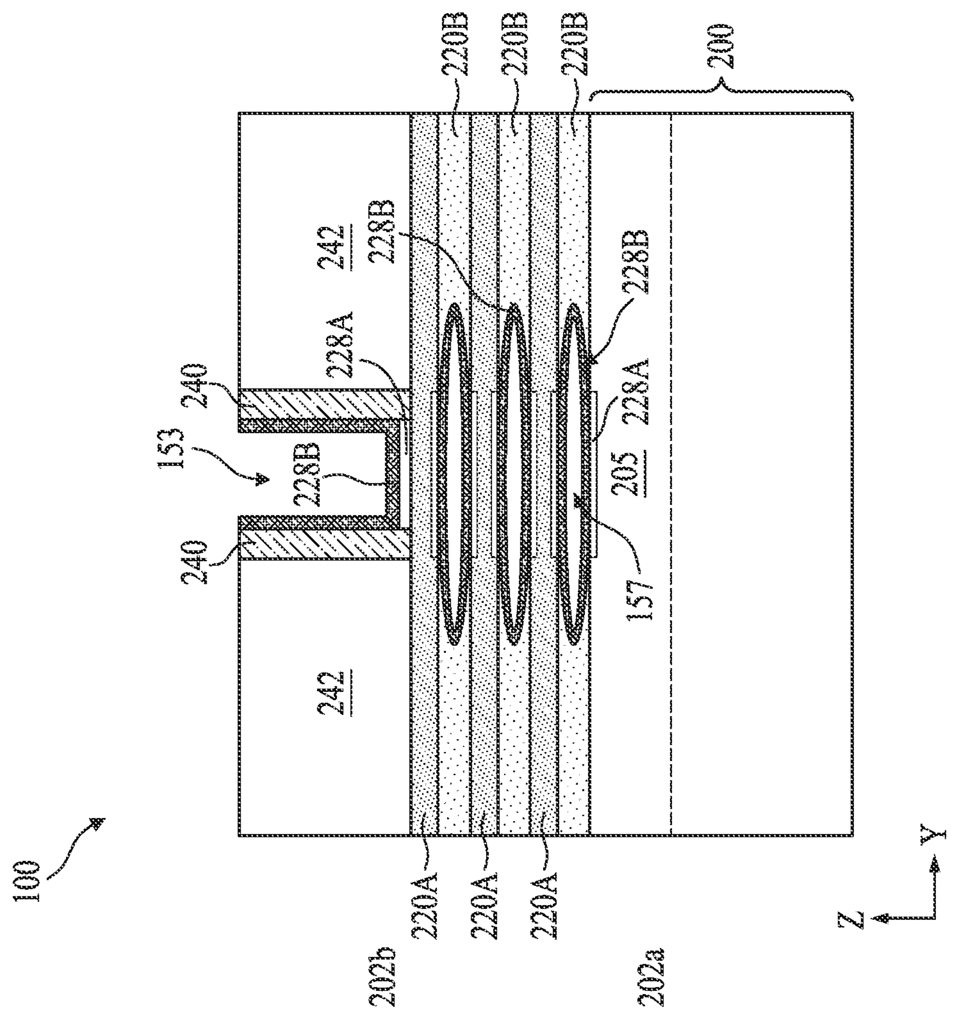
FIGS. 10F, 10G, and 10H are cross sectional views of an embodiment of a GAA device of the present disclosure along the lines A-A', B-B', and C-C' in FIG. 10E, respectively, according to some embodiments of the present disclosure.
Figure 10E:
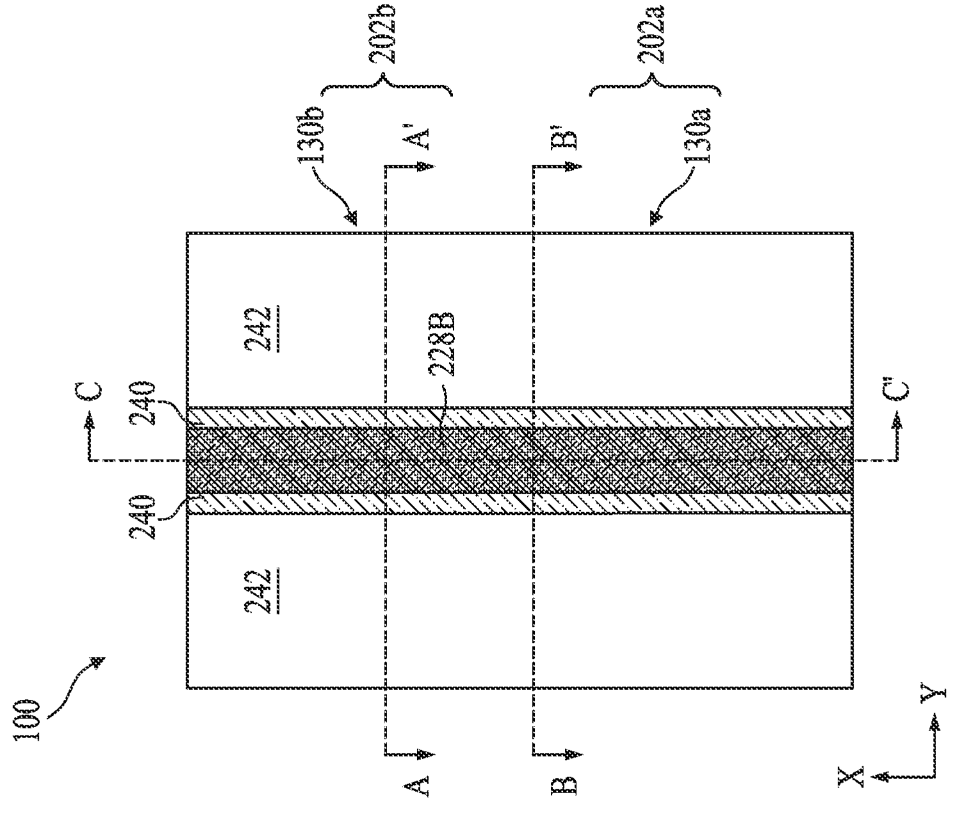
FIGS. 10E and 19F are top views of a GAA device at various fabrication stages constructed according to some embodiments of the present disclosure.
Figure 10G:
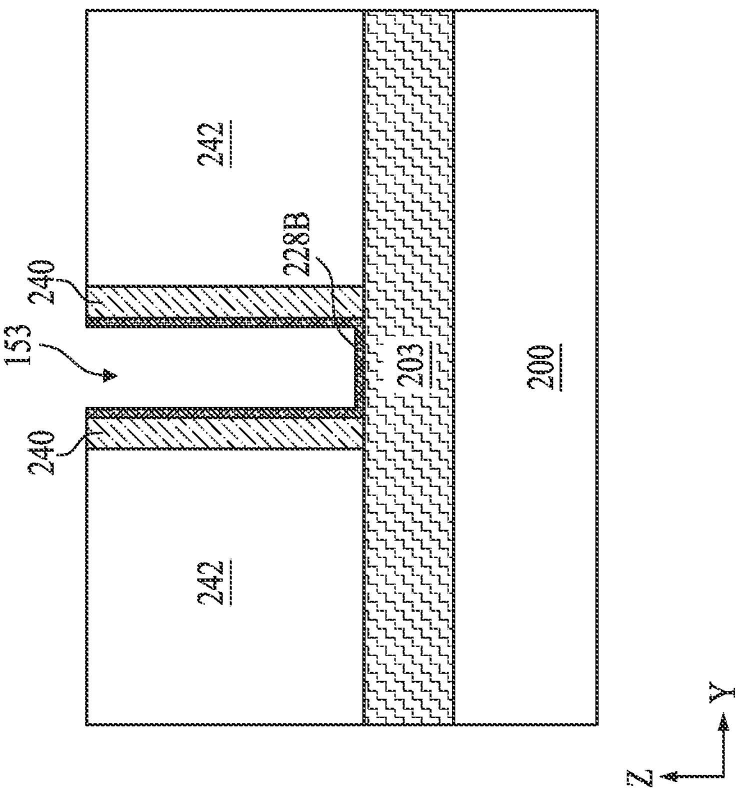
Figure 10H:
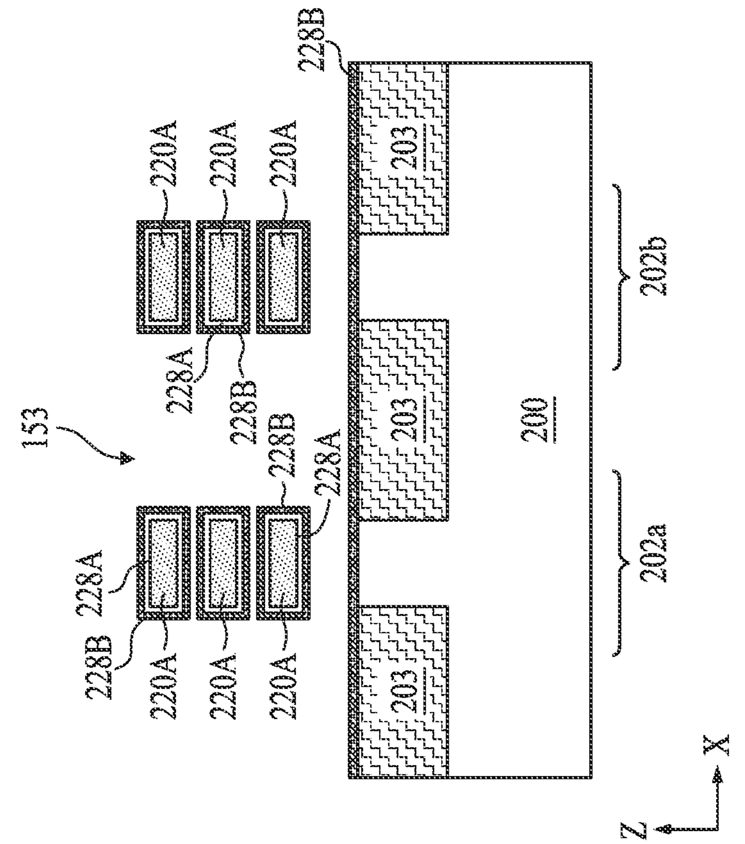
Figure 11A:
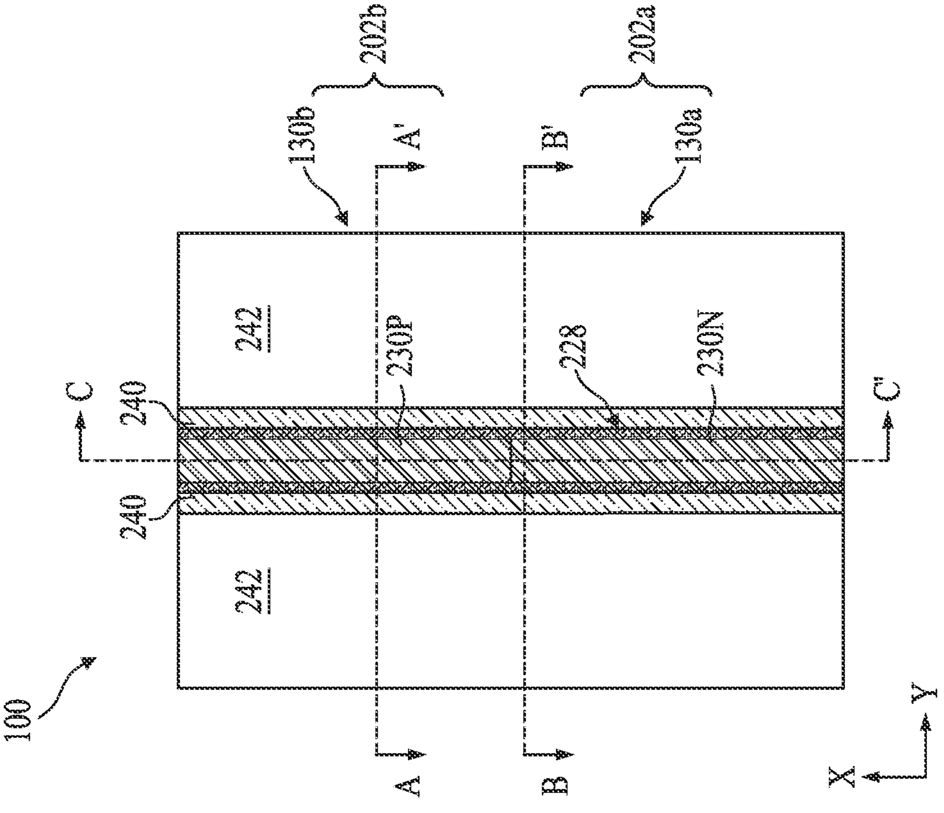
Figure 11B:
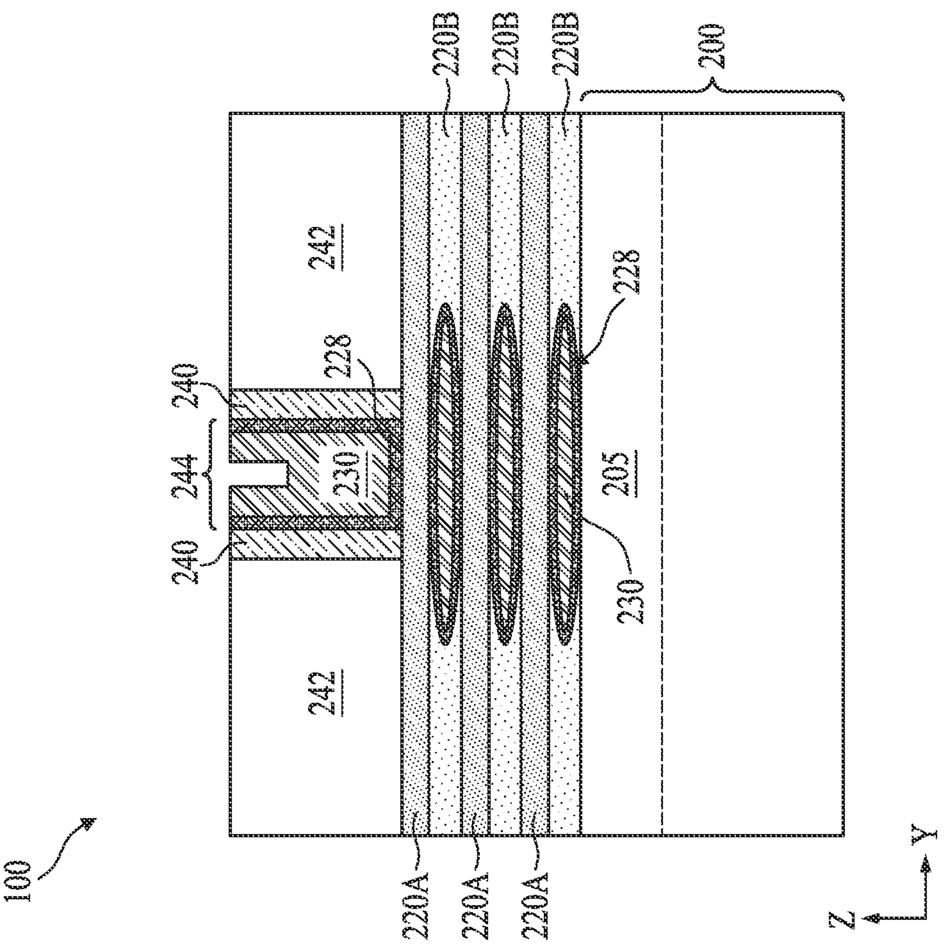
Figure 11D:
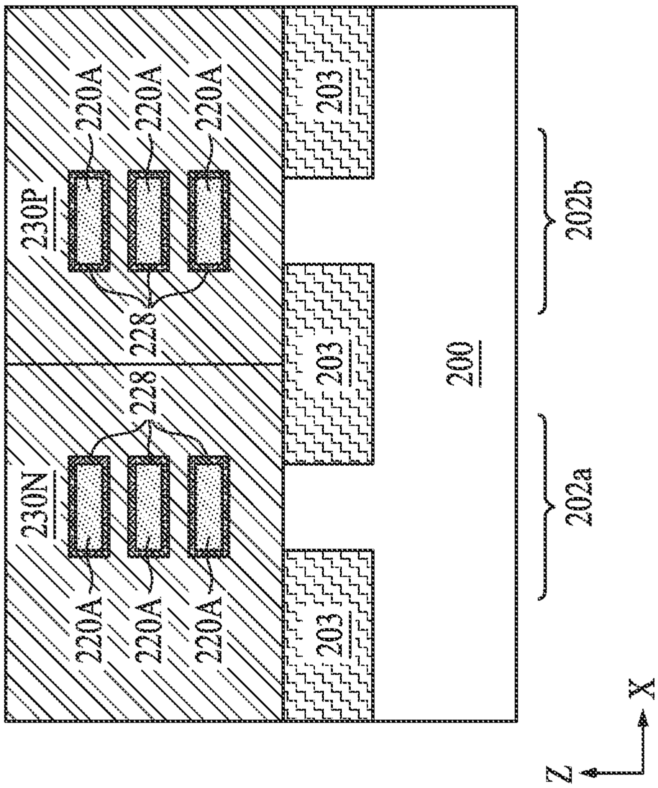
Figure 11C:
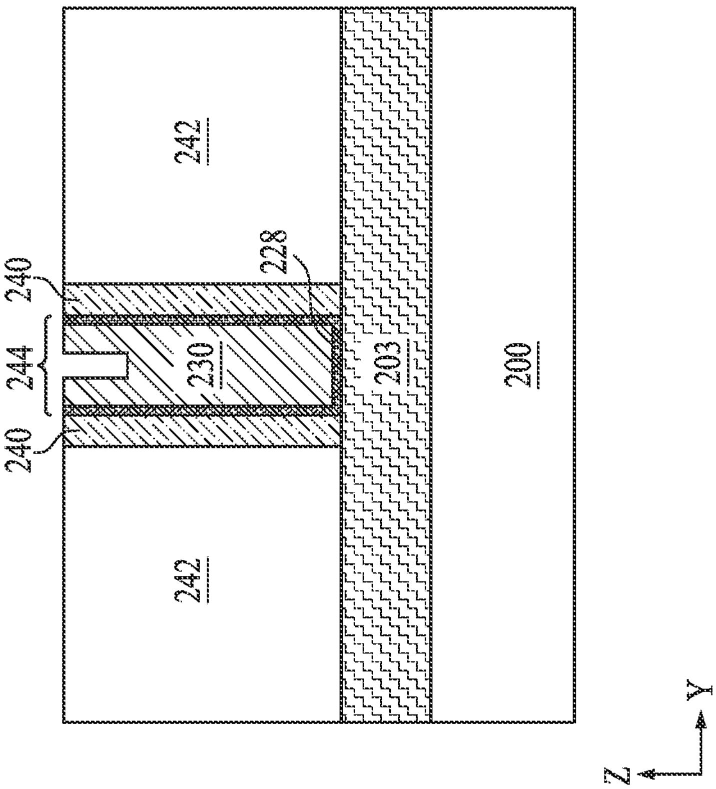
Figure 11E:
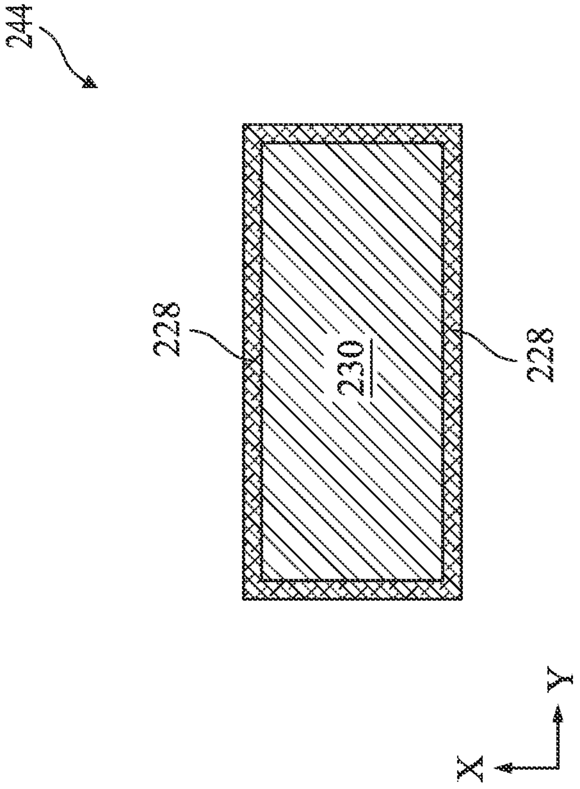
FIGS. 11E, 16E, and 19E are top views of an embodiment of a GAA device of the present disclosure, in portion, according to some embodiments of the present disclosure.
Figure 12A:
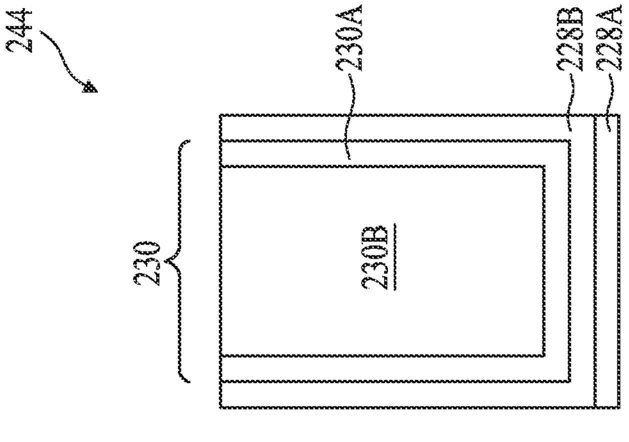
FIGS. 12A, 12B, and 12C are cross sectional views of the gate structure of the GAA device of the present disclosure, in portion, according to some embodiments of the present disclosure.
Figure 12B:
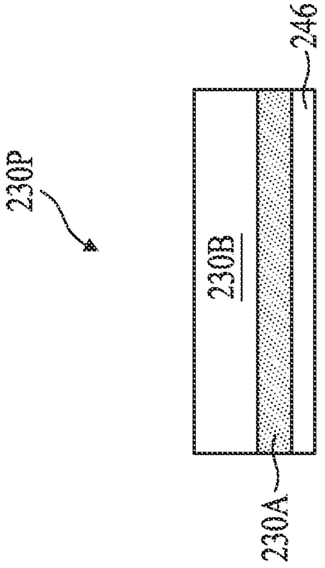
Figure 12C:
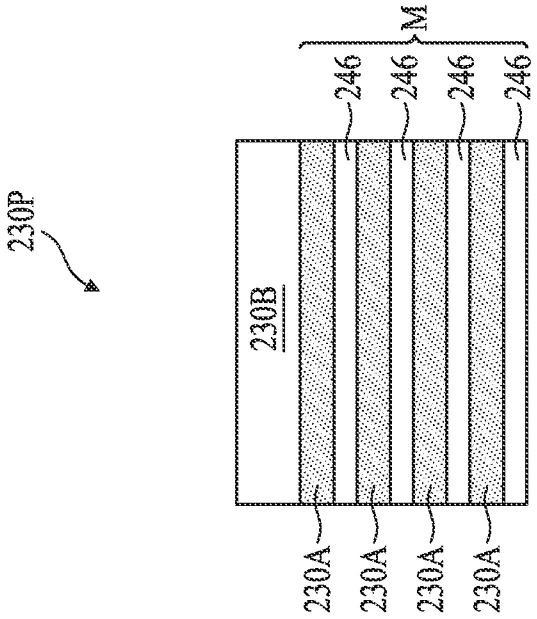
Figure 13B:
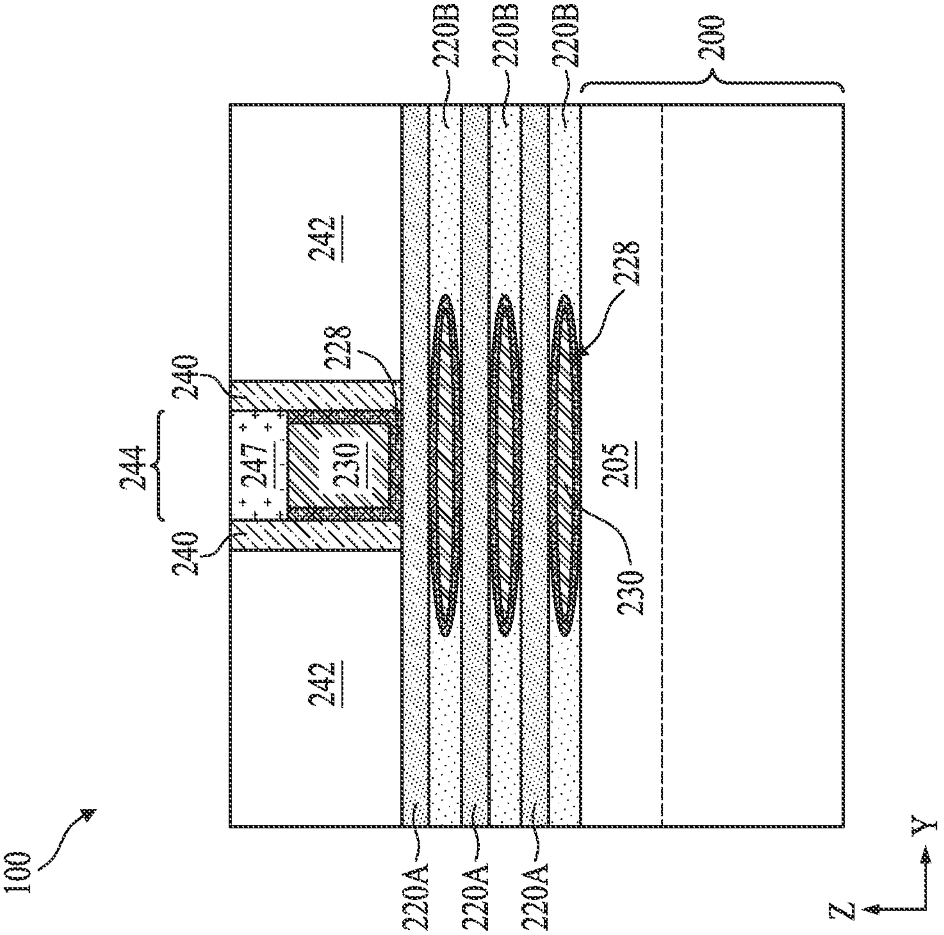
Figure 13A:
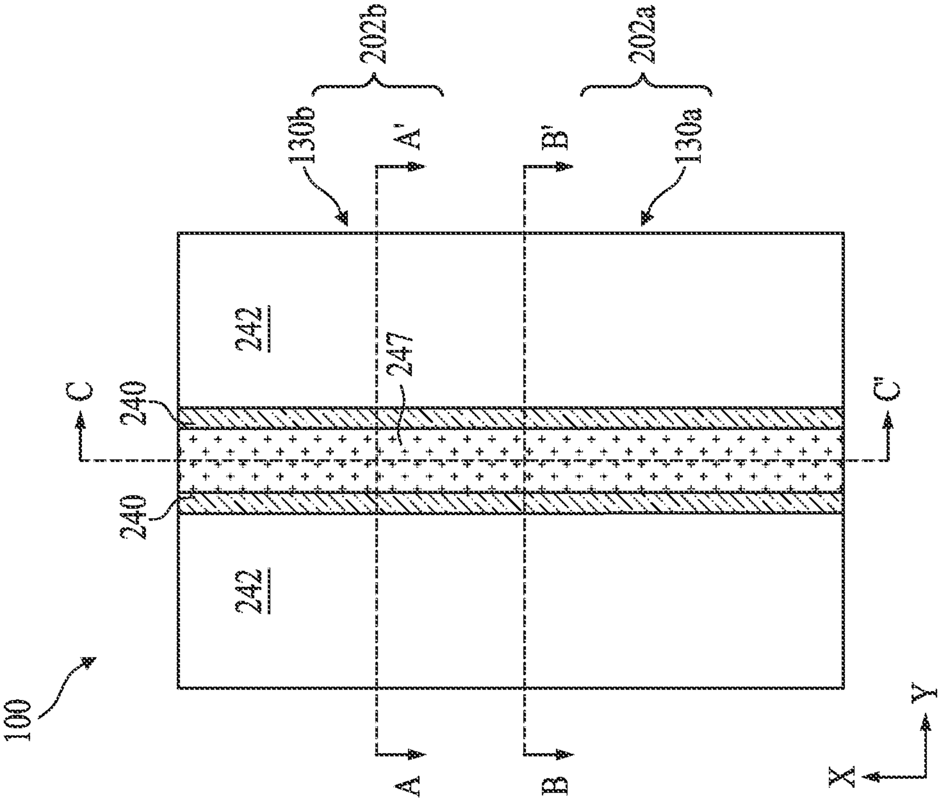
Figure 13D:
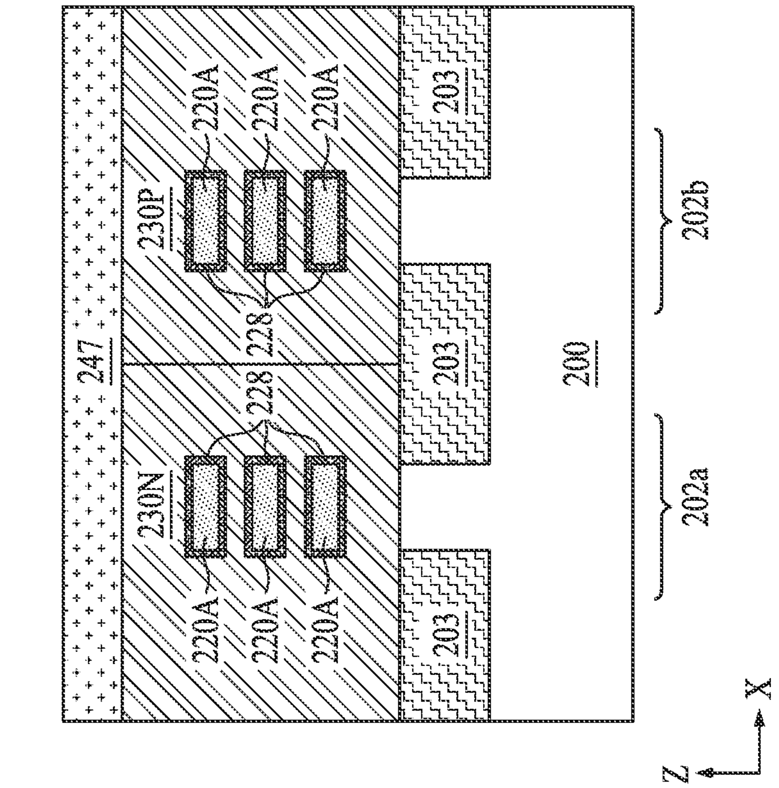
Figure 13C:
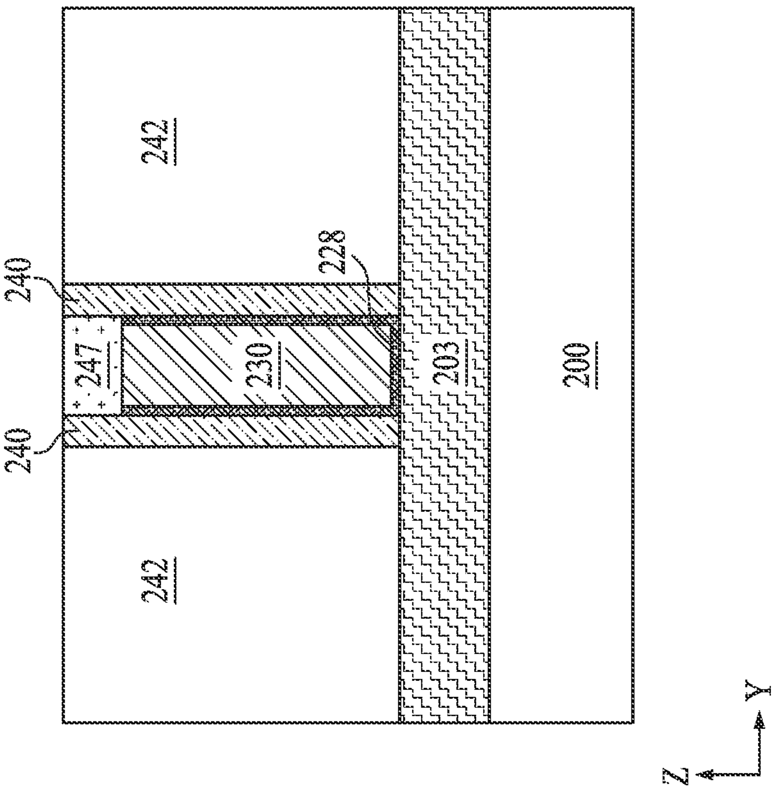
Figure 14A:
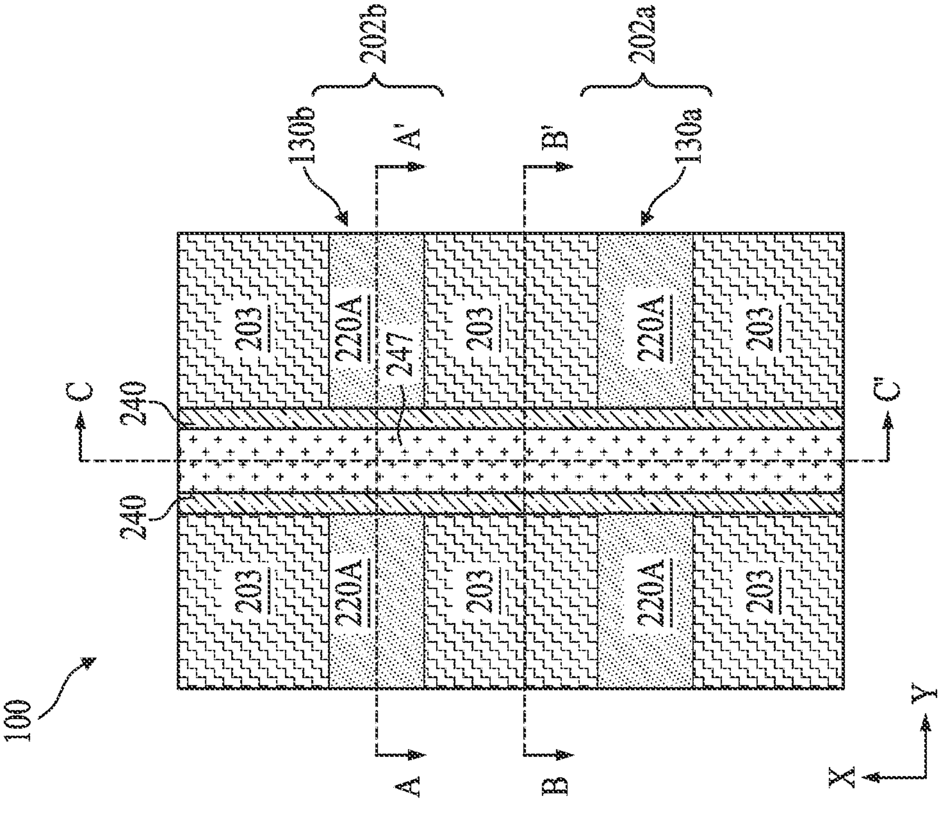
Figure 14B:
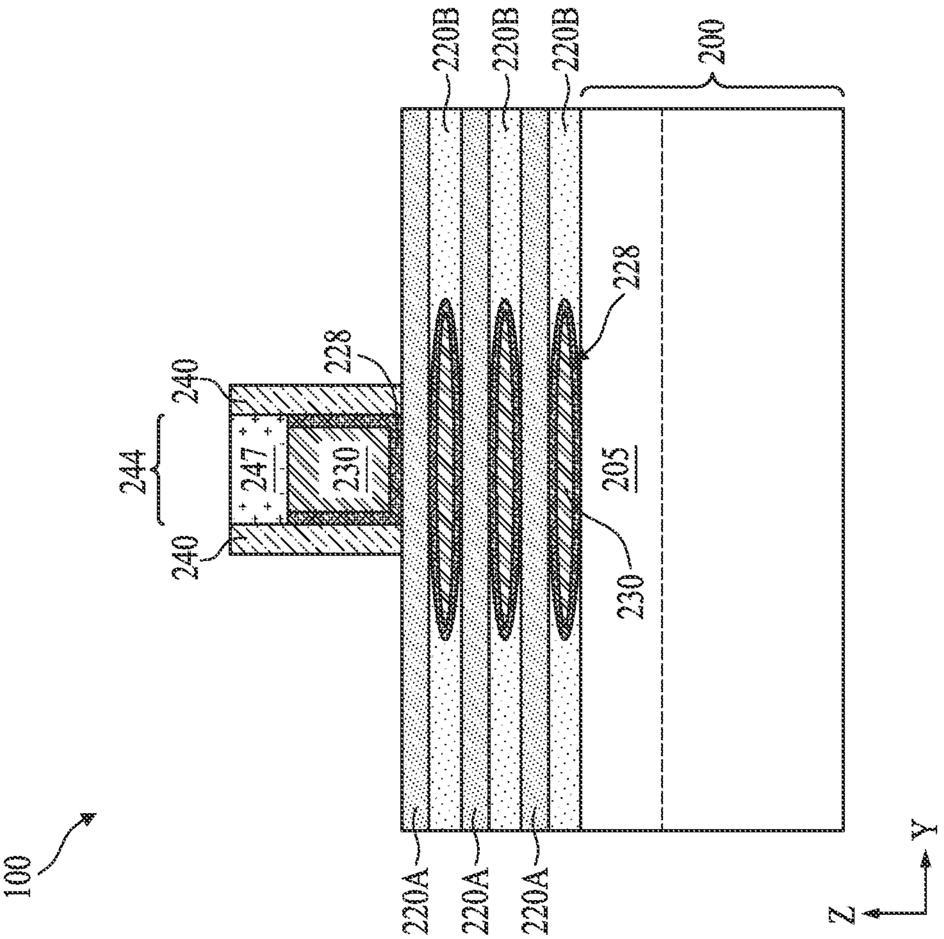
Figure 14C:
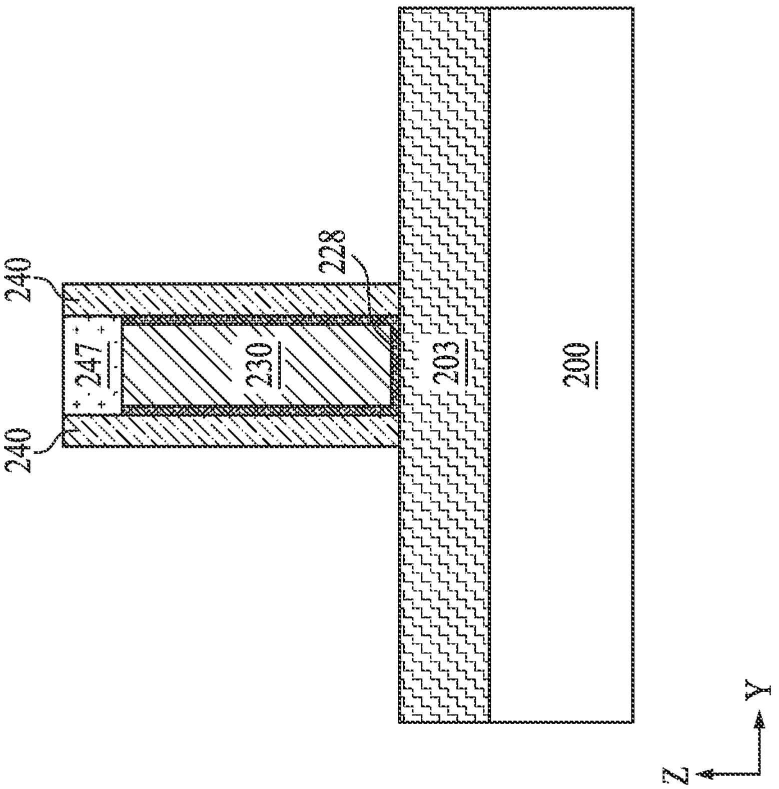
Figure 14D:
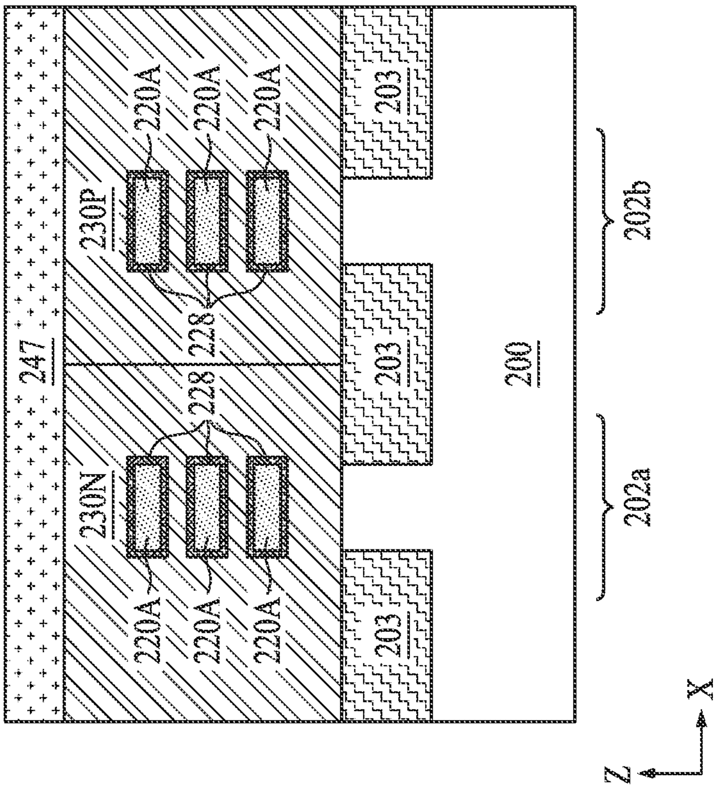
Figure 15B:
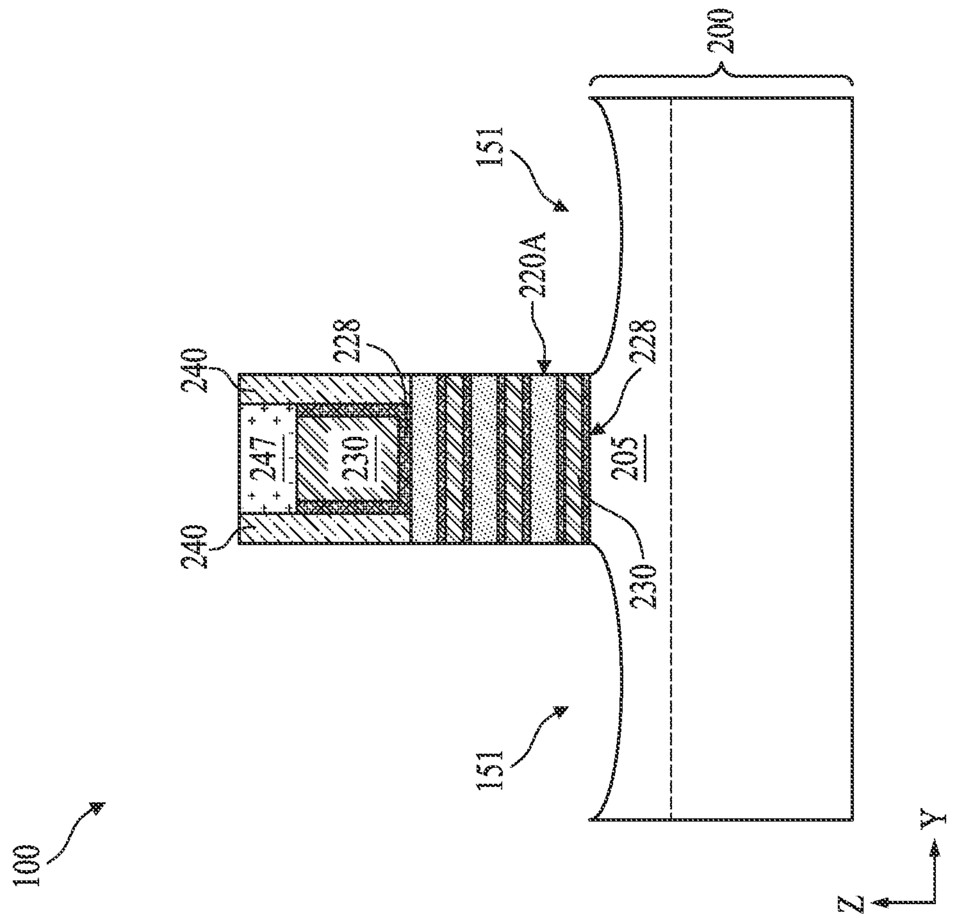
Figure 15A:
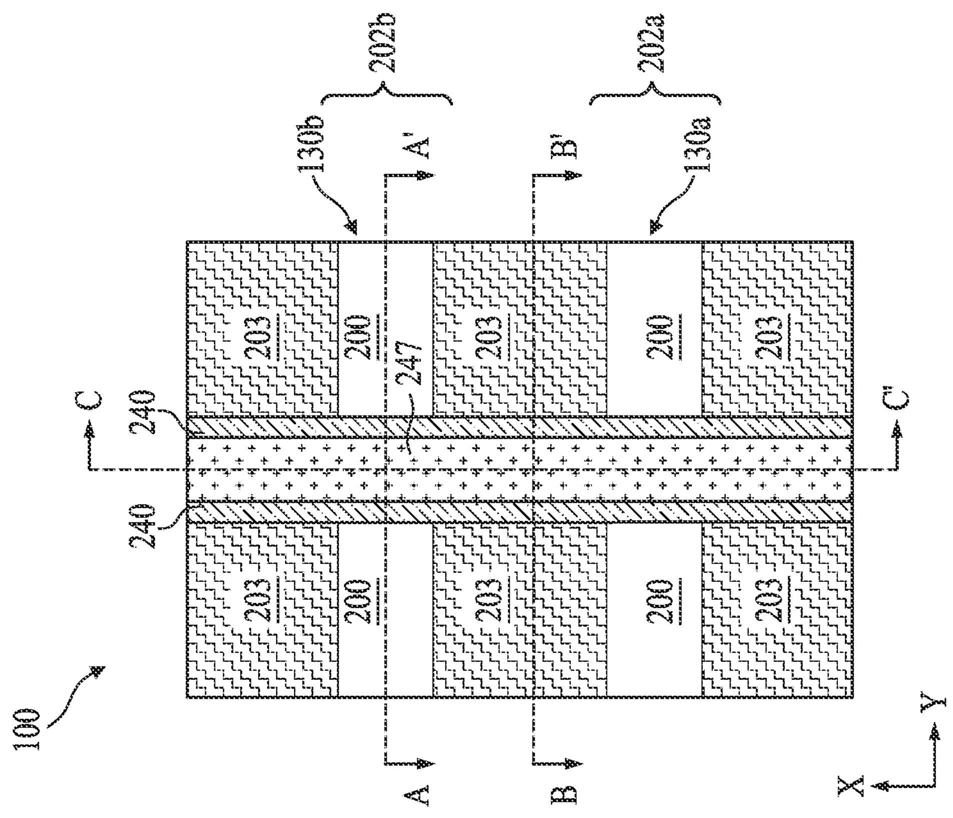
Figure 15D:
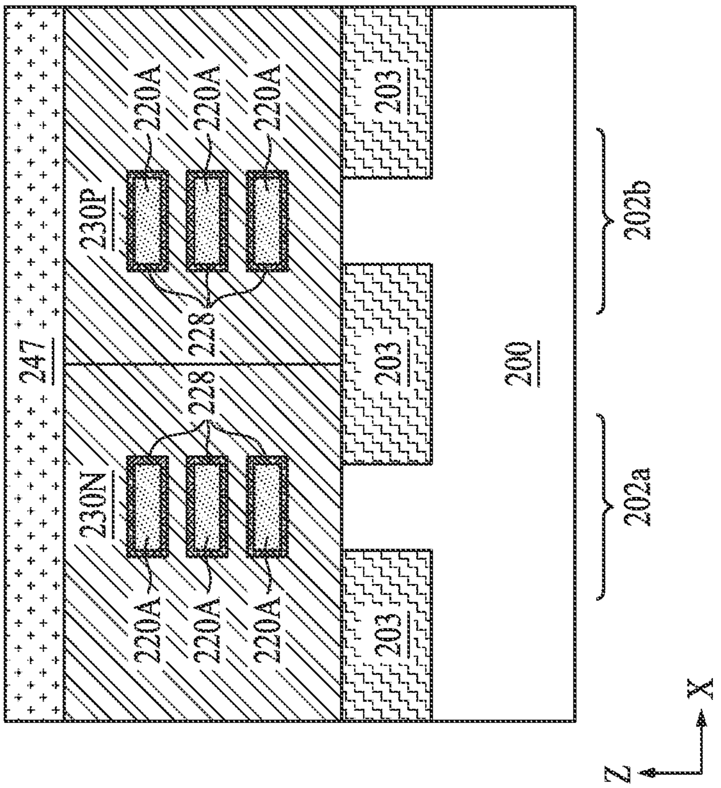
Figure 15C:
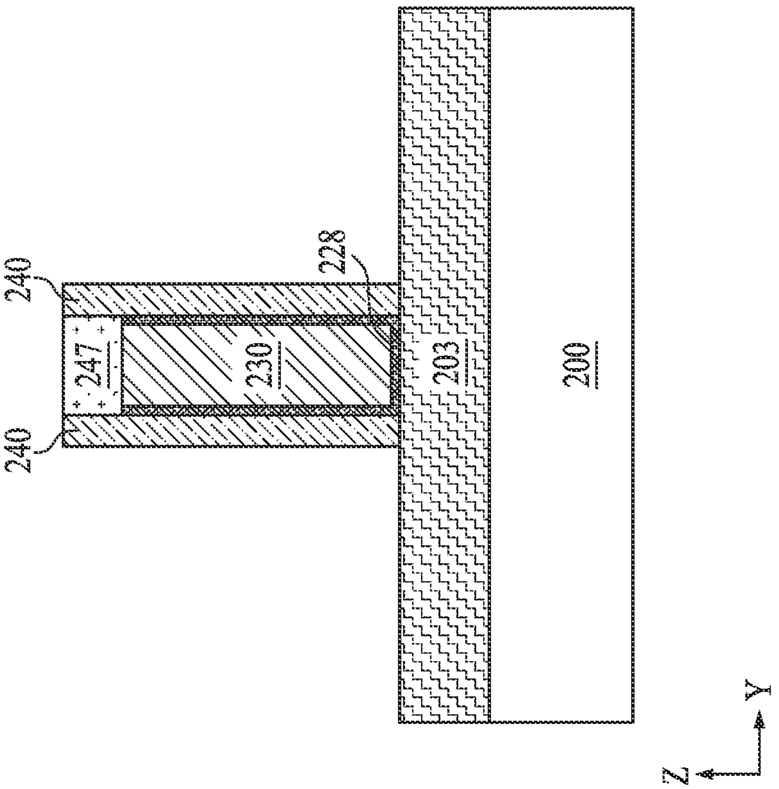

FIGS. 1A-1C are flowcharts of an example method for fabricating an embodiment of a GAA device of the present disclosure according to some embodiments of the present disclosure. FIGS. 2A-24A are top views of an embodiment of a GAA device of the present disclosure constructed at various fabrication stages according to some embodiments of the present disclosure. FIGS. 2B-11B & 13B-24B, 2C-11C & 13C-24C, and 2D-11D & 13D-24D are cross sectional views of an embodiment of a GAA device of the present disclosure along the lines A-A', B-B', and C-C' in FIGS. 2A-11A & 13-24A, respectively, according to some embodiments of the present disclosure. FIG. 10E is a top view of an embodiment of a GAA device of the present disclosure constructed at a fabrication stage according to some embodiments of the present disclosure. FIGS. 10F, 10G, and 10H are cross sectional views of an embodiment of a GAA device of the present disclosure along the lines A-A', B-B', and C-C' in FIG. 10E, respectively, according to some embodiments of the present disclosure. FIGS. 19G, 19H, and 19I are cross sectional views of an embodiment of a GAA device of the present disclosure along the lines A-A', B-B', and C-C' in FIG. 19F, respectively, according to some embodiments of the present disclosure. FIGS. 11E, 16E, and 19E are top views of an embodiment of a GAA device of the present disclosure, in portion. FIGS. 12A, 12B, and 12C are cross sectional views of the gate structure of the GAA device of the present disclosure, in portion.

Referring to block 810 of FIG. 1A and FIGS. 2A-2D, the GAA device 100 includes a substrate 200. In some embodiments, the substrate 200 contains a semiconductor material, such as bulk silicon (Si). Alternatively or additionally, another elementary semiconductor, such as germanium (Ge) in a crystalline structure, may also be included in the substrate 200. The substrate 200 may also include a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb), or combinations thereof. The substrate 200 may also include a semiconductor-on-insulator substrate, such as Si-on-insulator (SOI), SiGe-on-insulator (SGOI), Ge-on-insulator (GOI) substrates. Portions of the substrate 200 may be doped, such as the doped portions (or regions) 205. The doped portions 205 may be doped with p-type dopants, such as boron (B) or boron fluoride ($BF_3$), or doped with n-type dopants, such as phosphorus (P) or arsenic (As). The doped portions 205 may also be doped with combinations of p-type and n-type dopants (e.g. to form a p-type well and an adjacent n-type well). The doped portions 205 may be formed directly on the substrate 200, in a p-well structure, in an n-well structure, in a dual-well structure, or using a raised structure.

Referring to block 820 of FIG. 1A and FIGS. 2A-2D, a stack of semiconductor layers 220A and 220B are formed over the substrate 200 in an interleaving or alternating fashion, extending vertically (e.g. along the Z-direction) from the substrate 200. For example, a semiconductor layer 220B is disposed over the substrate 200, a semiconductor layer 220A is disposed over the semiconductor layer 220B, another semiconductor layer 220B is disposed over the semiconductor layer 220A, so on and so forth. In the depicted embodiments, there are three layers of semiconductor layers 220A and three layers of semiconductor layers 220B alternating between each other. However, there may be any appropriate number of layers in the stack. For example, there may be 2 to 10 layers of semiconductor layers 220A, alternating with 2 to 10 layers of semiconductor layers 220B in the stack. The material compositions of the semiconductor layers 220A and 220B are configured such that they have an etching selectivity in a subsequent etching process. For example, in some embodiments, the semiconductor layers 220A contain silicon germanium (SiGe), while the semiconductor layers 220B contain silicon (Si). In some other embodiments, the semiconductor layers 220B contain SiGe, while the semiconductor layers 220A contain Si. In the depicted embodiment, each of the semiconductor layers 220A has a substantially uniform thickness, depicted in FIG. 2B as the thickness 300, while each of the semiconductor layers 220B has a substantially uniform thickness, depicted in FIG. 2B as the thickness 310.

Figure 3B:
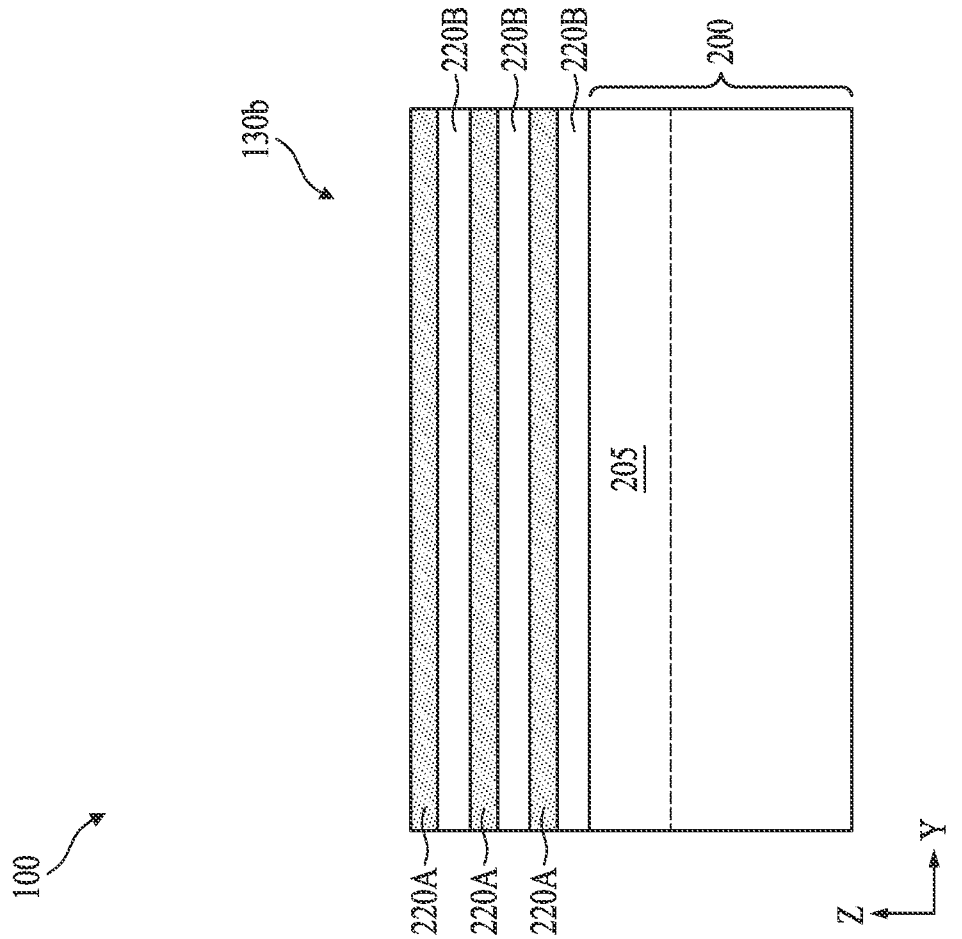
Figure 3A:
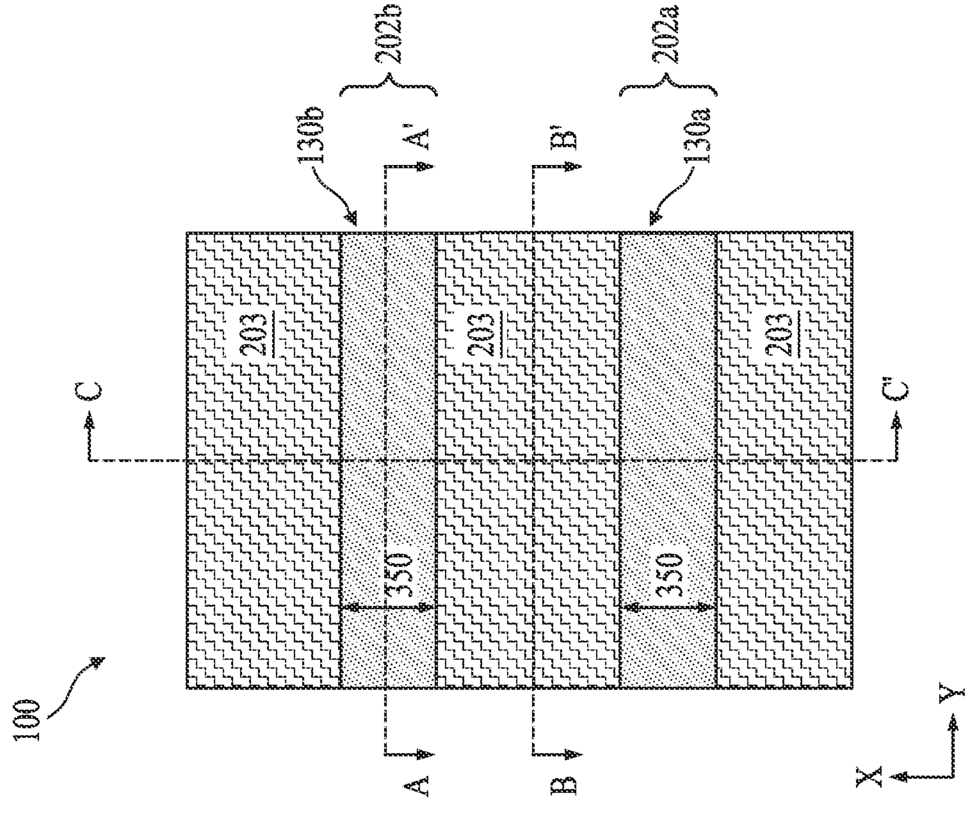
Figure 3D:
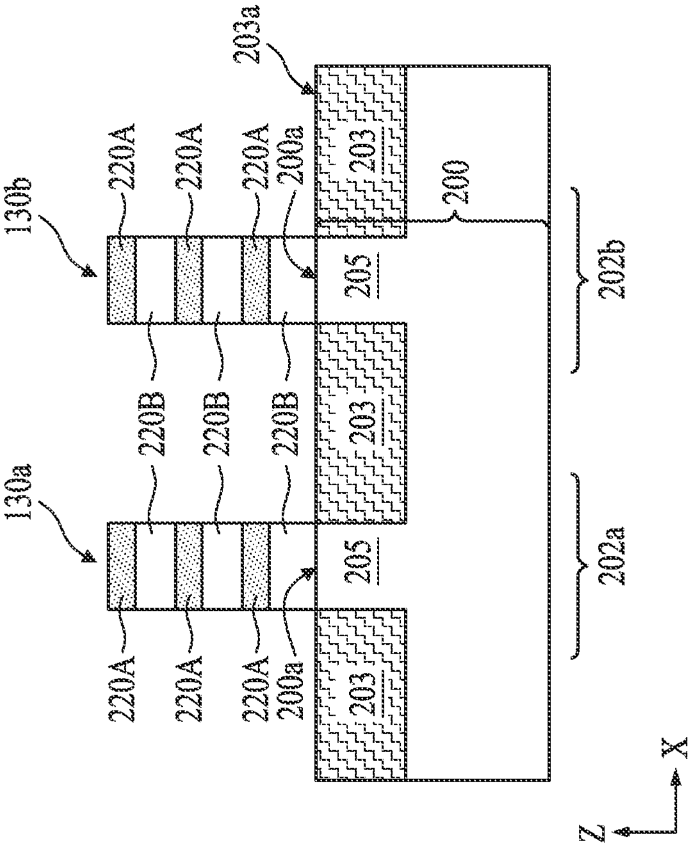
Figure 3C:
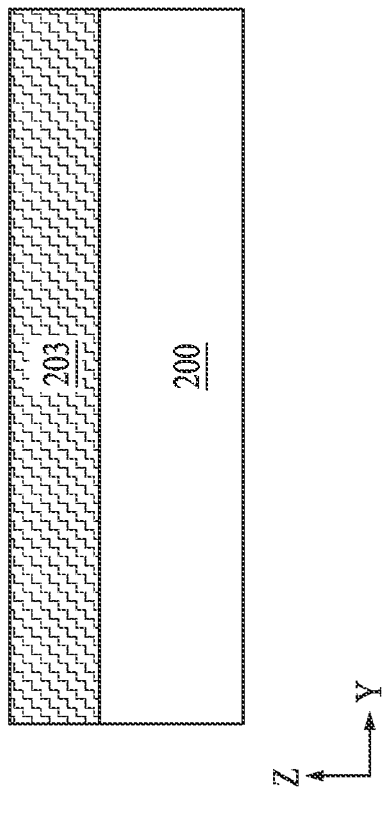

Referring to block 820 of FIG. 1A and FIGS. 3A-3D, the stack of semiconductor layers 220A and 220B are patterned into a plurality of fin structures, for example, into fin structures (or fins) 130*a* and 130*b*. Each of the fins 130*a* and 130*b* includes a stack of the semiconductor layers 220A and 220B disposed in an alternating manner with respect to one another. The fins 130*a* and 130*b* each extends lengthwise (e.g. longitudinally) in a first direction (e.g. in the Y-direction) and are separated from each other (e.g. laterally) in a second direction (e.g. in the X-direction), as shown in FIGS. 3A and 3D. As illustrated in FIG. 3A, the fins may each have a lateral width along the X-direction, depicted in FIG. 3A as the width 350. It is understood that the X-direction and the Y-direction are horizontal directions that are perpendicular to each other, and that the Z-direction is a vertical direction that is orthogonal (or normal) to a plane defined by the X-direction and the Y-direction. The substrate 200 may have its top surface aligned in parallel to the XY plane.

The fins 130*a* and 130*b* may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins. The patterning may utilize multiple etching processes which may include a dry etching and/or wet etching. The regions in which the fins are formed will be used to form active devices through subsequent processing and are thus referred to as active regions. For example, fin 130*a* is formed in the active region 202*a*, and the fin 130*b* is formed in the active region 202*b*. Both fins 130*a* and 130*b* protrude out of the doped portions 205.

The GAA device 100 includes isolation features 203, which may be shallow trench isolation (STI) features. In some examples, the formation of the isolation features 203 includes etching trenches into the substrate 200 between the active regions and filling the trenches with one or more dielectric materials such as silicon oxide, silicon nitride, silicon oxynitride, other suitable materials, or combinations thereof. Any appropriate methods, such as a chemical vapor deposition (CVD) process, an atomic layer deposition (ALD) process, a physical vapor deposition (PVD) process, a plasma-enhanced CVD (PECVD) process, a plasma-enhanced ALD (PEALD) process, and/or combinations thereof may be used for depositing the isolation features 203. In some embodiments, the method includes a procedure that further includes patterning the stack of semiconductor layers 220A and 220B and the substrate 200 to form trenches by lithography process and etching; deposition to fill the trenches with one or more dielectric material; performing a chemical mechanical polishing (CMP) process to planarize the top surface and remove excessive deposited material; and selectively etching back the dielectric material in the trenches so that the active regions are protruded above the isolation features 203.

The isolation features 203 may have a multi-layer structure such as a thermal oxide liner layer over the substrate 200 and a filling layer (e.g., silicon nitride or silicon oxide) over the thermal oxide liner layer. Alternatively, the isolation features 203 may be formed using any other isolation formation techniques. As illustrated in FIG. 3D, the fins 130*a* and 130*b* are located above the top surface 203*a* of the isolation features 203 (e.g. protrude out of the isolation features 203) and are also located above the top surface 200*a* of the substrate 200.

Figure 4A:
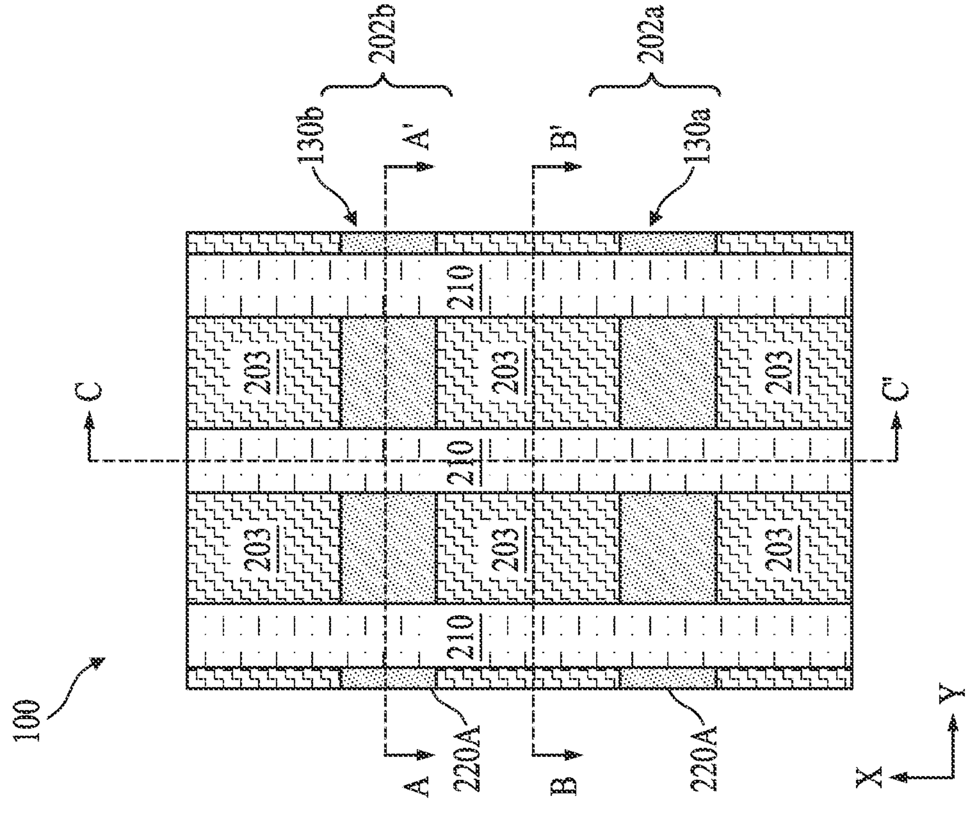
Figure 4B:
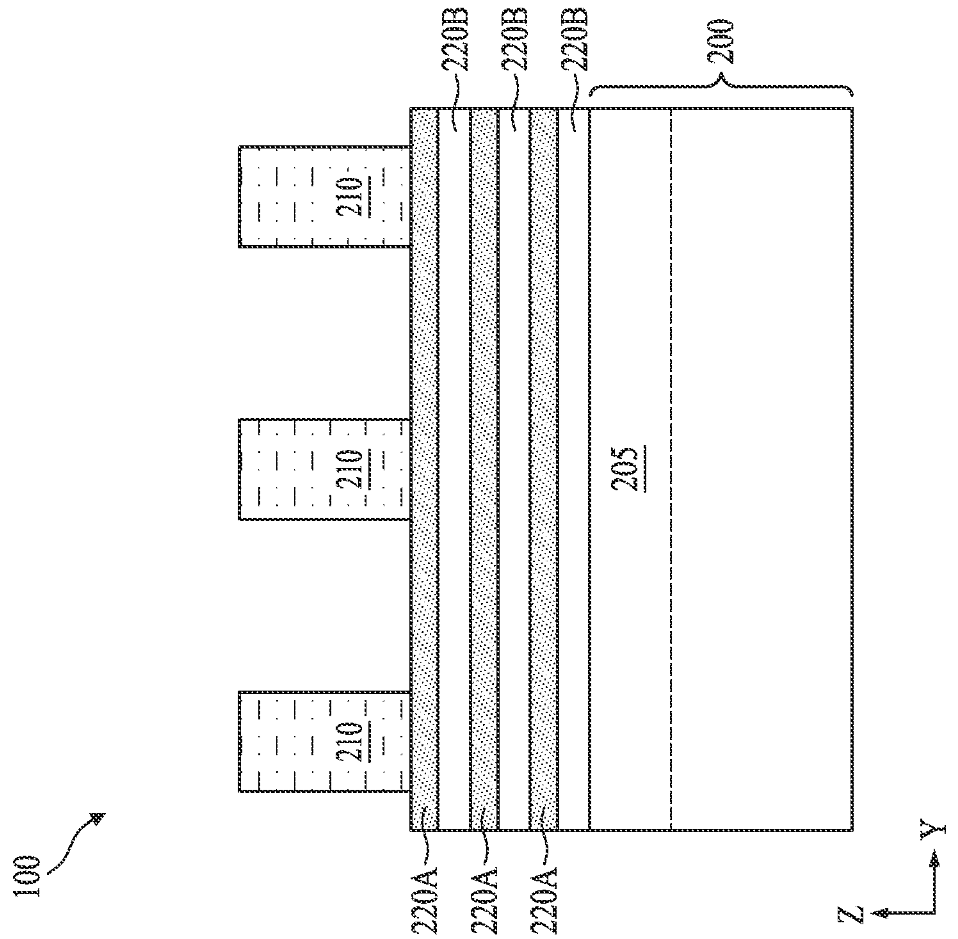
Figure 4D:
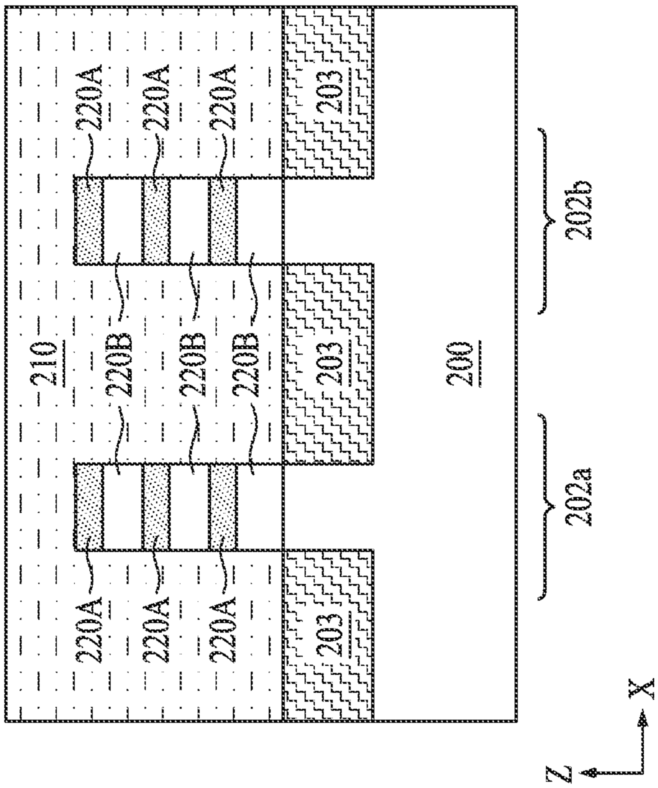
Figure 4C:
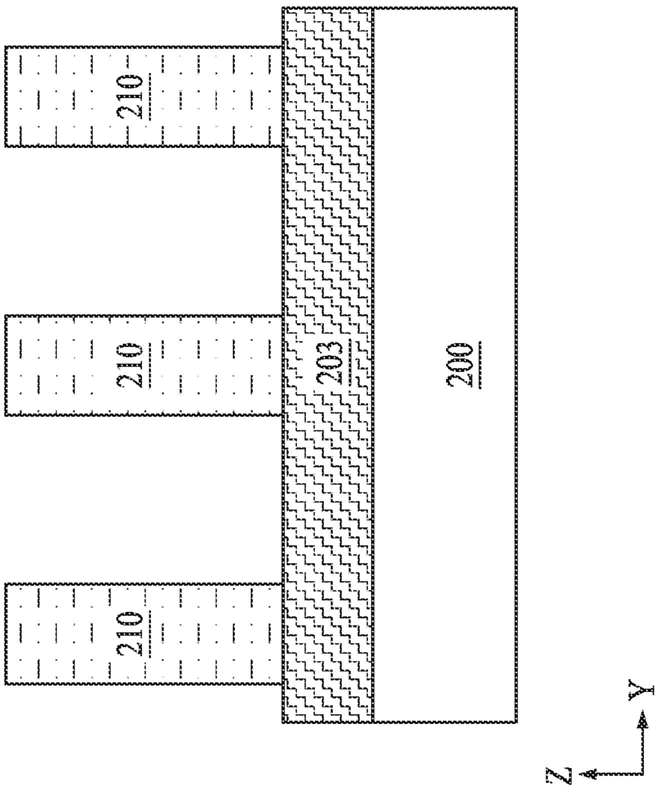
Figure 5B:
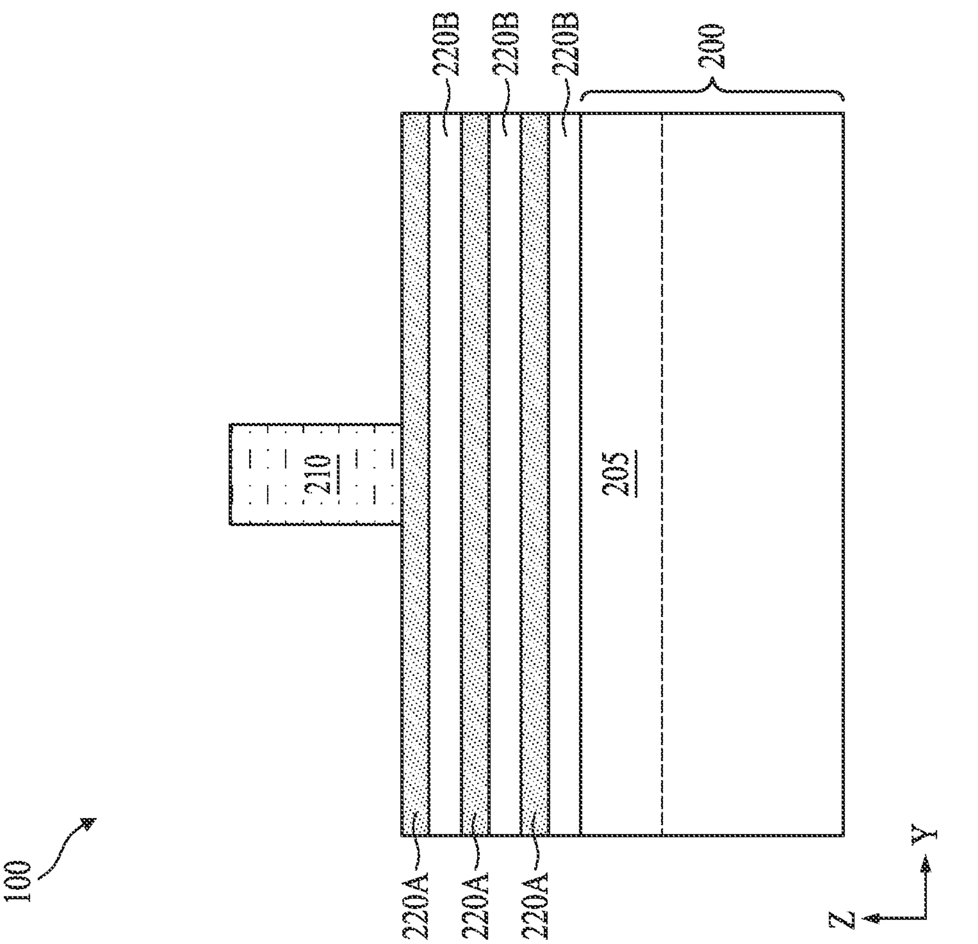
Figure 5A:
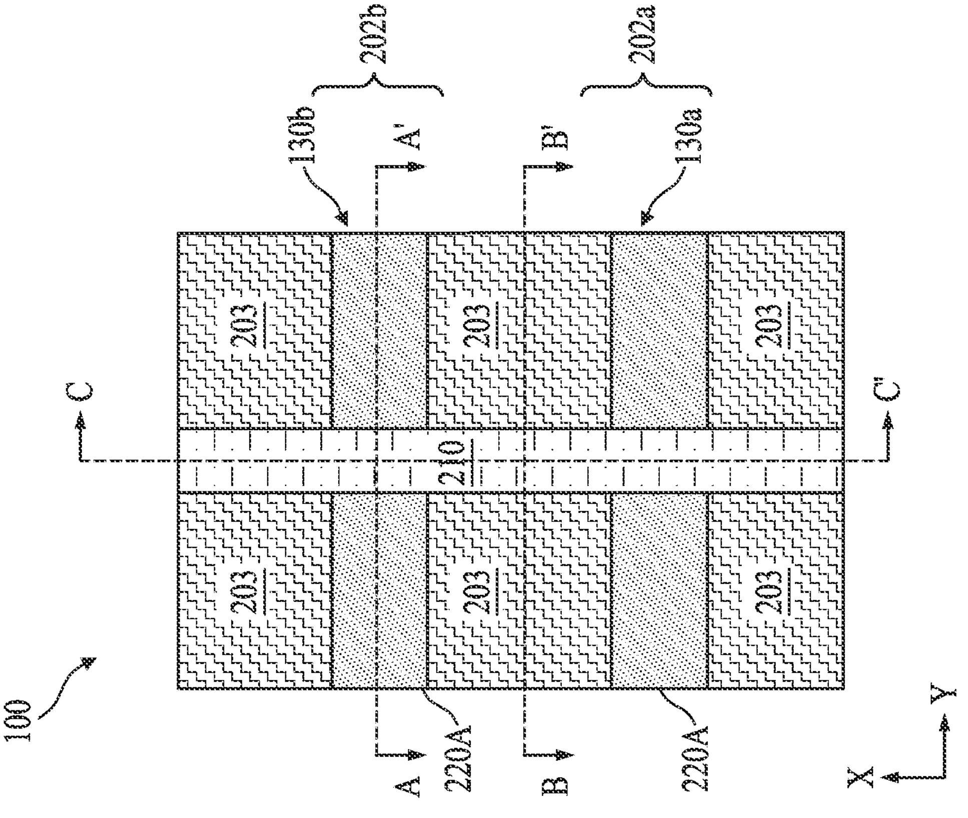
Figure 5D:
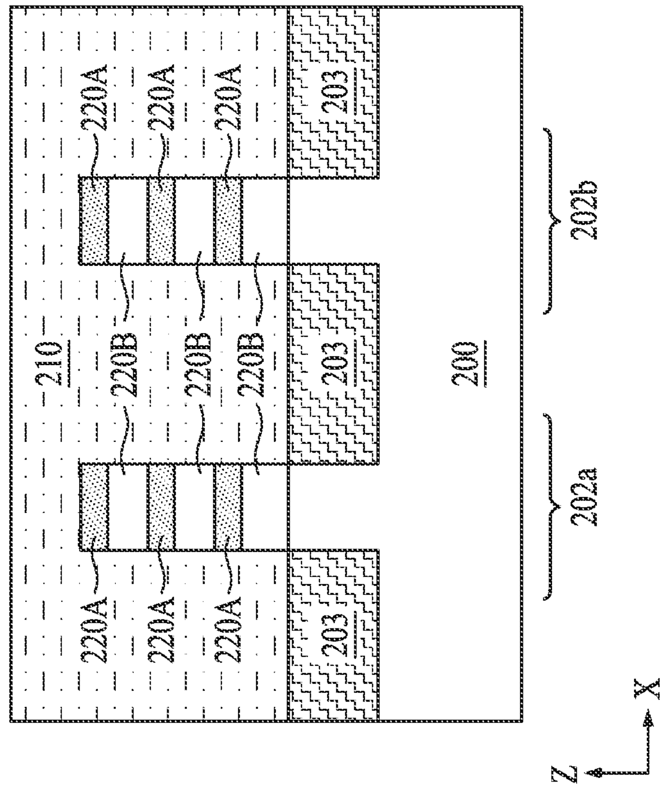
Figure 5C:
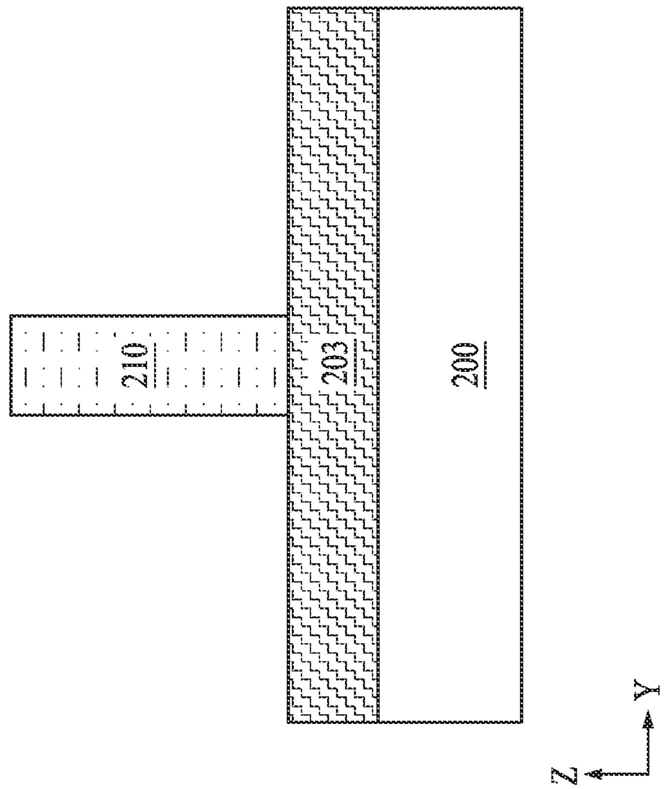
Figure 6B:
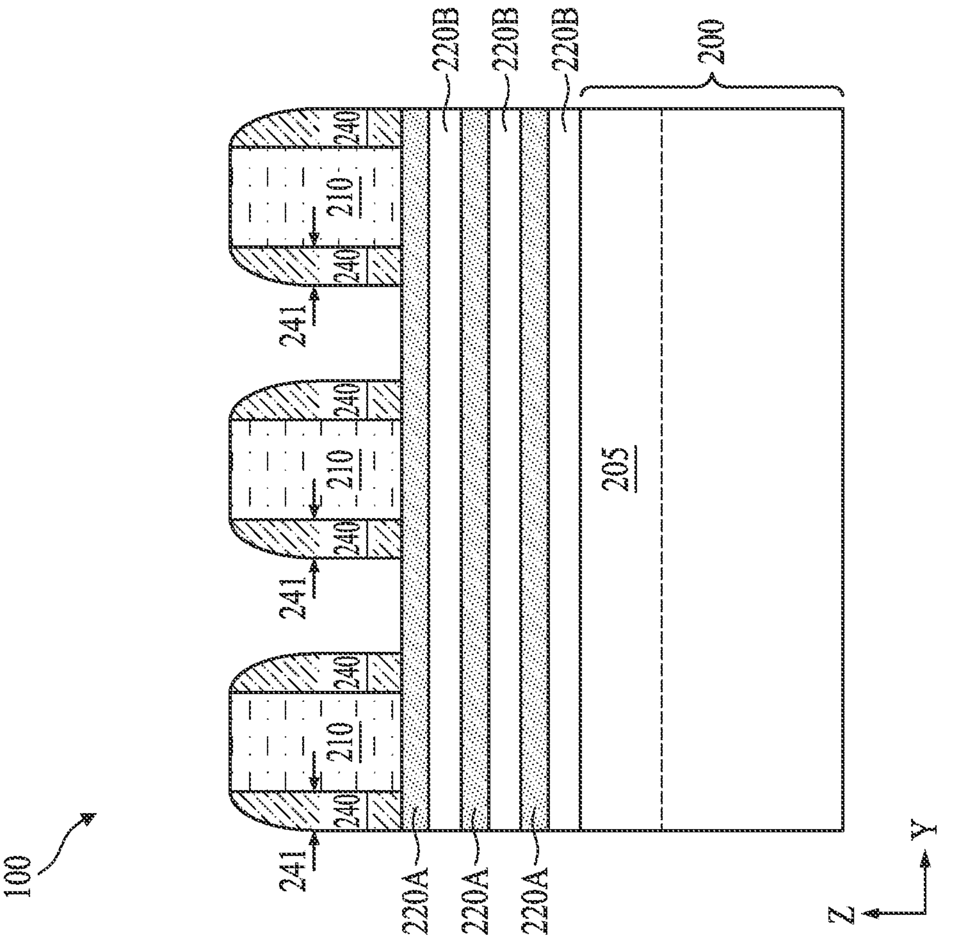
Figure 6A:
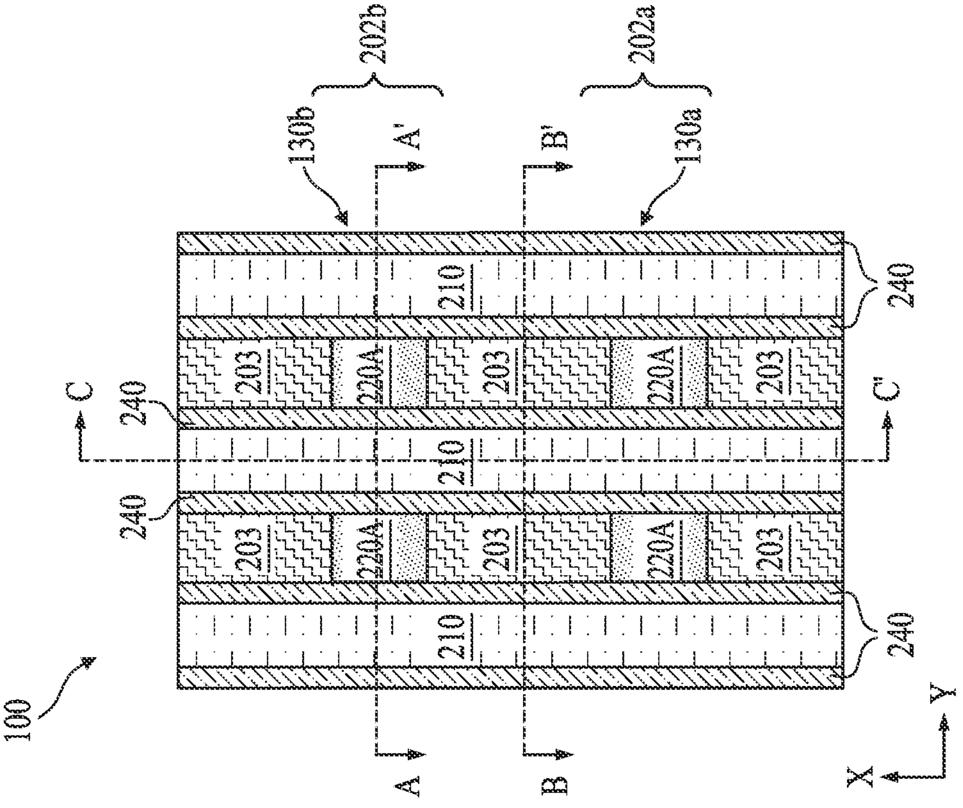
Figure 6D:
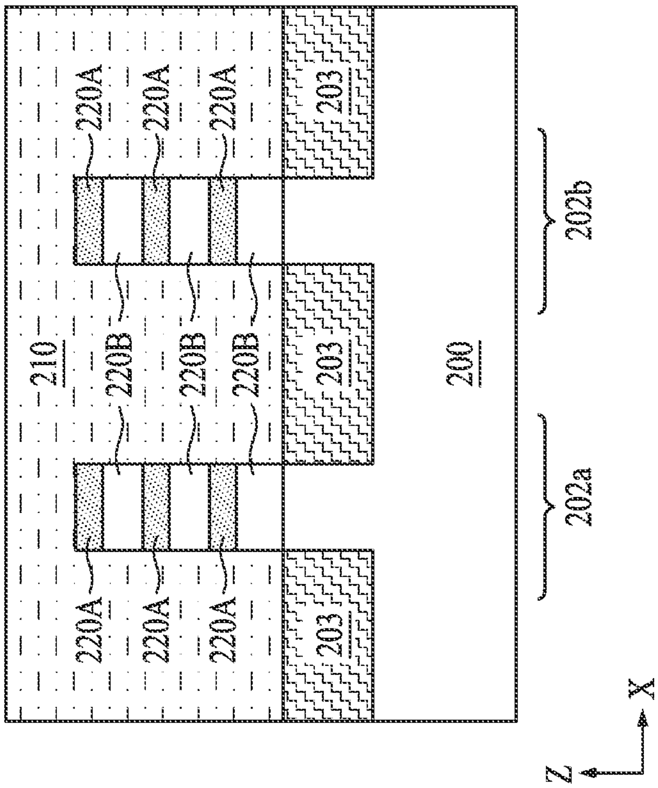
Figure 6C:
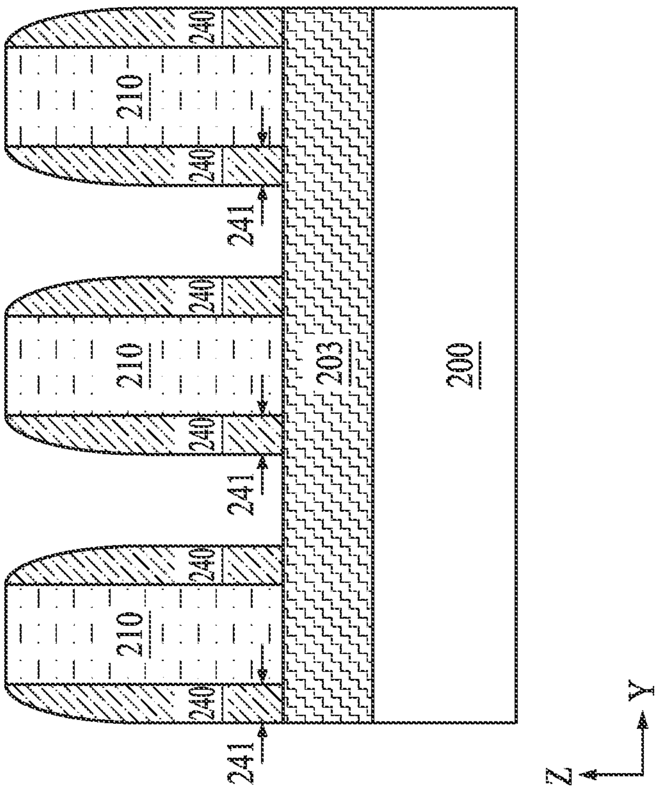
Figure 7B:
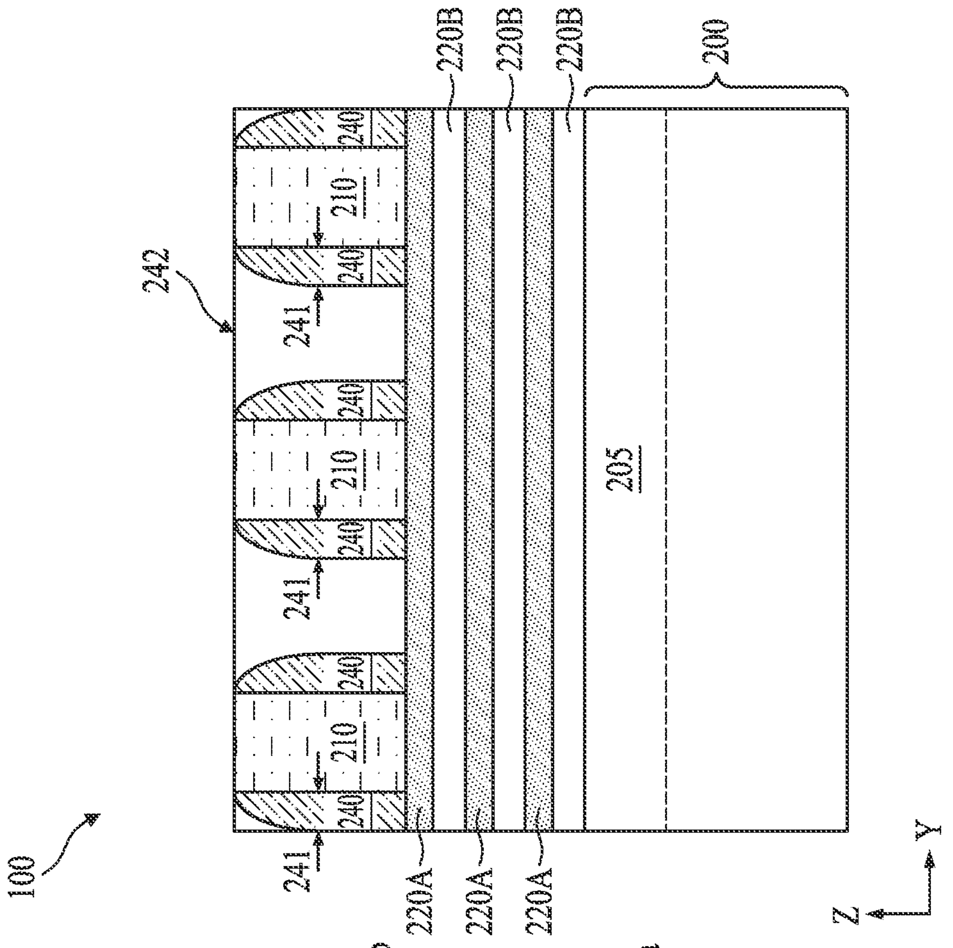
Figure 7A:
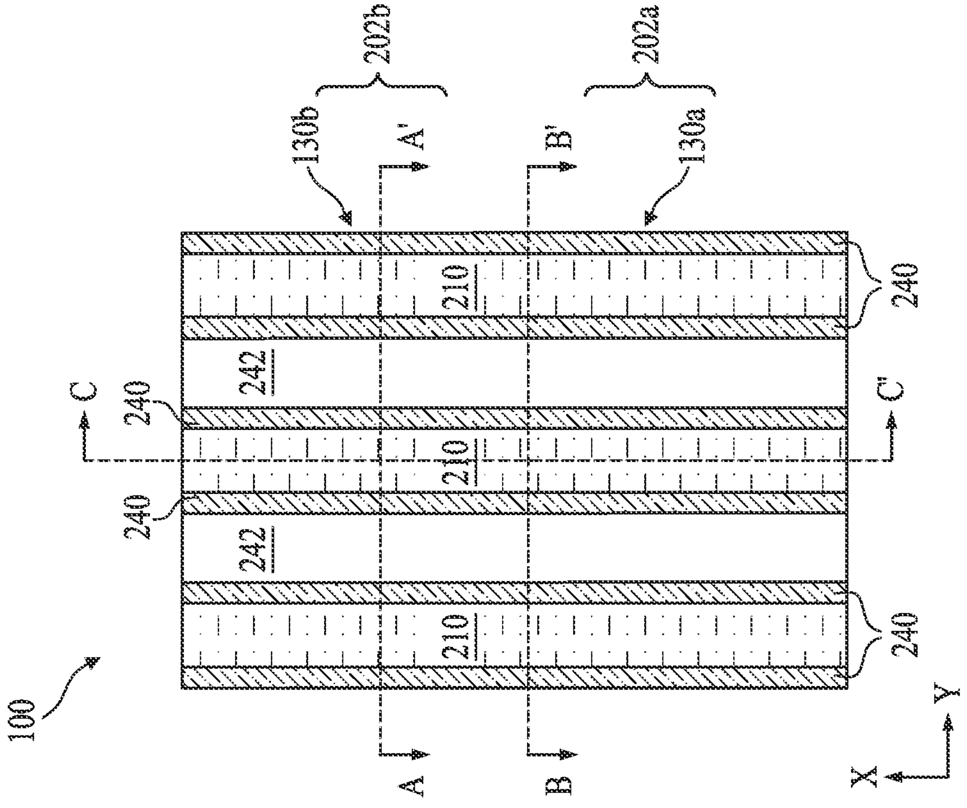
Figure 7D:
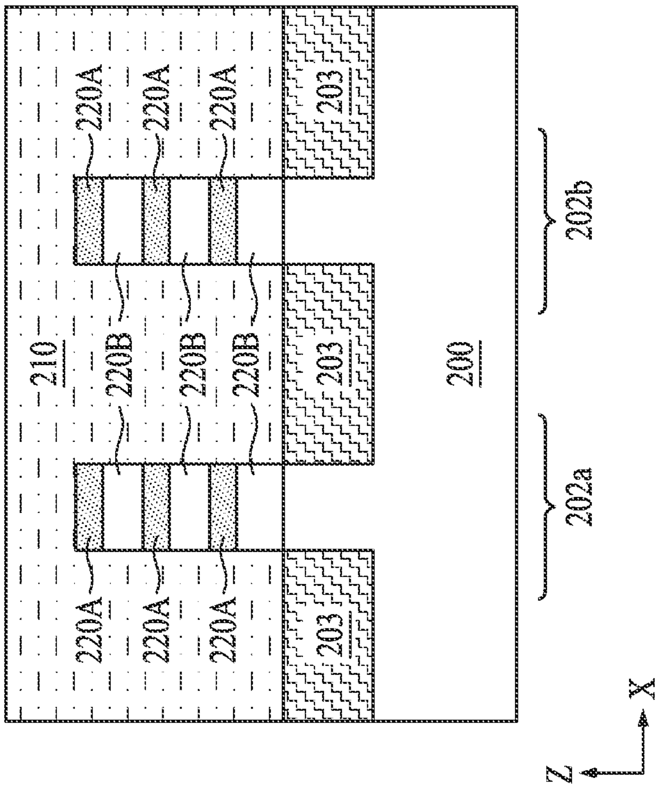
Figure 7C:
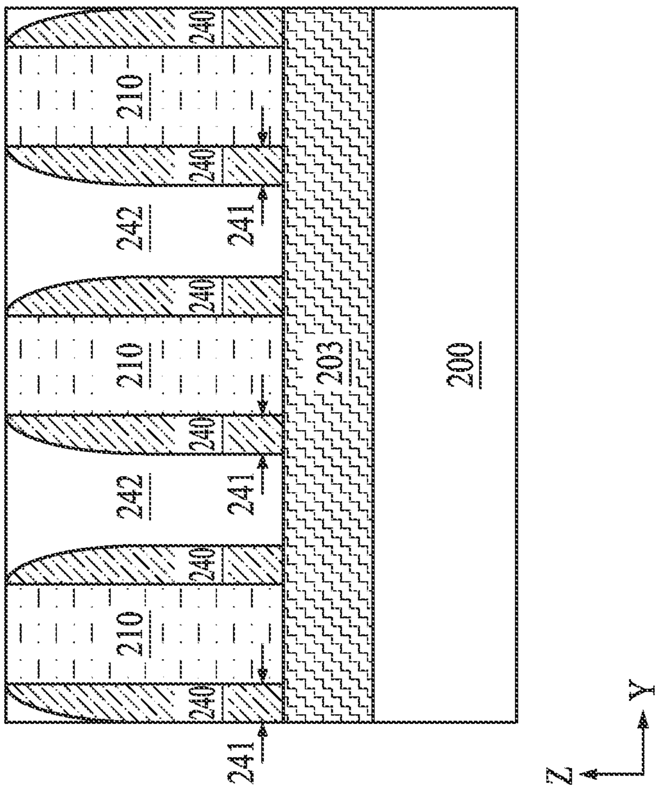

Referring to block 830 of FIG. 1A and FIGS. 4A-4D, a dummy gate structures 210 are formed over a portion of each of the fins 130*a* and 130*b*, and over the isolation features 203, in between the fins 130*a* and 130*b*. The dummy gate structures 210 may be configured to extend lengthwise (e.g. longitudinally) in parallel to each other, for example, each along the X-direction, as shown in FIG. 4A. In some embodiments, as illustrated in FIG. 4D, each of the dummy gate structures 210 wraps around the top surface and side surfaces of each of the fins 130*a*, 130*b*. The dummy gate structures 210 may include polysilicon. In some embodiments, the dummy gate structures 210 also include one or more mask layers, which are used to pattern the dummy gate electrode layers. The dummy gate structures 210 may undergo a gate replacement process through subsequent processing to form metal gates, such as a high-k metal gate, as discussed in greater detail below. Some of the dummy gate structures 210 may also undergo a second gate replacement process to form a dielectric based gate that electrically isolates the GAA device 100 from neighboring devices, as also discussed in greater detail below. The dummy gate structures 210 may be formed by a procedure including deposition, lithography patterning, and etching processes. The deposition processes may include CVD, ALD, PVD, other suitable methods, and/or combinations thereof.

The number of dummy gate structures 210 formed over the fins 130*a* and 130*b* depends on individual circuit and other design and fabrication considerations, such as some dummy gate structures 210 are replaced into dielectric based gates for isolation. FIGS. 5A-5D illustrate another example wherein one dummy gate structure 210 is formed on the fins 130*a* and 130*b*. in the following descriptions, one or three gate structures are alternatively used for better illustrations.

Referring to block 840 of FIG. 1A and FIGS. 6A-6D, gate spacers (or top spacers) 240 are formed on the sidewalls of the dummy gate structures 210. The gate spacers 240 may include silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, or combinations thereof. The gate spacers 240 may include a single layer or a multi-layer structure. In some embodiments, each of the gate spacers 240 may have a thickness 241 (e.g. measured in the Y-direction) in a range from about 3 nm to about 10 nm. A thickness within the stated range of values may be needed for device performance, especially for advanced technology nodes. In some embodiments, the gate spacers 240 may be formed by depositing a spacer layer (containing the dielectric material) over the dummy gate structures 210, followed by an anisotropic etching process to remove portions of the spacer layer from the top surfaces of the dummy gate structures 210. After the etching process, portions of the spacer layer on the sidewall surfaces of the dummy gate structures 210 substantially remain and become the gate spacers 240. In some embodiments, the anisotropic etching process is a dry (e.g. plasma) etching process. Additionally or alternatively, the formation of the gate spacers 240 may also involve chemical oxidation, thermal oxidation, ALD, CVD, and/or other suitable methods. In the active regions, the gate spacers 240 are formed over the top layer of the semiconductor layers 220A. Accordingly, the gate spacers 240 may also be interchangeably referred to as the top spacers 240. In some examples, one or more material layers (not shown) may also be formed between the dummy gate structures 210 and the corresponding top spacers 240. The one or more material layers may include an interfacial layer and/or a high-k dielectric layer, as examples.

Referring to block 850 of FIG. 1A and FIGS. 7A-7D, a dielectric layer 242 is formed on the substrate 200 and is filled in gaps among dummy gate structures 210. The dielectric layer 242 includes one or more suitable dielectric material, such as silicon oxide, other suitable dielectric material or a combination thereof. The method forming the dielectric layer 242 includes deposition and may additionally include CMP. The deposition method includes CVD, flowable CVD (FCVD), other suitable deposition technology or a combination thereof.

Figure 8A:
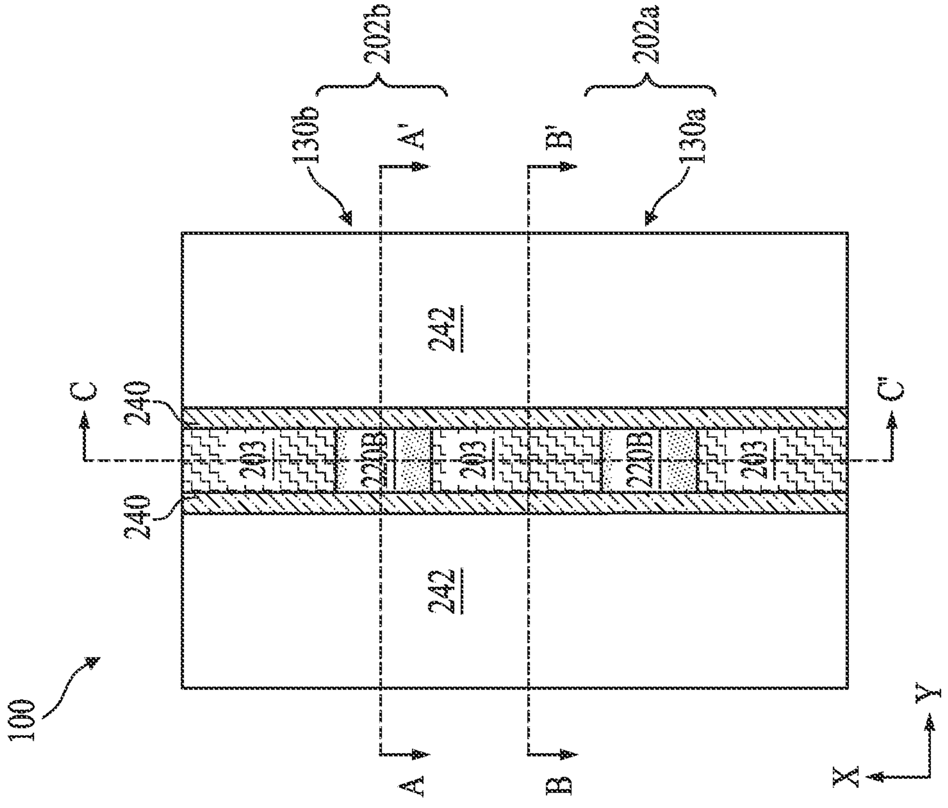
Figure 8B:
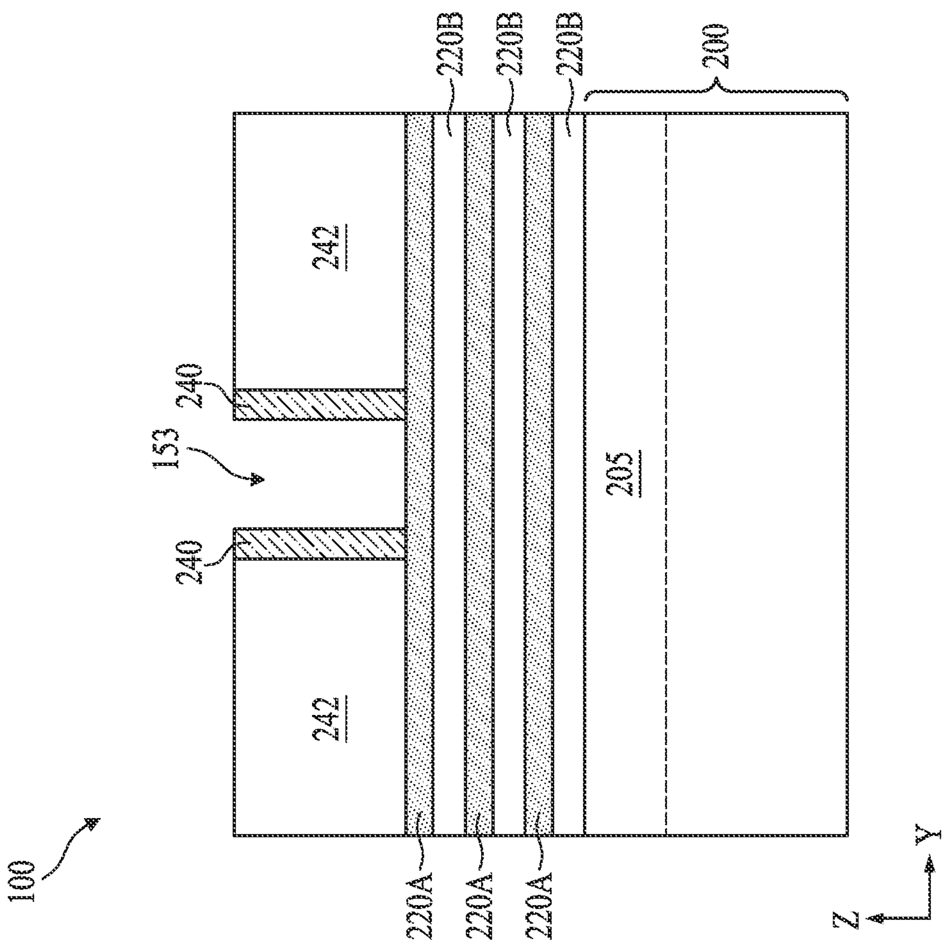
Figure 8D:
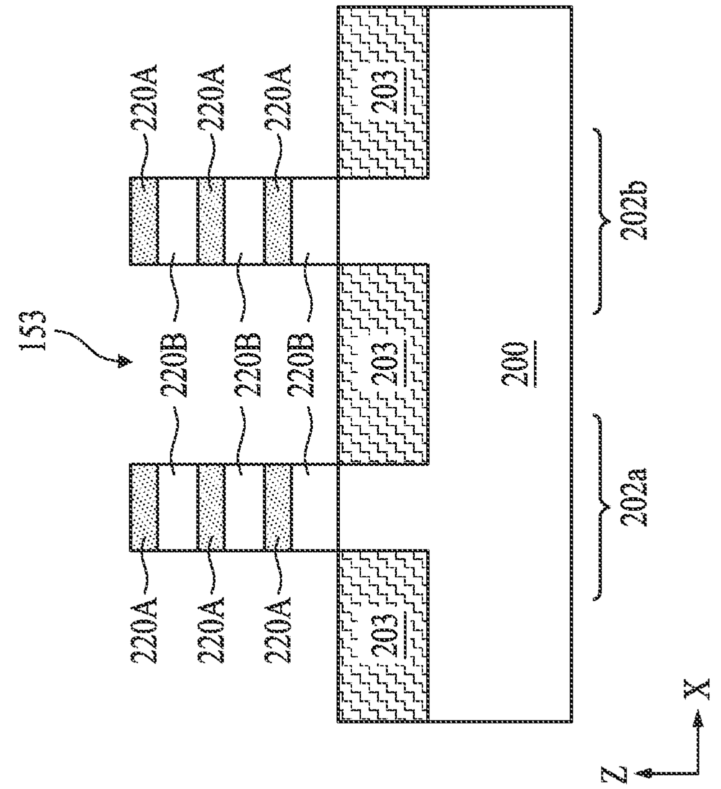
Figure 8C:
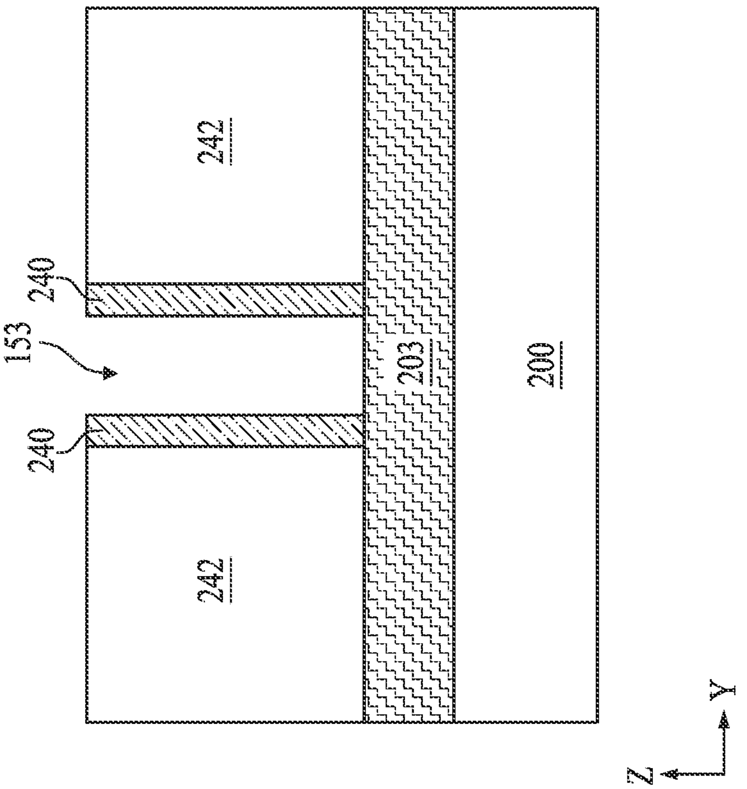

Referring to block 860 of FIG. 1A and FIGS. 8A-8D, the dummy gate structures 210 are selectively removed through any suitable lithography and etching processes. In some embodiments, the lithography process may include forming a photoresist layer (resist), exposing the resist to a pattern, performing a post-exposure bake process, and developing the resist to form a masking element, which exposes a region including the dummy gate structures 210. Then, the dummy gate structures 210 are selectively etched through the masking element. In some other embodiments, the top spacers 240 and the dielectric layer 242 may be used as the masking element or a part thereof. For example, the dummy gate structures 210 may include polysilicon, the top spacers 240 and the dielectric layer 242 may include dielectric materials. Therefore, an etch selectivity may be achieved by selecting appropriate etching chemicals, such that the dummy gate structures 210 may be removed without substantially affecting the features of the GAA device 100. The removal of the dummy gate structures 210 creates gate trenches 153. The gate trenches 153 expose the top surfaces and the side surfaces of the stack of semiconductor layers 220A, 220B, as depicted in FIG. 8D. Additionally, the gate trenches 153 also expose the top surfaces of the isolation features 203.

Figure 9A:
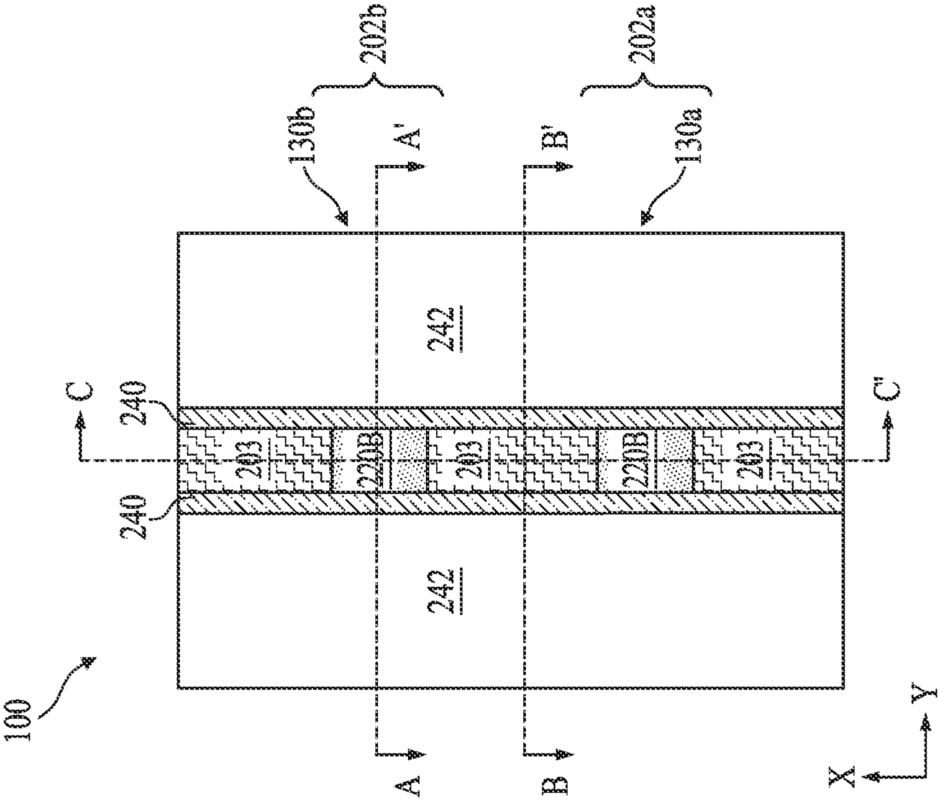
Figure 9B:
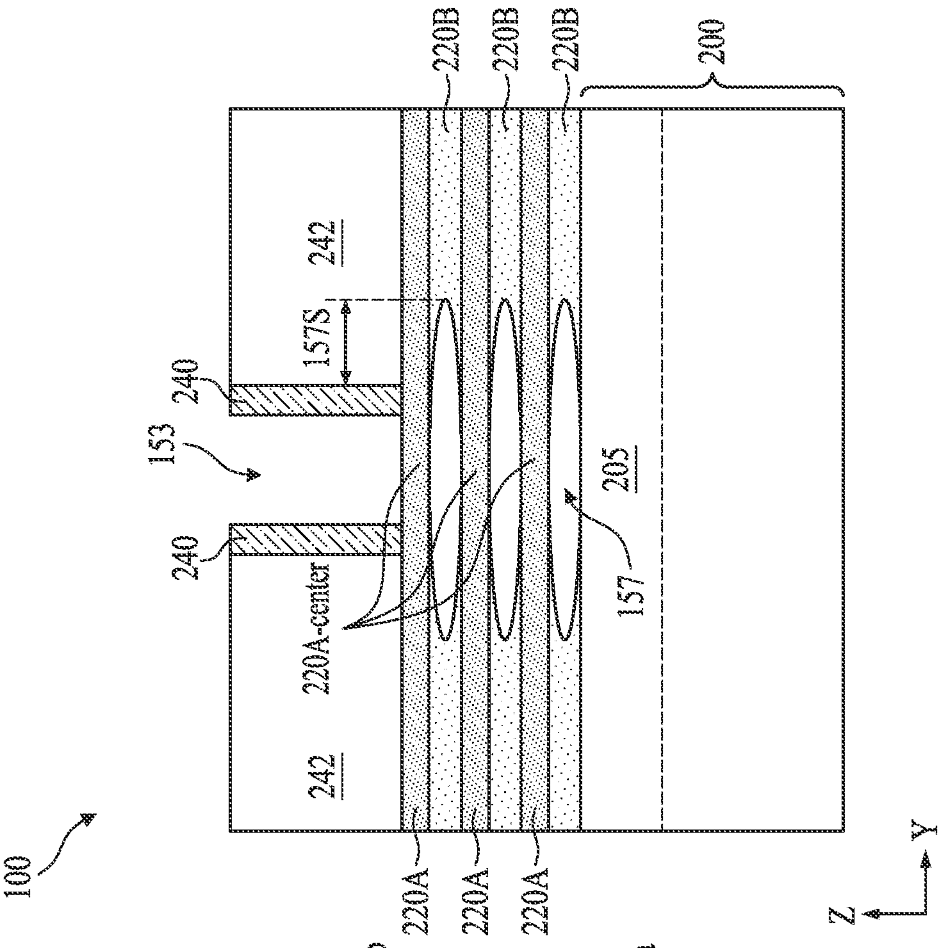
Figure 9D:
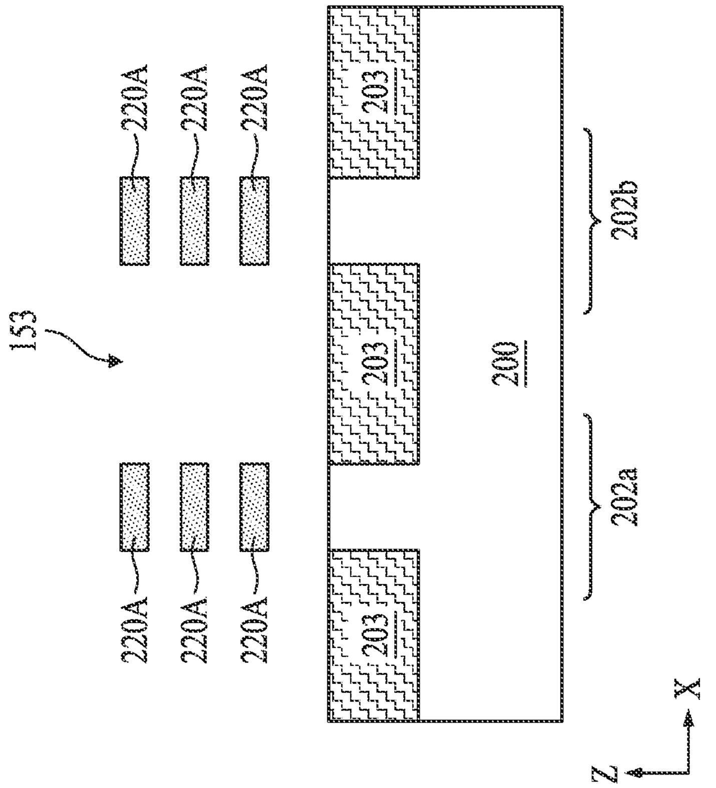
Figure 9C:
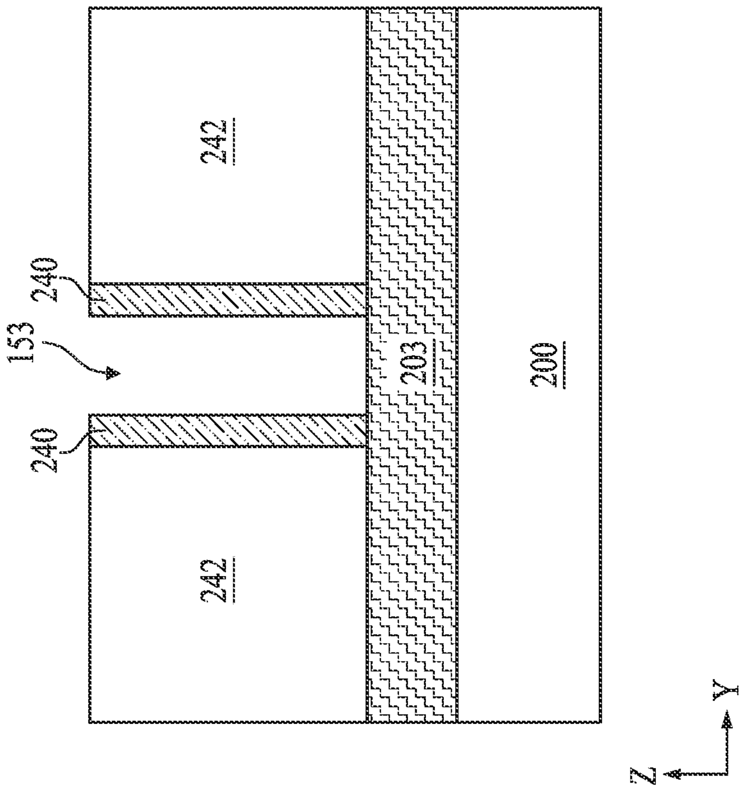

Referring to block 870 of FIG. 1A and FIGS. 9A-9D, semiconductor sheets are formed by selectively etching semiconductor layers 220B through the gate trenches 153, for example using wet or dry etching process. The process is also referred to as a channel-release process. The etching chemical is selected such that semiconductor layers 220B have a sufficiently different etching rate as compared to semiconductor layers 220A and gate spacers 240. This selective etching process may include one or more etching steps. As a result, the semiconductor layers 220A and the gate spacers 240 remain substantially unchanged, while the portions of the semiconductor layers 220B are removed with gaps (or openings) 157 formed between the semiconductor layers 220A. Especially, since inner spacers are not formed yet, and the semiconductor layers 220B extend to source/drain regions, the etching process can be controlled to have lateral etching to the portions of the semiconductor layers 220B underlying the gate spacers 240 such that the gaps 157 extend beyond the gate spacers 240 and further extend to the source/drain regions, as illustrated in FIG. 9B.

As illustrated in FIGS. 9A-9D, in the present embodiment, the removal of the semiconductor layers 220B forms suspended semiconductor layers 220A and gaps (or openings) 157 in between the vertically adjacent layers (e.g. in the Z-direction), thereby exposing the top and bottom surfaces of the center portions of the semiconductor layers 220A within the gate trenches. Each of the center portions 220A-center are now exposed circumferentially in the X-Z plane. In addition, the portion of the doped regions 205 beneath the center portions 220A-center are also exposed in the gaps 157.

In the examples depicted in FIGS. 9A-9D, the gate trench 153 has a vertical profile and the gaps 157 have different shapes. For example, the etch chemistry of the etch process used to remove the dummy gate structures 210 and thereby form the gate trenches 153 (e.g. in FIGS. 8A-8D) may include hydrogen bromide (HBr) combined with chlorine ($Cl_2$), tetrafluoromethane ($CF_4$), oxygen, or a combination thereof. Furthermore, the etch process used to selectively remove the semiconductor layers 220B and thereby form the gaps 157 (e.g. in FIGS. 9A-9D) may have an initial etch chemistry including hydrogen bromide (HBr) combined with chlorine ($Cl_2$), oxygen, or a combination thereof. This initial etch chemistry is followed by a subsequent etch chemistry including hydrogen bromide (HBr) combined with tetrafluoromethane ($CF_4$), oxygen, or a combination thereof that induces the profile of the opening collectively formed by the gate trench 153 and its corresponding gaps 157. Particularly, the etch process used to selectively remove the semiconductor layers 220B is controlled such that the gaps 157 extend beyond the gate spacers 240 and further extend to the source/drain regions with a dimension 157S, as illustrated in FIG. 9B. The dimension 157S has enough margin so that the final channels are determined by later process to form inner spacers, which will be further described at a later stage. In some embodiments, the dimension 157S ranges between 5 nm and 10 nm.

By the disclosed method, epitaxial source/drain loss is avoided during the channel release process. In the existing method, epitaxial source/drain features are formed before the channel release process. The etch process of the channel release process may etch through the inner spacers and damage the epitaxial source/drain features. In the disclosed method, the epitaxial source/drain features are formed after the channel release process, and such damage and loss of the epitaxial source/drain features are eliminated.

Referring to block 880 of FIG. 1A, blocks 890 and 900 of FIG. 1B, FIGS. 10A-10H, and FIGS. 11A-11D, a gate structure is formed. The gate structure includes a gate dielectric layer and a gate electrode disposed over the gate dielectric layer. For example, the gate structure may include a metal gate electrode over a high-k dielectric layer. In some instances, a refractory metal layer may interpose between the metal gate electrode (such as an aluminum gate electrode) and the high-k dielectric layer. As yet another example, the gate structure may include silicide. In the depicted embodiment, the gate structures each includes a gate dielectric layer 228 and a gate electrode 230 that includes one or more metal layers.

In some embodiments, the gate dielectric layers 228 are formed conformally on the GAA device 100 (see FIGS. 10A-10D). The gate dielectric layers 228 at least partially fill the gate trenches 153 and the gaps 157. In the embodiments shown, the gate dielectric layers 228 are formed around the exposed surfaces of each of the semiconductor layers 220A, such that they wrap around the center portions 220A-center of each of the semiconductor layers 220A in 360 degrees. Additionally, the gate dielectric layers 228 also directly contact sidewalls of the semiconductor layers 220B in the gaps 157 and sidewalls of the gate spacers 240. Furthermore, the gate dielectric layers 228 are U-shaped in the gate trenches 153. The gate dielectric layers 228 may include a high-k dielectric material having a dielectric constant greater than a dielectric constant of $SiO_2$, which is approximately 3.9. For example, the gate dielectric layers 228 may include hafnium oxide ($HfO_2$), which has a dielectric constant in a range from about 18 to about 40. As various other examples, the gate dielectric layers 228 may include $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, or combinations thereof. The gate dielectric layers 228 may be formed by any suitable processes, such as CVD, PVD, ALD, or combinations thereof.

In some embodiments, the gate dielectric layers 228 may further include dielectric interfacial layers formed over the center portions 220A-center of the semiconductor layers 220A prior to forming the high-k dielectric material. Such dielectric interfacial layers improve the adhesion between the center portions 220A-center of the semiconductor layers 220A and the high-k dielectric layer. In the disclosed embodiment, each gate dielectric layer 228 includes a dielectric interfacial layer 228A and a high-k dielectric material layer 228B over the dielectric interfacial layer 228A. The corresponding GAA device 100 are illustrated in FIGS. 10E-10H. FIGS. 10E-10H are similar to FIGS. 10A-10D, respectively. However, the dielectric interfacial layer 228A and the high-K dielectric material layer 228B are particularly labeled. In the disclosed embodiment, the dielectric interfacial layer 228A are selectively formed on the exposed surfaces of the semiconductor layers 220A (see FIGS. 10F and 10H) and are not formed on other surfaces. In the furtherance of the embodiment, the dielectric interfacial layer 228A includes silicon oxide and is formed by a suitable method, such as thermal oxidation. In other figures, the dielectric interfacial layer 228A and the high-k dielectric material layer 228B are collectively referred to by the numeral 228.

Referring to block 900 of FIG. 1B and FIGS. 11A-11D, gate electrodes 230 are formed over the gate dielectric layers 228 to fill the remaining spaces of the gate trenches 153 and the gaps 157. The gate electrodes 230 may include any suitable materials, such as titanium nitride (TiN), tantalum nitride (TaN), titanium aluminide (TiAl), titanium aluminum nitride (TiAlN), tantalum aluminide (TaAl), tantalum aluminum nitride (TaAlN), tantalum aluminum carbide (TaAlC), tantalum carbonitride (TaCN), aluminum (Al), tungsten (W), copper (Cu), cobalt (Co), nickel (Ni), platinum (Pt), or combinations thereof. In some embodiments, a CMP is performed to expose a top surface of the dielectric layer 242. In the disclosed embodiment, the gate electrodes include multiple conductive layers, such as one functional metal layer and one bulk metal layer. A gate dielectric layer 228 and a gate electrode 230 are collectively referred to as a gate stack (or gate structure) 244.

A gate stack 244 is further described in detail with reference to FIGS. 12A, 12B and 12C in sectional views in portion, constructed according to various embodiments. The gate structure 244 includes a gate dielectric layer 228 and a gate electrode 230 disposed on the gate dielectric layer 228, as illustrated in FIG. 12A. In some embodiments, the gate stack 244 alternatively or additionally includes other proper materials for circuit performance and manufacturing integration. For example, the gate dielectric layer 228 includes an interfacial layer 228A (such as silicon oxide) and a high-k dielectric material layer 228B. The high-k dielectric material may include metal oxide, metal nitride or metal oxynitride. In various examples, the high k dielectric material layer includes metal oxide: ZrO2, Al2O3, and HfO2, formed by a suitable method, such as metal organic chemical vapor deposition (MOCVD), physical vapor deposition (PVD), atomic layer deposition (ALD), or molecular beam epitaxy (MBE). In some examples, the interfacial layer includes silicon oxide formed by ALD, thermal oxidation or ultraviolet-Ozone Oxidation.

The gate electrode 230 includes metal, such as aluminum, copper, tungsten, metal silicide, doped polysilicon, other proper conductive material or a combination thereof. The gate electrode may include multiple conductive films designed such as a capping layer, a work function metal layer, a blocking layer and a filling metal layer, such as aluminum, copper, tungsten, other suitable metal or a combination thereof. The multiple conductive films are designed for work function matching to n-type FET (nFET) and p-type FET (pFET), respectively. In some embodiments, the gate electrode for nFET includes a work function metal with a composition designed with a work function equal 4.2 eV or less and the gate electrode for pFET includes a work function metal with a composition designed with a work function equal 5.2 eV or greater. For examples, the work function metal layer for nFET includes tantalum, titanium aluminum, titanium aluminum nitride or a combination thereof. In other examples, the work function metal layer for pFET includes titanium nitride, tantalum nitride or a combination thereof.

The gate structure includes a n-type gate electrode 230N and a p-type gate electrode 230P. The n-type gate electrode 230N and the p-type gate electrode 230P may be in any proper configuration, depending individual circuit and corresponding circuit design and layout. For example, the n-type gate electrode 230N and the p-type gate electrode 230P may be disposed in parallel and distance away from each other. In another example, the n-type gate electrode 230N and the p-type gate electrode 230P may be aligned and disposed in contact, as illustrated in FIG. 11A.

The n-type gate electrode 230N and the p-type gate electrode 230P are formed separately by a proper procedure that includes deposition, and lithography patterning. For example, a photolithography process is performed to form a patterned mask covering the regions for n-type gates and having openings to expose the regions for p-type gates. The materials of the p-type gate electrode 230P are deposited in the gate trenches for the p-type gate electrode 230P. Thereafter, the materials of the n-type gate electrode 230N are deposited in the gate trenches for the n-type gate electrode 230N. One or more CMP process is applied to remove excessive portions of the deposited materials and planarize the top surface. In another embodiment, the procedure is similar but the n-type gate electrode 230N is formed first and the p-type gate electrode 230P is formed afterward.

In yet another embodiment, the materials of the p-type gate electrode 230P are deposited in gate trenches for both n-type gate electrode 230N and p-type gate electrode 230P. A photolithography process is performed to form a patterned mask covering the regions for p-type gates and having openings to expose the regions for n-type gates. An etch process is applied to selectively remove the deposited gate materials from the regions of the n-type gates. The materials of the n-type gates are deposited into the gate trenches for the n-type gates. One or more CMP process is applied to remove excessive portions of the deposited materials and planarize the top surface. In yet another embodiment, the procedure is similar but the n-type gate electrode 230N is formed first and the p-type gate electrode 230P is formed afterward. The gate structure is further illustrated in FIG. 11E. FIG. 11E is a top view of a portion of the gate stack 244 in the dashed box of FIG. 11B. The gate dielectric layer 228 surrounds the gate electrode 230 in the top view, especially on all sidewalls of the gate electrode 230.

Additionally, in the disclosed method, source/drain features are formed after the formation of the gate structure, the activation annealing process to the source/drain features may inadvertently intermix the work function metal with adjacent materials (such as fill metal and high-k dielectric material) and thereby shift the work function of the corresponding gate electrode, leading to shifted threshold voltage of the field-effect transistor and degraded device performance. In the disclosed embodiment, the work function metal of the p-type gate electrode 230P is particularly sensitive to thermal annealing. In the disclosed embodiment, the p-type gate electrode 230P is further engineered with a structure and a composition to reduce and eliminate such shifting of the work function of the p-type gate electrode, as illustrated in FIGS. 12B and 12C.

As illustrated in FIG. 12B and further reference to block 890 of FIG. 1B, the p-type gate electrode 230P includes a work function metal layer 230A and a fill metal layer 230B, and further includes a rare earth metal oxide layer 246, such as $La_2O_3$, $Dy_2O_3$, or a combination thereof. The rare earth metal oxide layer 246 can induce a dipole layer and modulate the threshold voltage shift. The rare earth metal oxide layer 246 is formed by a suitable method, such as atomic layer deposition (ALD). In some embodiments, the rare earth metal oxide layer 246 includes one or more atomic layer. In some embodiments, the rare earth metal oxide layer 246 and the work function metal layer 230A are both formed by ALD. In furtherance of the embodiments, the rare earth metal oxide layer 246 includes one atomic layer and the work function metal layer 230A includes a number N of atomic layers, in which N is an integer, such as ranging between 1 and 10. It is noted that the gate structure 244 is similar to the gate structure 244 of FIG. 12A (such as the high-k dielectric layer is U-shaped) but the gate electrode includes a rare earth metal oxide layer 246.

In another embodiment illustrated in FIG. 12C, the p-type gate electrode 230P includes a stack of work function metal layers 230A and rare earth metal oxide layers 246 disposed under the fill metal layer 230B. Each of the rare earth metal oxide layers 246 is similar to the rare earth metal oxide layer 246 of FIG. 12B in terms of composition and formation. However, the stack includes a number M of pairs of a work function metal layer 230A and a rare earth metal oxide layer 246 disposed in an alternative configuration. M is an integer, such as ranging between 1 and 6. The rare earth metal oxide layers 246 and the work function metal layers 230A are formed by ALD. Each pair of the stack is similar to the work function metal layer 230A and the rare earth metal oxide layer 246 of FIG. 12B in terms of thickness and configuration. It is noted that the gate structure 244 is similar to the gate structure 244 of FIG. 12B (such as the high-k dielectric layer is U-shaped) but the gate electrode includes a rare earth metal oxide layer 246 configured in a stack. Same patterned mask is used to cover the regions for n-type gate electrode 230N during depositions of the p-type work function metal layer(s) 230A, the rare earth metal oxide layers 246 and the fill metal layer 230B.

In some other embodiments, the removal of the dummy gates and formation of the metal gate structures are collectively implemented by a suitable procedure as described below. The procedure includes forming a patterned mask to cover the regions for n-type transistors, the dummy gates in the regions for p-type transistors are removed to form gate trenches 153 and gaps 157; and p-type metal gates are then formed in the corresponding gate trenches 153 and gaps 157. Then the patterned mask is removed; a second patterned mask to cover the regions for p-type transistors; the dummy gates in the regions for n-type transistors are removed to form gate trenches 153 and gaps 157; and n-type metal gates are then formed in the corresponding gate trenches 153 and gaps 157. A CMP process is applied to remove the excessive materials and planarize the top surface.

Referring to block 910 of FIG. 1B and FIGS. 13A-13D, gate top caps 247 are formed over the gate electrodes 230. The gate top caps 247 include one or more dielectric material with composition(s) different from the materials of and the gate spacers 240 and an inter-layer dielectric (ILD) layer to be formed at later stage with etch selectivity. Therefore, when contact features are formed on the gate electrodes 230 by patterning and deposition, the etch selectivity can achieve self-alignment of the gate contact features to the gate electrodes 230. Similarly, when contact features are formed on the source/drain features by patterning and deposition, the etch selectivity can achieve self-alignment of the source/drain contact features to the source/drain features. The formation of the gate caps 247 includes a suitable procedure that further includes selectively etching the gate materials including gate electrodes 230 and gate dielectric layer 228 so that the gate materials are recessed; and one or more suitable dielectric material is deposited to fill in the recesses of the gate electrodes 230. A CMP process may be further applied to remove excessive deposited material and planarize the top surface. The gate top caps 247 are formed with enough thickness to resist the etch process. In some embodiments, the gate recesses and corresponding thickness of the gate top caps 247 ranges between 15 nm and 40 nm.

Referring to block 920 of FIG. 1B and FIGS. 14A-14D, the dielectric layer 242 is removed by an etch process, such as wet etch using a suitable etchant to selectively etch the dielectric layer 242. For example, when the dielectric layer 242 is a silicon oxide layer, a hydrofluoric acid may be applied to remove the dielectric layer 242.

Referring to block 930 of FIG. 1B and FIGS. 15A-15D, the portions of the fins 130*a* and 130*b* (as source/drain regions) exposed by the gate stacks 244 and gate spacers 240 are removed by an etch process, such as wet etch, dry etch or a combination thereof using suitable etchants to etch various materials, thereby forming source/drain recesses (or trenches) 151. In the disclosed embodiments, the gate stack 244 is extended to the source/drain regions, the etching process is designed to remove semiconductor layers 220A (such as Si), semiconductor layers 220B (such as SiGe), the high-k dielectric material of the gate dielectric layer 228, and various metal materials of the gate electrode 230. The etch process may include multiple etch steps each having respective etchant to remove various materials in the source/drain regions.

In some embodiments, a dry etch process is utilized to collective recess various materials in the source/drain regions. The dry etch process may include one or more etch steps. For example, the dry etch process may use an etch precursor having fluorine (F) and chlorine (Cl) to remove high-k dielectric materials (such as hafnium oxide), metals (such as copper and titanium nitride), and semiconductor materials (such as silicon and silicon germanium). In some embodiments, the dry etch process utilizes a fluorine-containing gas (for example, $SF_6$) to recess the source/drain regions.

In some embodiments, the dry etch process includes more than one etch step and may include a first etch process having a first etch chemistry and a second etch process having a second etch chemistry that is different from the first etch chemistry. The first etch process may be a main-etch process that initially forms an opening in the stack of semiconductor layers 220A and 220B, and gate materials while the second etch process may be an over-etch process that shapes the initially-formed opening to produce a tapered profile. The first etch chemistry may include hydrogen bromide (HBr) combined with argon (Ar), helium (He), oxygen ($O_2$), or a combination thereof. The second etch chemistry may include hydrogen bromide (HBr) combined with nitrogen, methane ($CH_4$), or a combination thereof. The second etch process (e.g. the over-etch process) may be performed at a high bias power (e.g. a bias power in a range from about 150 Watts to about 600 Watts).

In some embodiments, a wet etch process is utilized with etchant including HBr-containing chemical and HCl-containing chemical. In some embodiments, a wet etch process is utilized with etchant including a mixture of hydrochloric acid-(HCl), hydrogen peroxide ($H_2O_2$), water ($HO_2$). In some embodiments, a wet etching process utilizes an etching solution that includes ammonium hydroxide ($NH_4OH$), hydrochloric acid (HCl), and water ($H_2O$).

Referring to block 940 of FIG. 1B and FIGS. 16A-16D, another etch process is applied to laterally recess the gate structure, thereby forming lateral recesses (or undercuts) 161 between the semiconductor sheets 220A. The present etch process determines the gate dimension and therefore determines the channel length as well. In the existing method, the metal gates are formed after the source/drain features, channel length and gate dimension are controlled by two etch process, the first etch process to remove semiconductor layers 220B in the gate trenches during channel-release process and the second etch process to lateral recess semiconductor layers 220B in the source/drain recesses 151. In that situation, more variations of the channel length and gate dimension are introduced, leading to degraded circuit performance. In the disclosed method, both the channel length and gate dimension are determined by single etch process at the current step, reducing the variations of both parameters. Especially, after the present etch process of the disclosed method, the gate stack 244 formed thereby is different from the existing structure of a gate stack, which is further illustrated in FIG. 16E. However, the etch process at this step is applied to selectively etch the gate materials 228 and 230, instead of semiconductor layers 220B. Therefore, the etch process is designed with etchant to effectively remove the gate materials. In some embodiments, the etchant includes HCl.

Figure 16B:
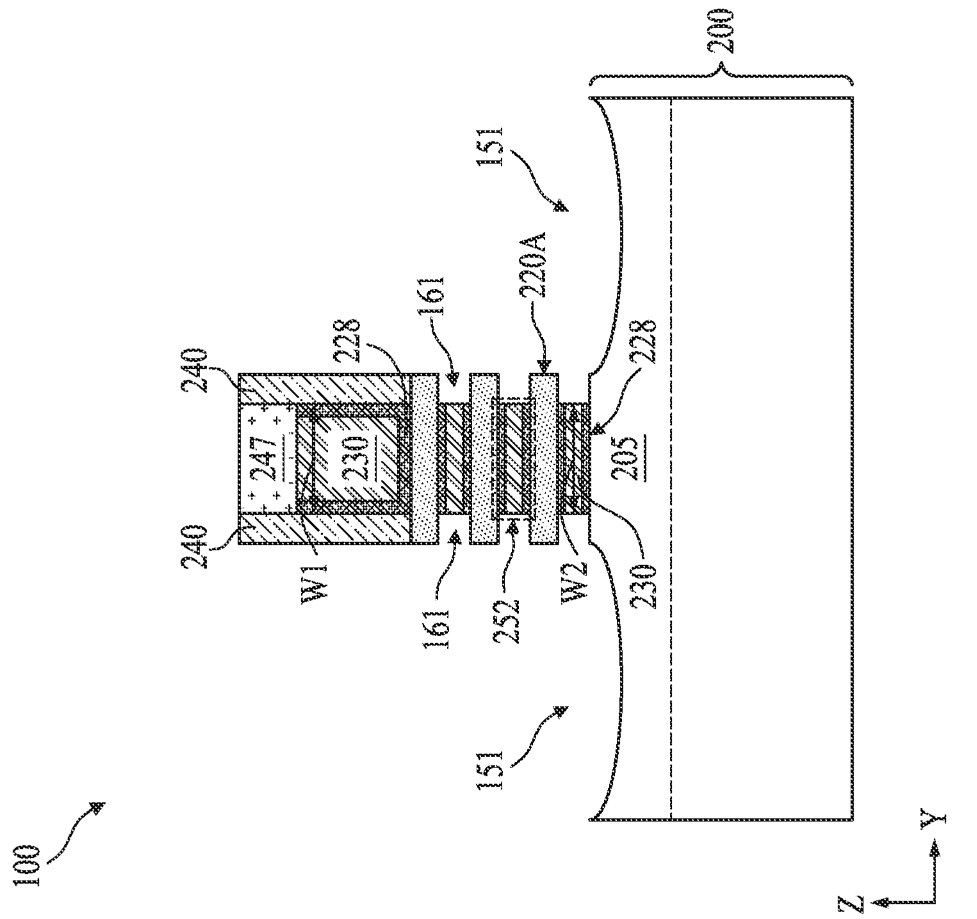
Figure 16A:
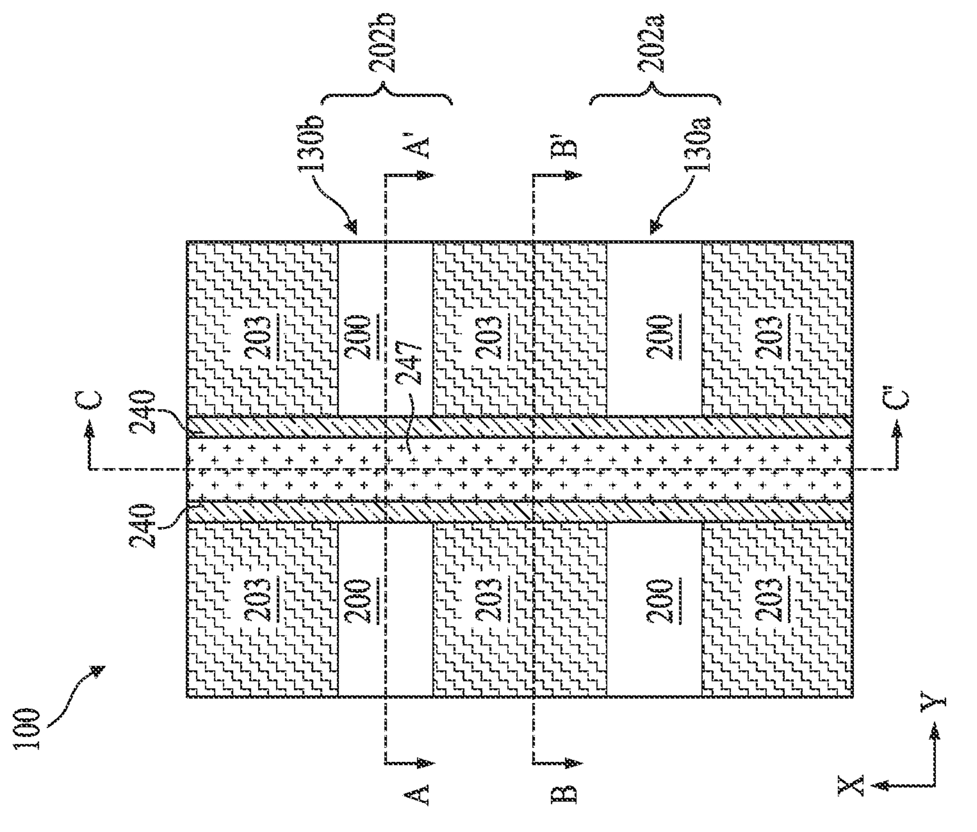
Figure 16D:
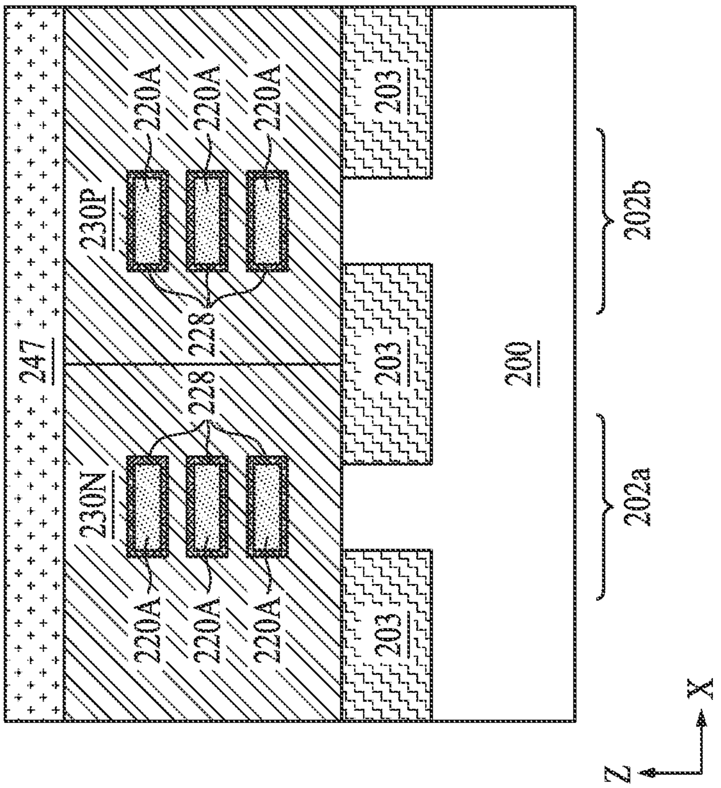
Figure 16C:
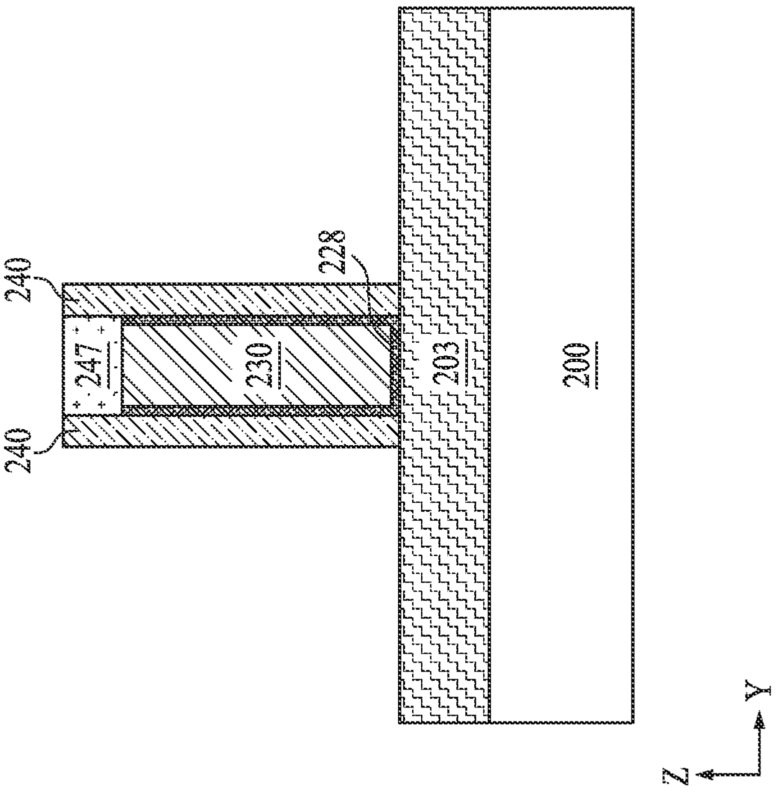
Figure 16E:
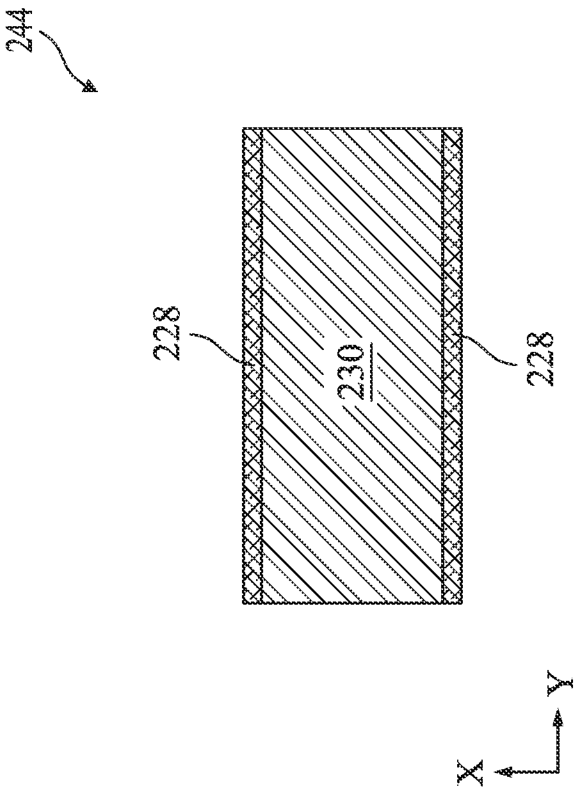
Figure 17B:
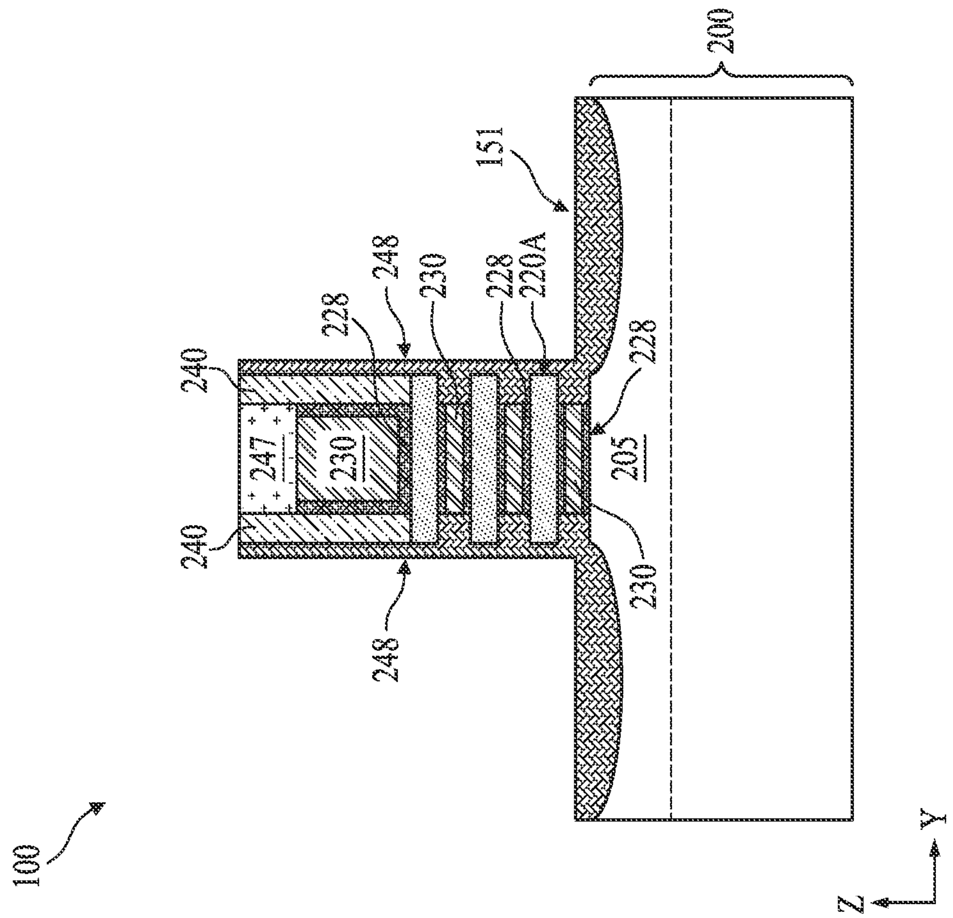
Figure 17A:
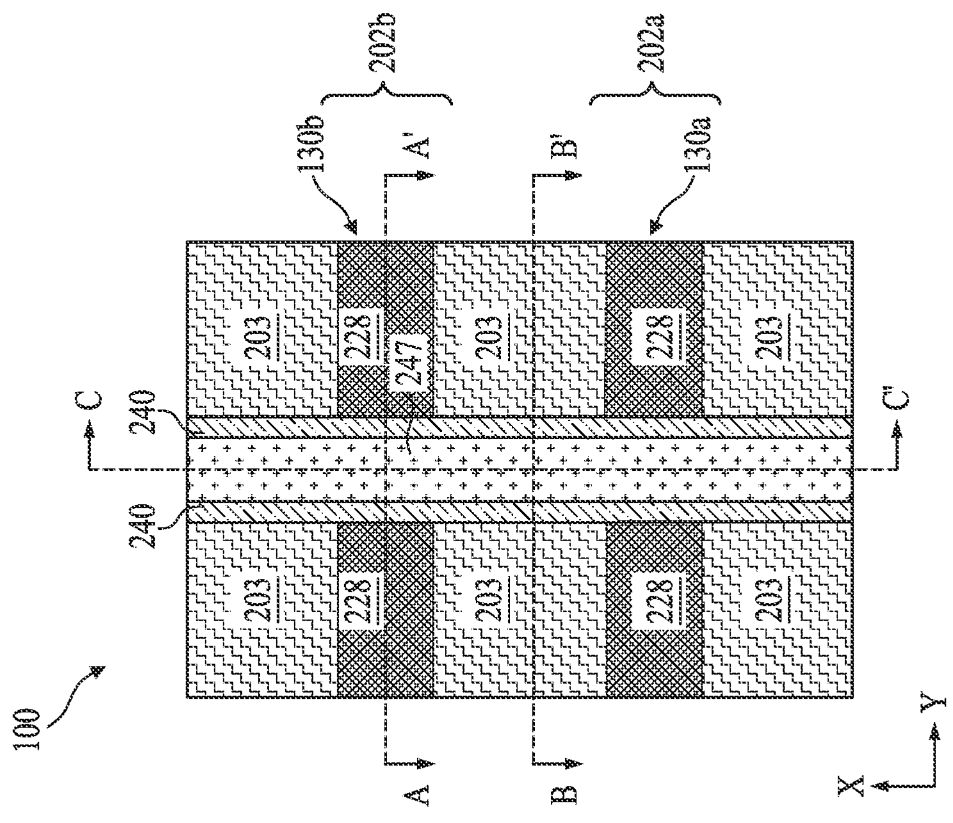
Figure 17D:
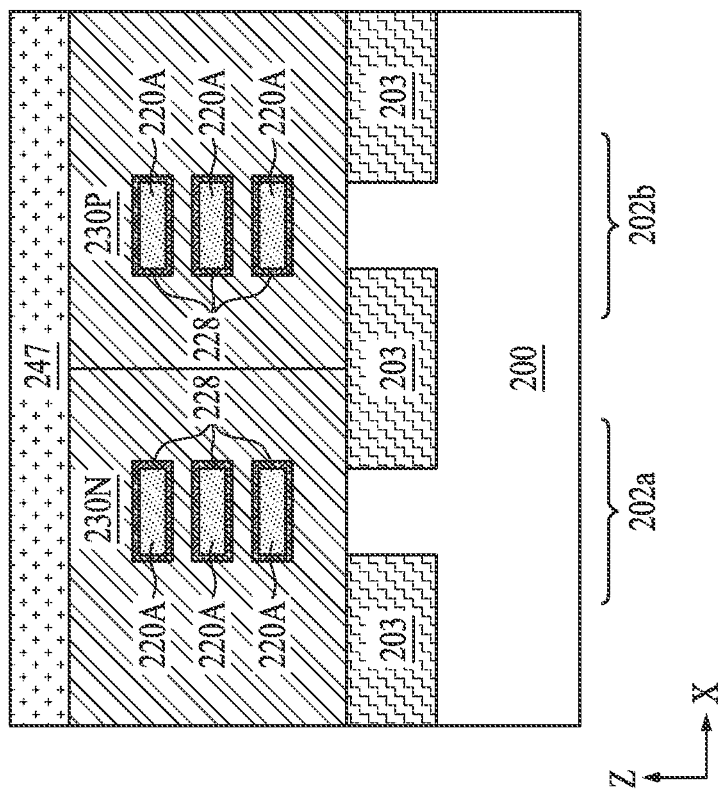
Figure 17C:
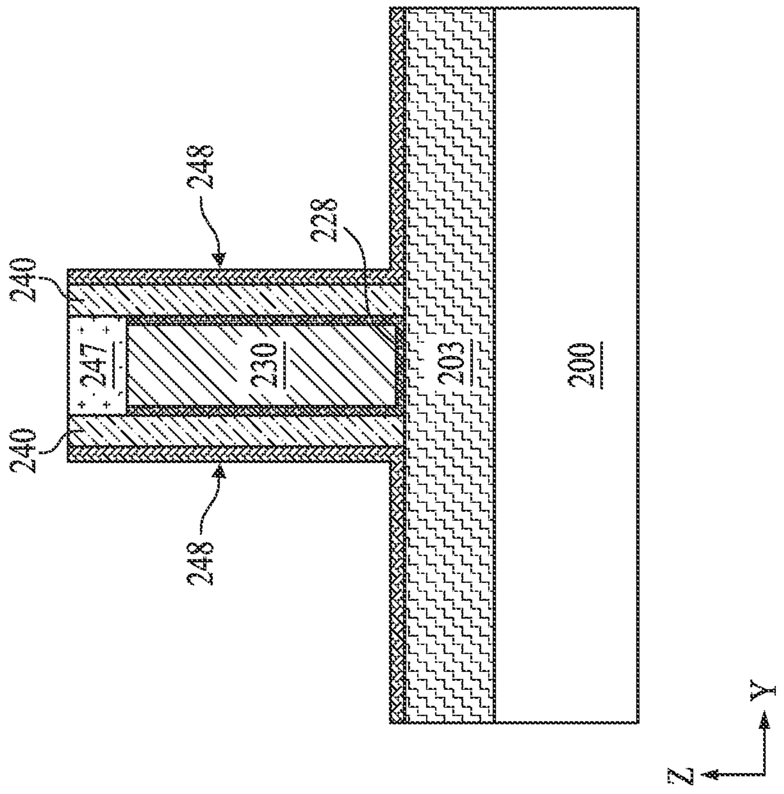

FIG. 16E is a top view of a portion of the gate stack 244 in the dashed box 252 of FIG. 16B. Usually, the gate dielectric layer 228 surrounds the gate electrode 230 in the top view, especially on opposing sidewalls along X direction and Y direction, similar to the structure illustrated in FIG. 11E. However, the edges of the gate electrode 230 oriented along X direction (referred to as X edges) are also edges of the channels, which are weak regions. The existing gate structure similar to the one in FIG. 11E has a weak control to the channel. This is because the gate dielectric layer 228 is formed on the sidewalls of X edges of the gate electrode 230, so the gate electrode 230 is retreated from the edge by the thickness of the gate dielectric layer 228 and reduces the control to the channel edges. In other words, the edges of the channels corresponding to the X edges of the gate electrode 230 are hard to turn on or need a high threshold voltage to turn on. In the disclosed structure, the gate dielectric layer 228 on the X edges of the gate electrode 230 is eliminated, the X edges of the gate electrode 230 are aligned to the corresponding channel edges, and such weak corner turn-on issues are eliminated.

Furthermore, the gate electrode 230 includes a top portion next to the gate spacers 240 and bottom portions below the gate spacers 240 with respective widths W1 and W2 illustrated in FIG. 16B. W1 and W2 can be tuned differently, depending on the circuit design. This provides another way to tune the device performance when performing the lateral etching for inner spacers. In the disclosed example, W2 is greater than W1.

Referring to block 950 of FIG. 1C and, FIGS. 17A-17D, and FIGS. 18A-18D, inner spacers 250 are formed in the lateral recesses 161. The formation of the inner spacers 250 may include deposition and anisotropic etch, as elaborated below.

Referring to FIGS. 17A-17D, a dielectric material 248 is deposited into both the recesses 151 and the undercuts 161. The dielectric material 248 may be selected from $SiO_2$, SiON, SiOC, SiOCN, or combinations thereof. In some embodiments, the proper selection of the dielectric material 248 may be based on its dielectric constant. In an embodiment, this dielectric material 248 may have a dielectric constant lower than that of the gate spacers 240. In some other embodiments, this dielectric material 248 may have a dielectric constant higher than that of the gate spacers 240. This aspect of the dielectric material 248 will be further discussed later. The deposition of the dielectric material 248 may be any suitable methods, such as CVD, PVD, PECVD, MOCVD, ALD, PEALD, or combinations thereof. A chemical-mechanical polishing (CMP) process may be performed to planarize the top surfaces of the GAA device 100. In the operation depicted in FIGS. 17A-17D, the dielectric material 248 completely fills both the recesses 151 and the undercuts 161.

Figure 18B:
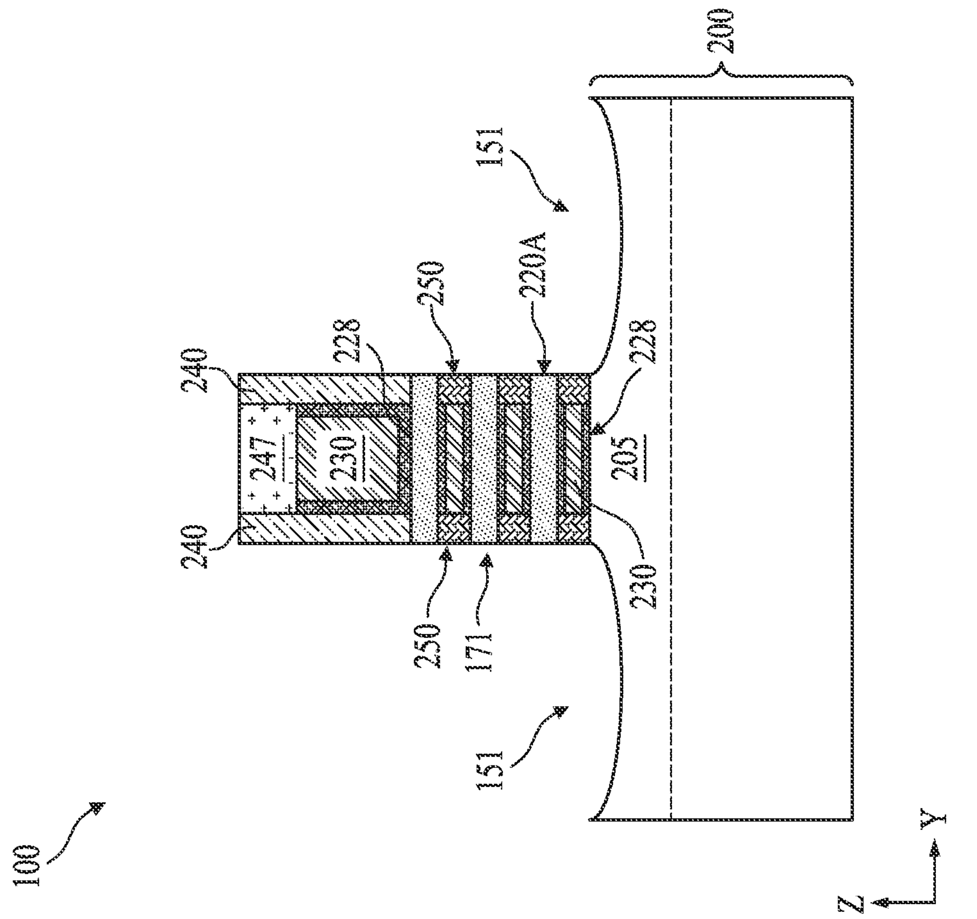
Figure 18A:
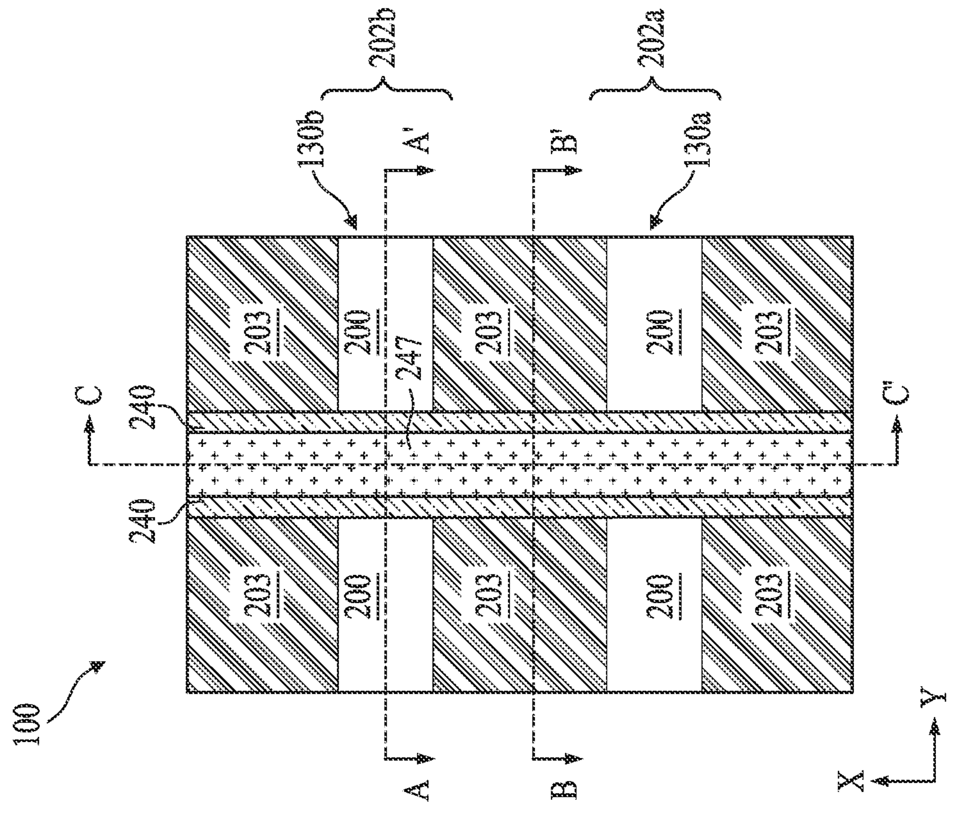
Figure 18D:
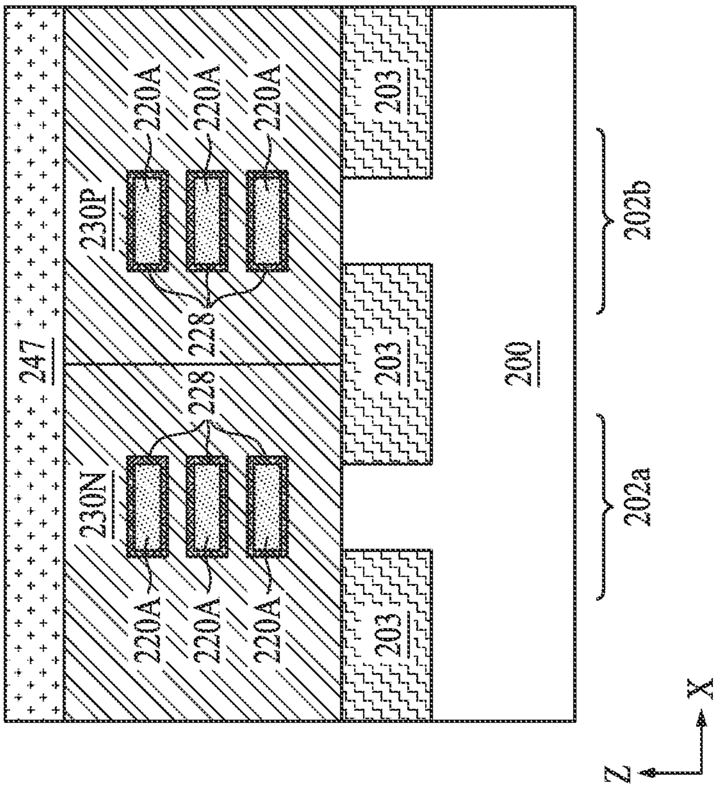
Figure 18C:
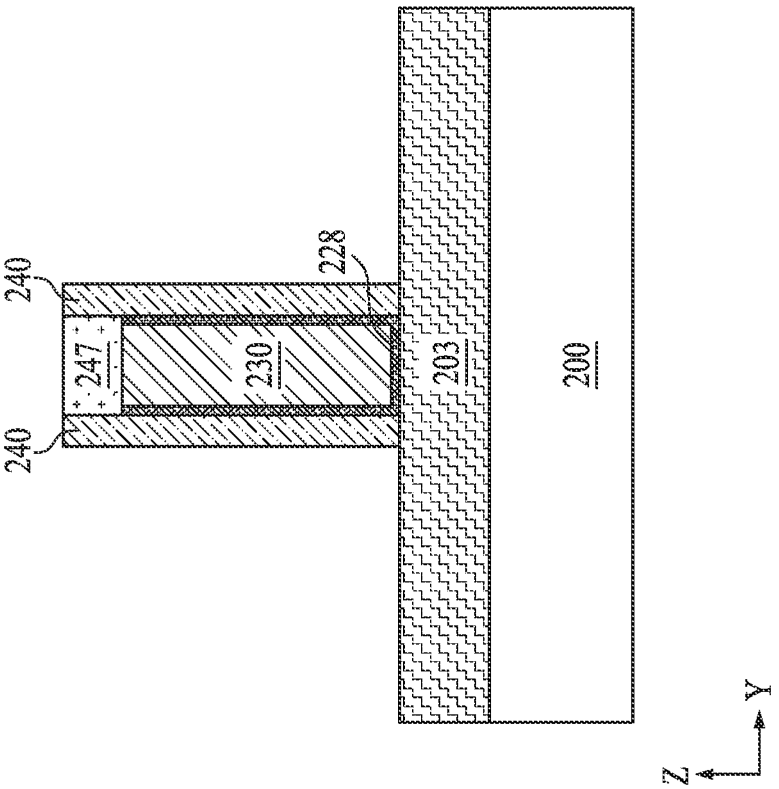

Referring to FIGS. 18A-18D, the dielectric material 248 is etched back such that the top surface of the substrate 200 is exposed. In the depicted embodiment, the etching-back is a self-aligned anisotropic dry-etching process, such that the top spacers 240 are used as the masking element. Alternatively, a different masking element (e.g. a photoresist) may be used. The etching-back process removes the dielectric materials 248 within the recesses 151 but does not substantially affect the dielectric materials 248 within the undercuts 161. As a result, the dielectric material 248 filling the undercuts 161 become inner spacers 250. In other words, the inner spacers 250 are formed between vertically adjacent (e.g. along in the Z-direction) side portions of the semiconductor layers 220A. In the present embodiment, the inner spacers 250 are only present in the active regions. As illustrated in FIG. 18C, no inner spacers 250 are present over the isolation features 203. Rather, only top spacers 240 are present over the isolation features 203. As illustrated in FIG. 18B, the sidewall surfaces of the inner spacers 250, the top spacers 240, and side surfaces of the semiconductor layers 220A form continuous sidewall surfaces 171. In other words, the continuous sidewall surfaces 171 include both exposed side surfaces of semiconductor materials from the semiconductor layers 220A and exposed side surfaces of dielectric material from the top spacers 240 and the inner spacers 250. In some embodiments, the inner spacers 250 include a thickness ranging between 3 nm and 10 nm.

Figure 19B:
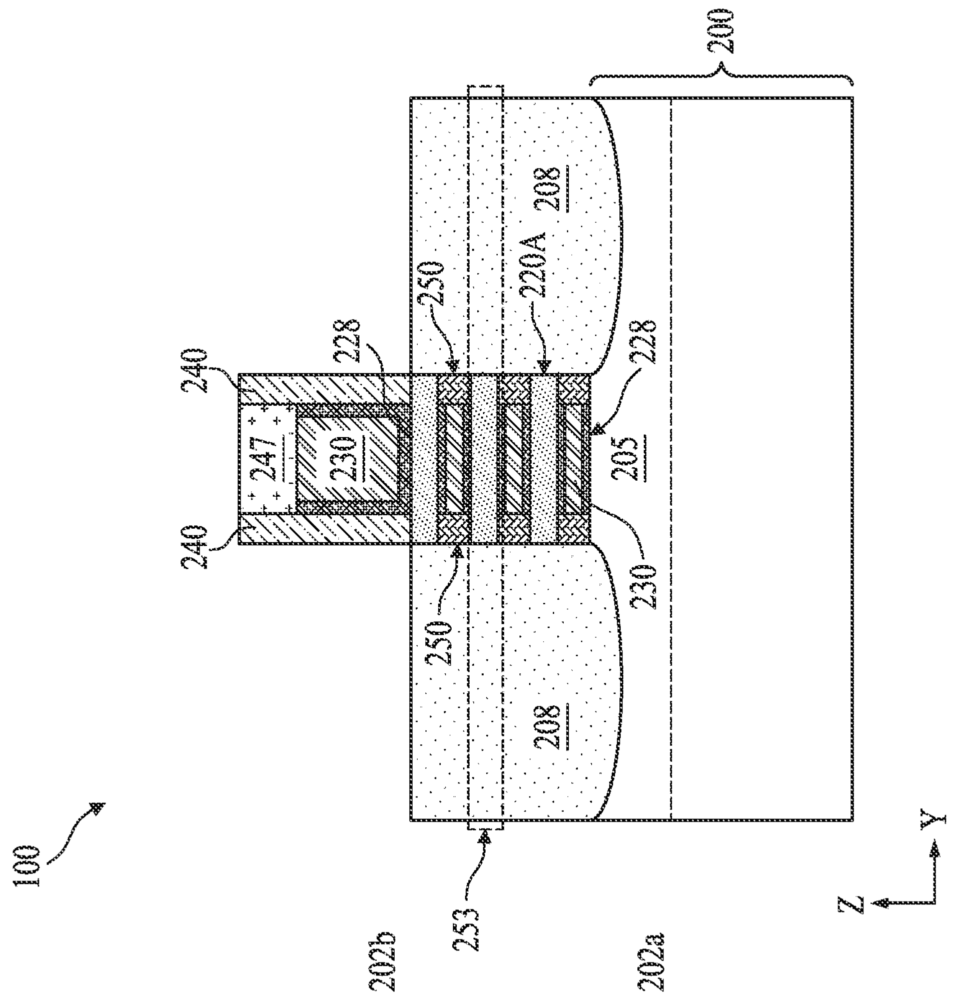
Figure 19A:
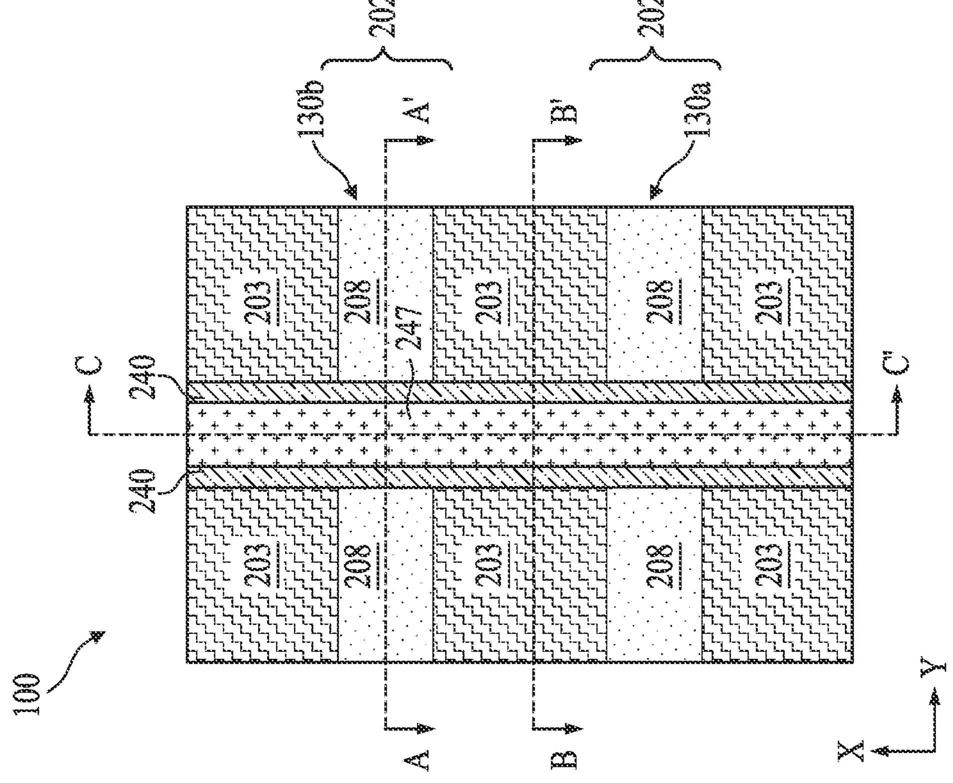
Figure 19D:
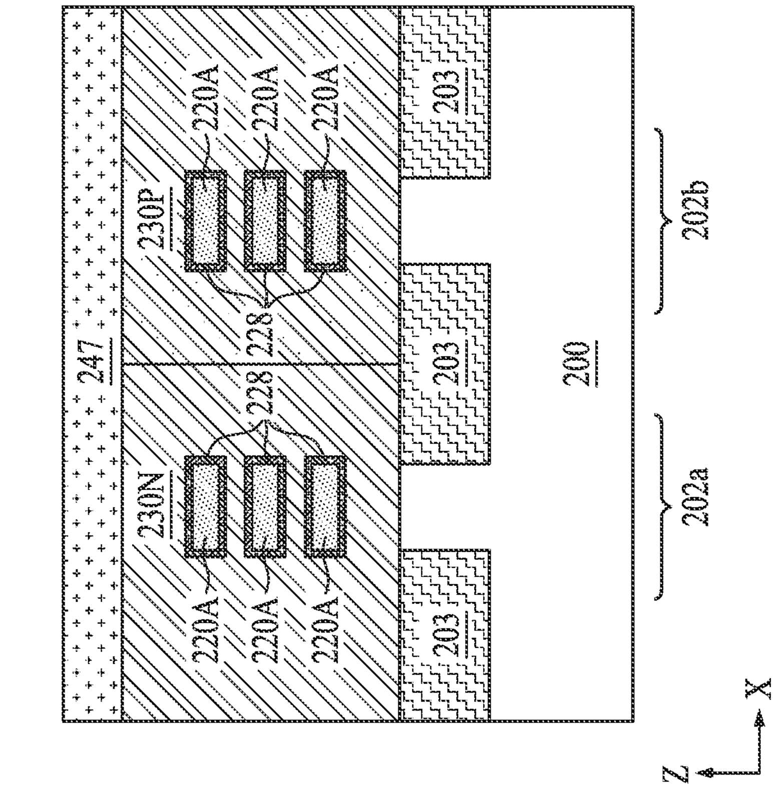
Figure 19C:
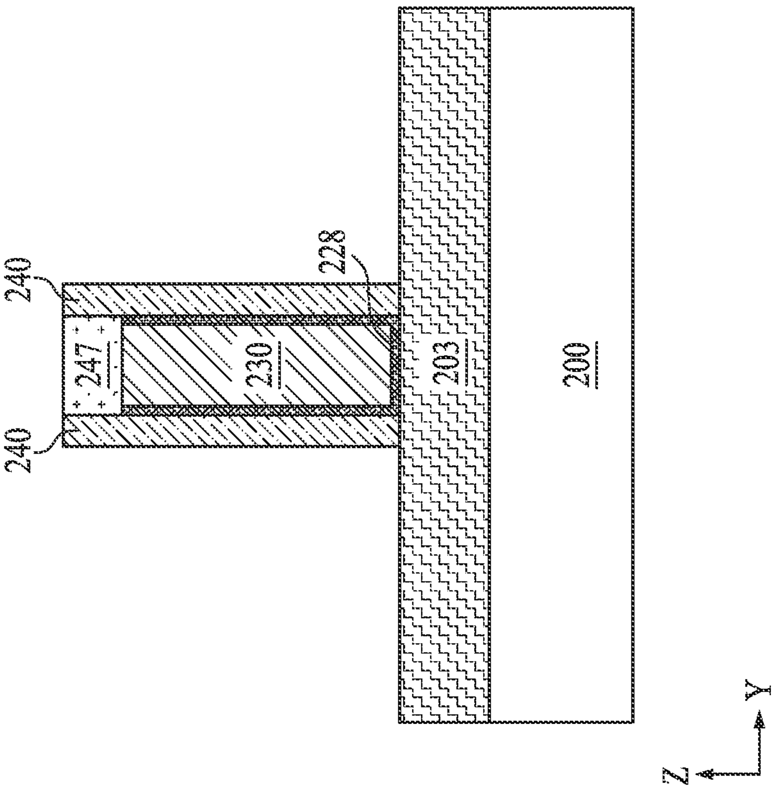
Figure 19E:
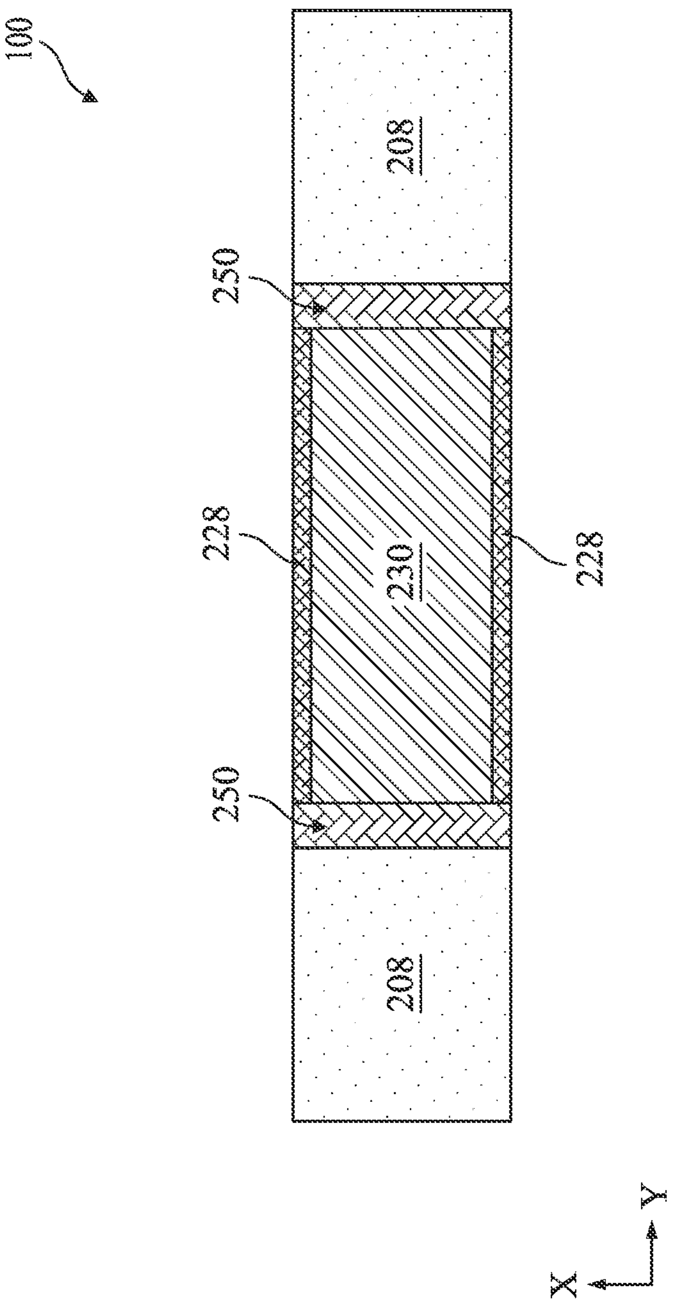
Figure 19G:
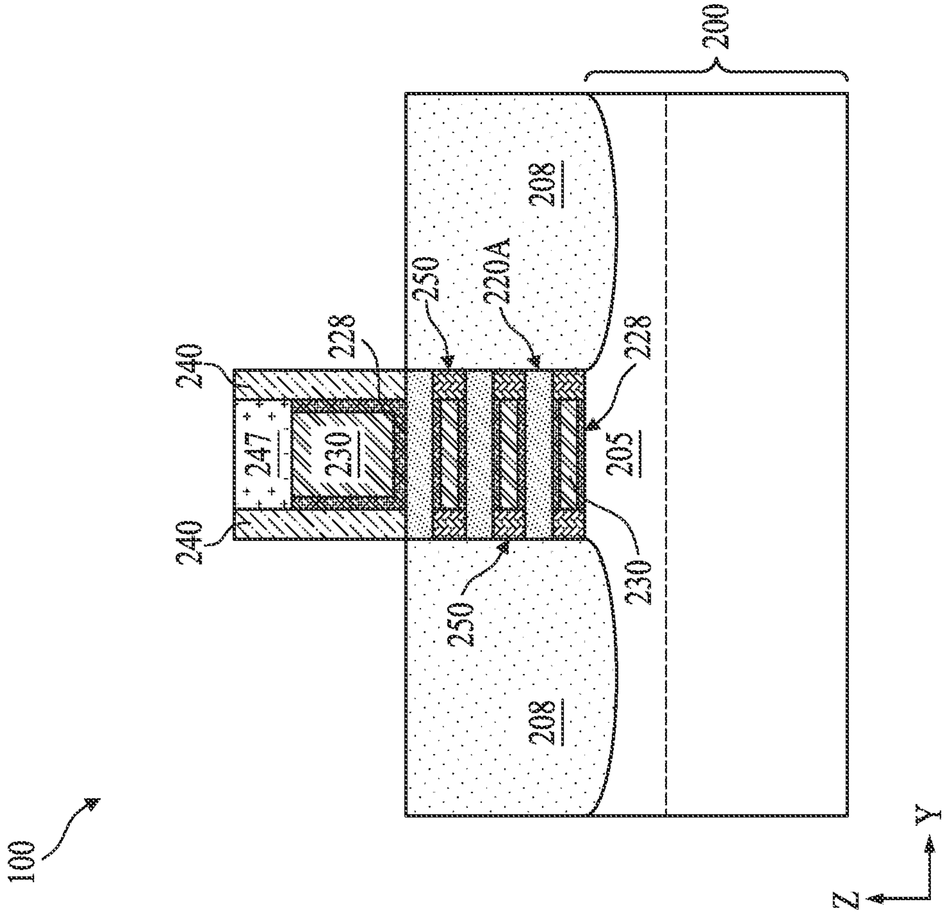
FIGS. 19G, 19H, and 19I are cross sectional views of an embodiment of a GAA device of the present disclosure along the lines A-A', B-B', and C-C' in FIG. 19F, respectively, according to some embodiments of the present disclosure.
Figure 19F:
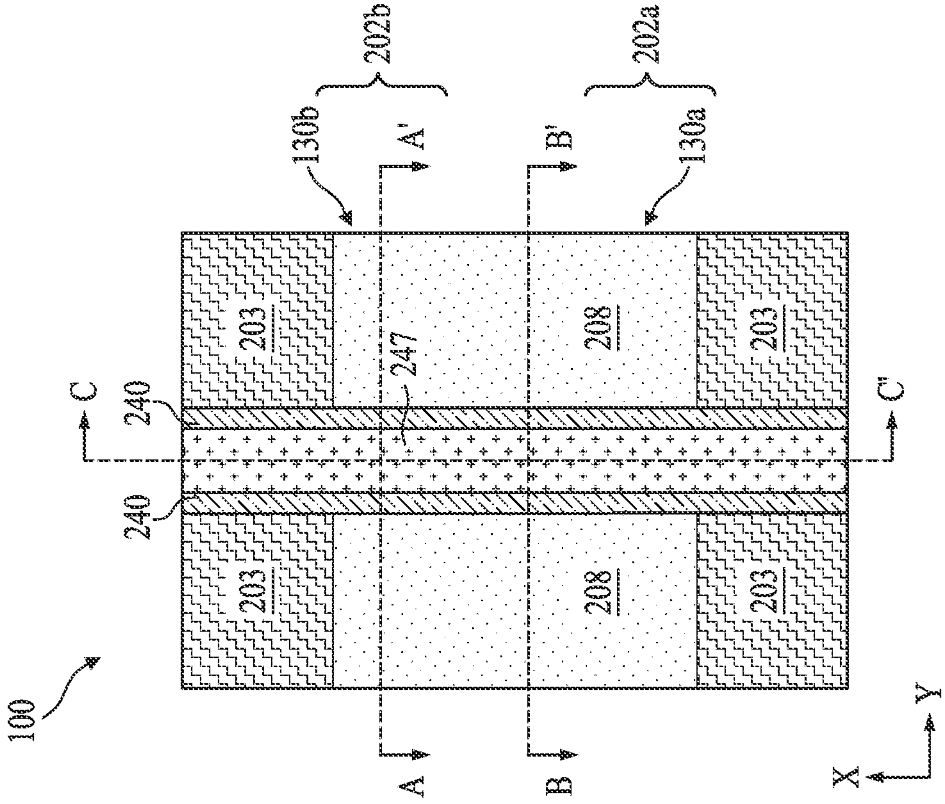
Figure 19I:
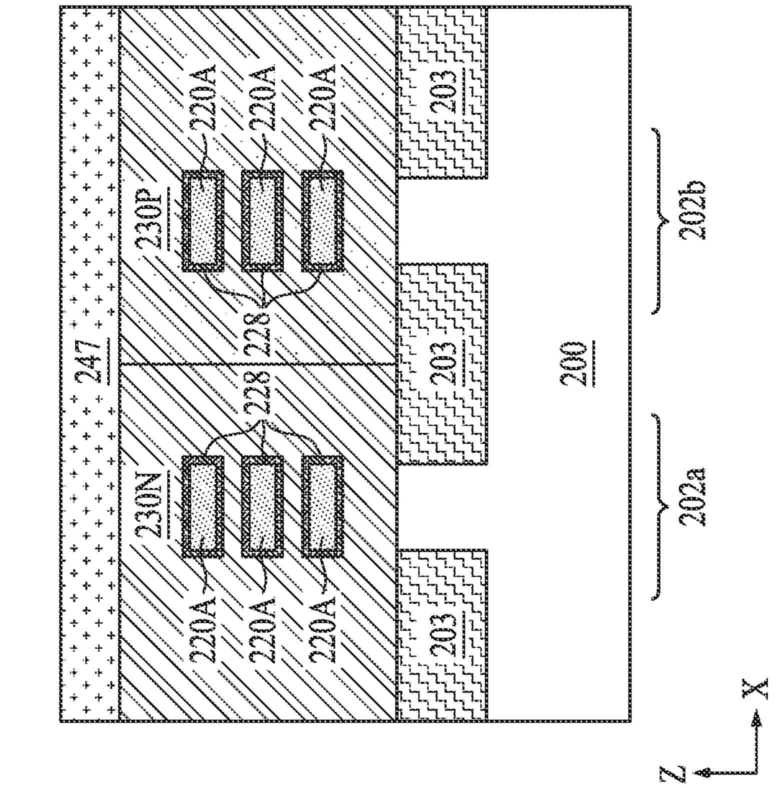
Figure 19H:
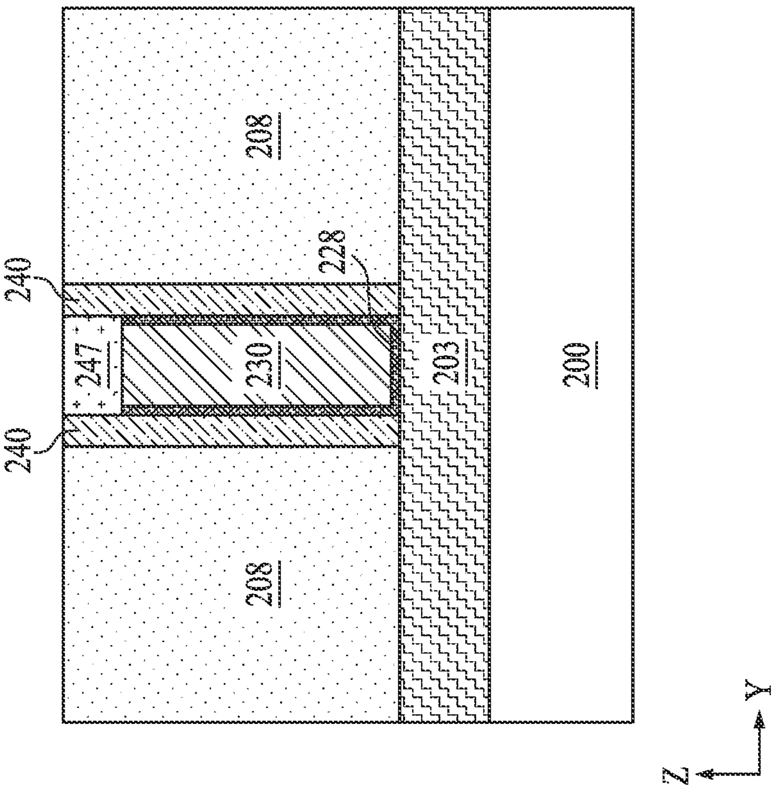
Figure 20B:
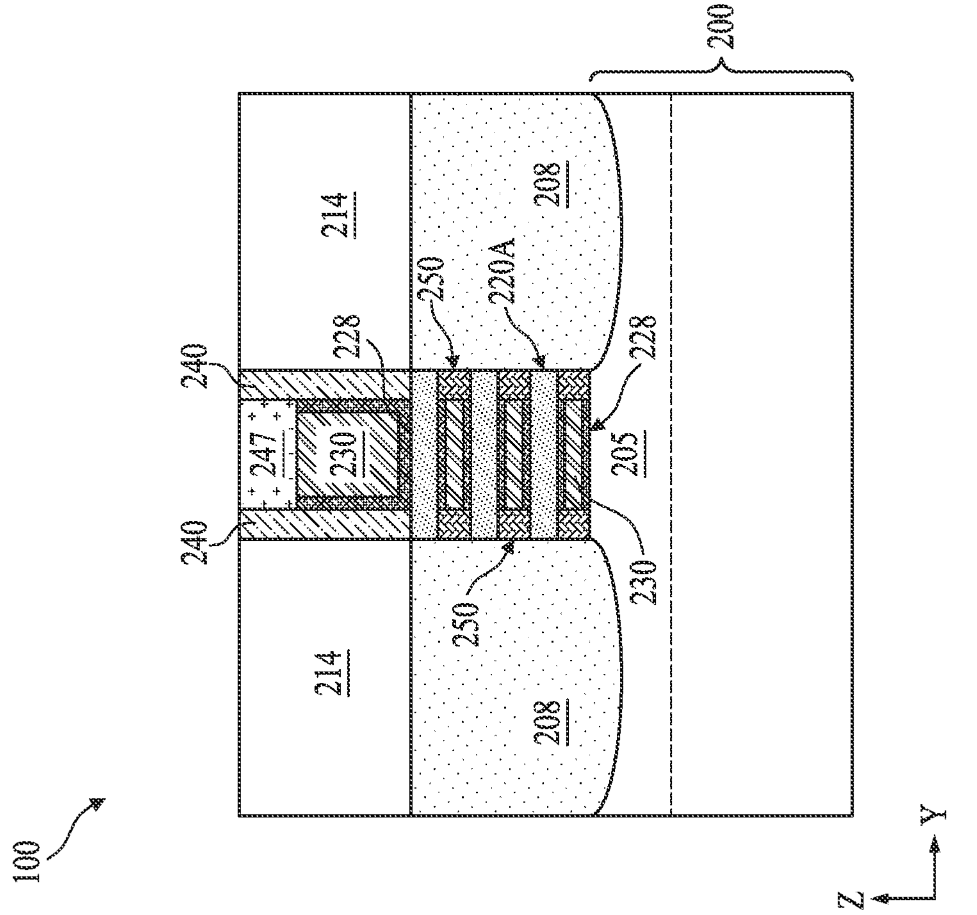
Figure 20A:
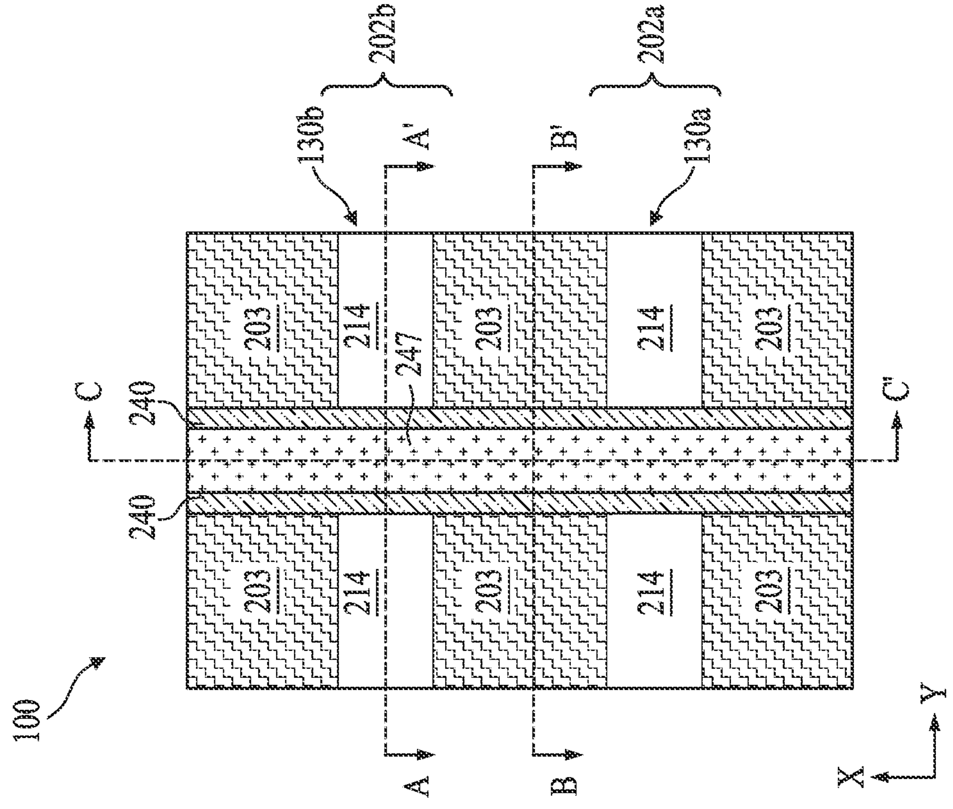
Figure 20D:
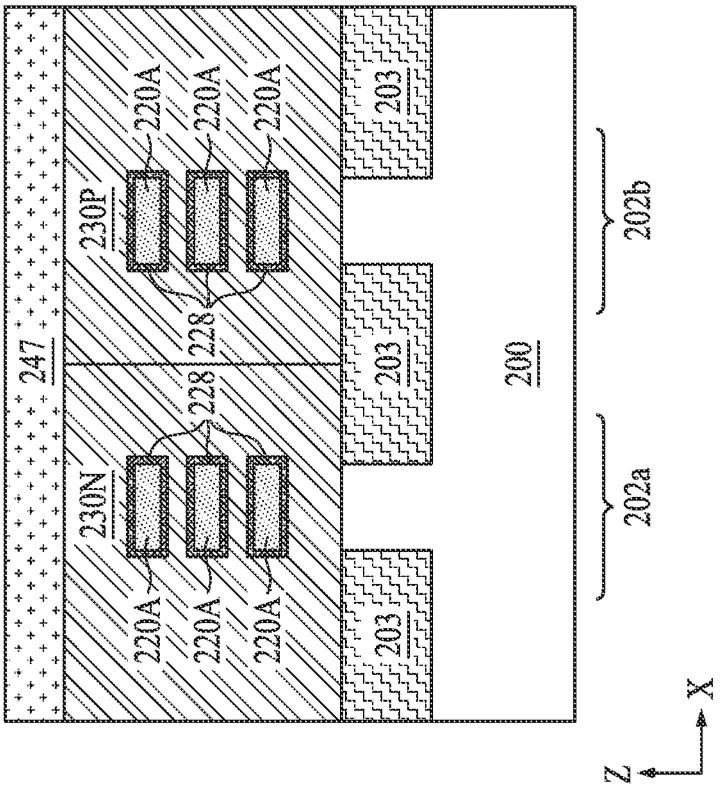
Figure 20C:
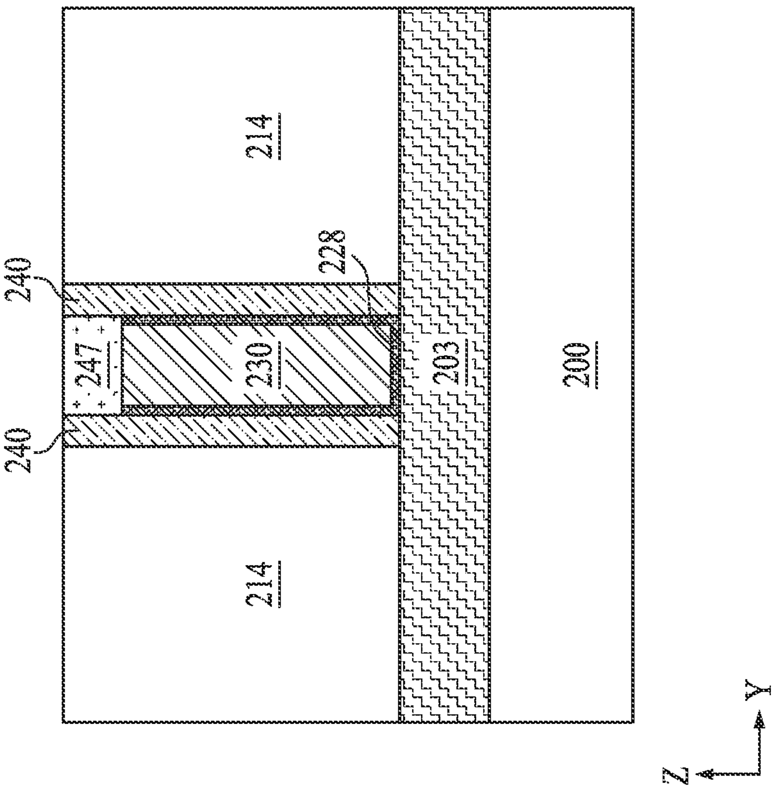
Figure 21B:
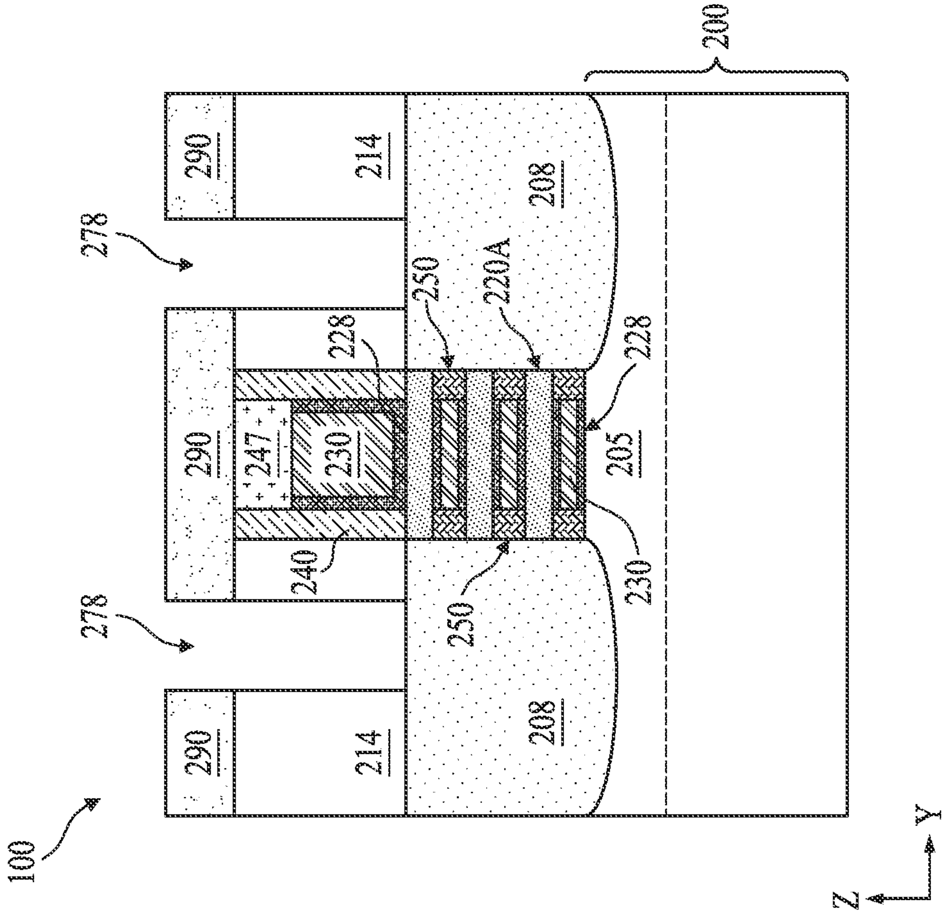
Figure 21A:
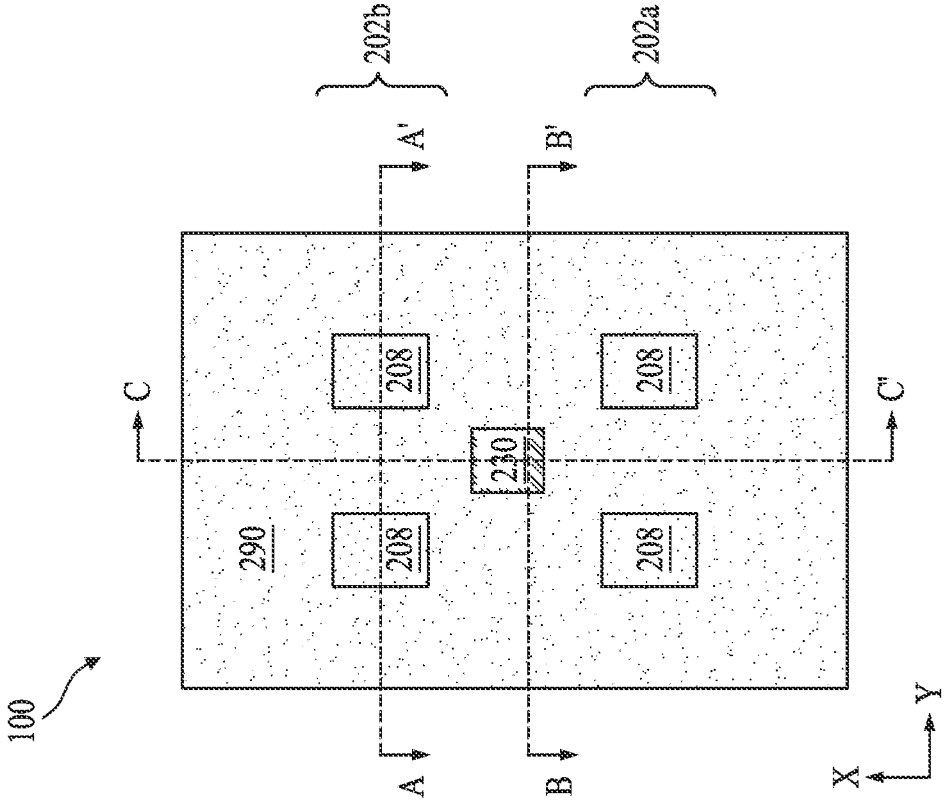
Figure 21D:
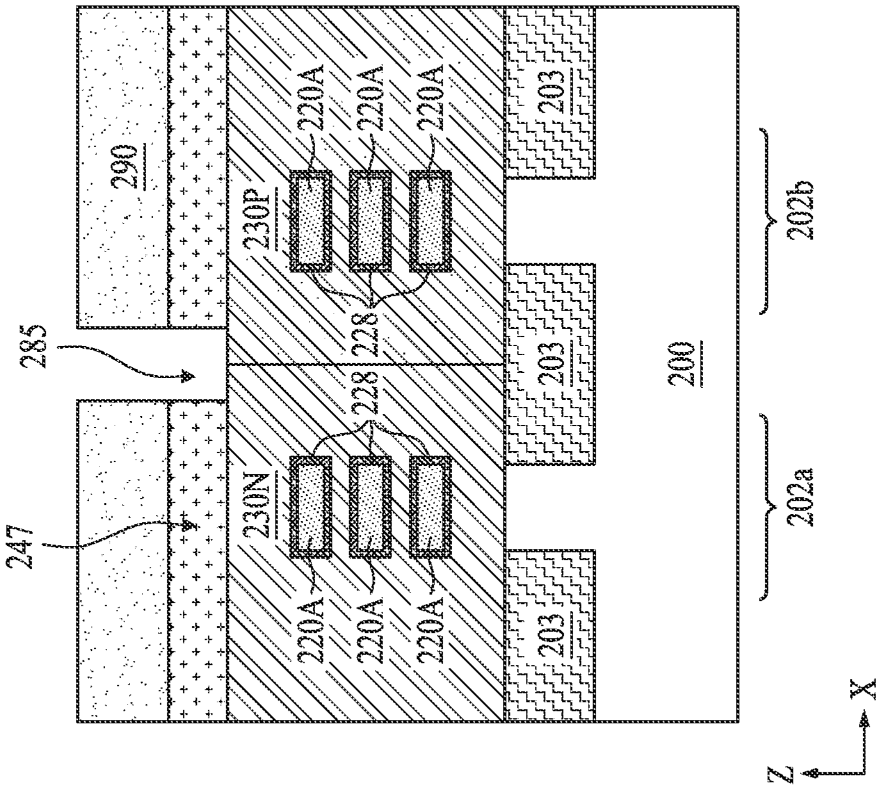
Figure 21C:
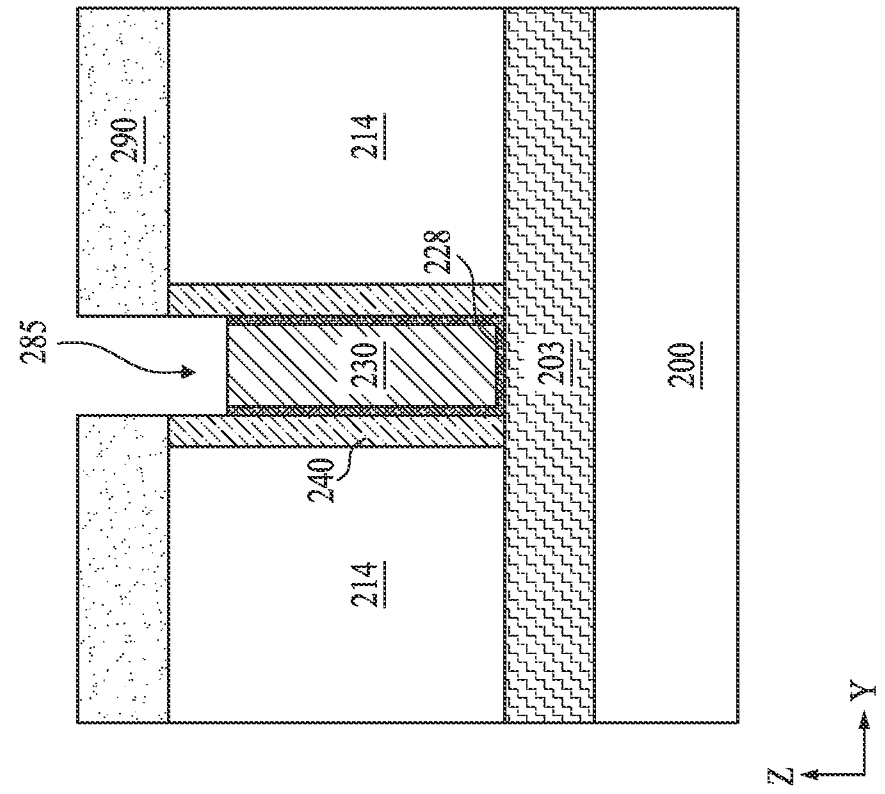
Figure 22A:
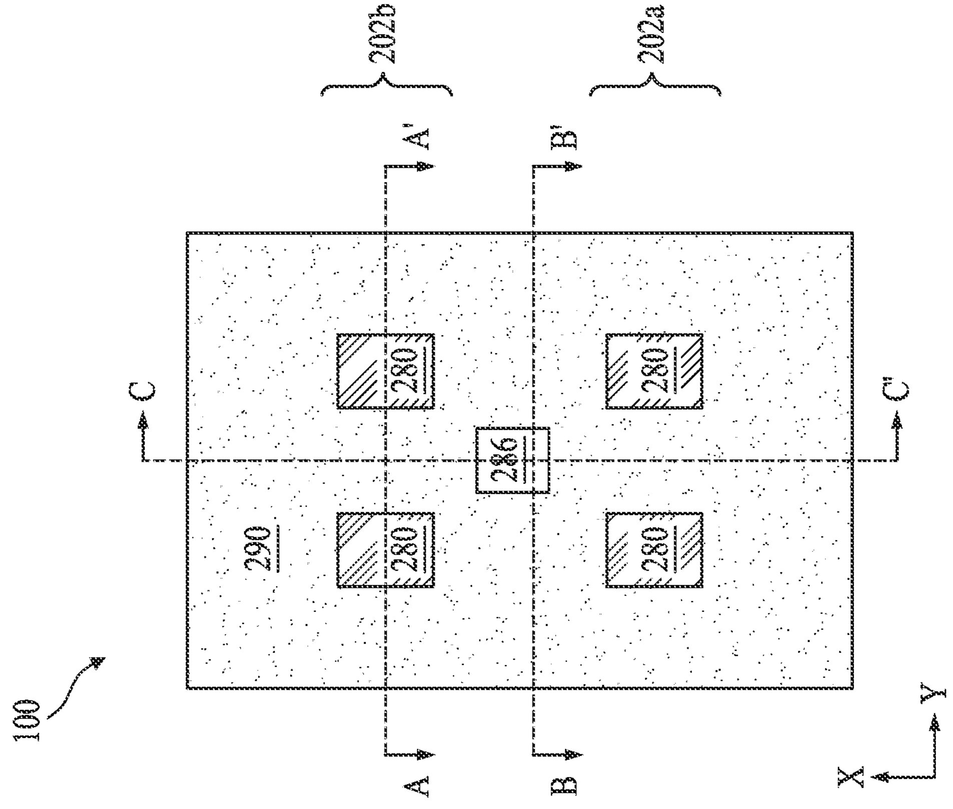
Figure 22B:
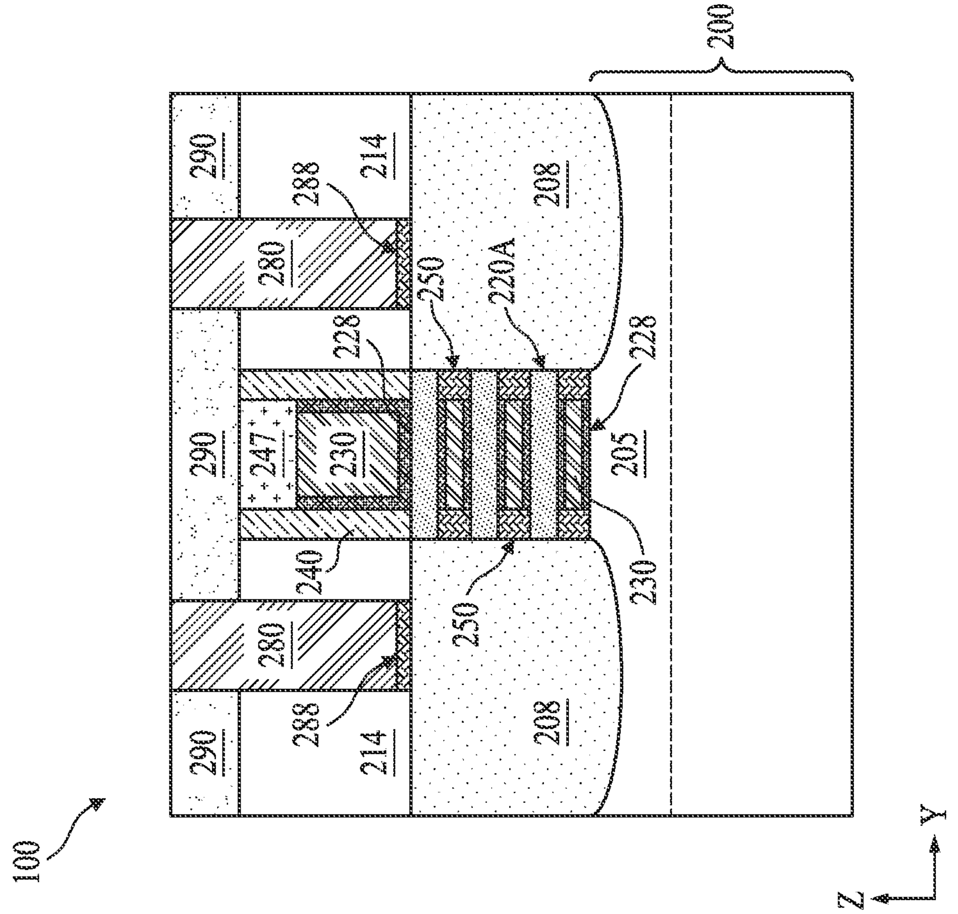
Figure 22D:
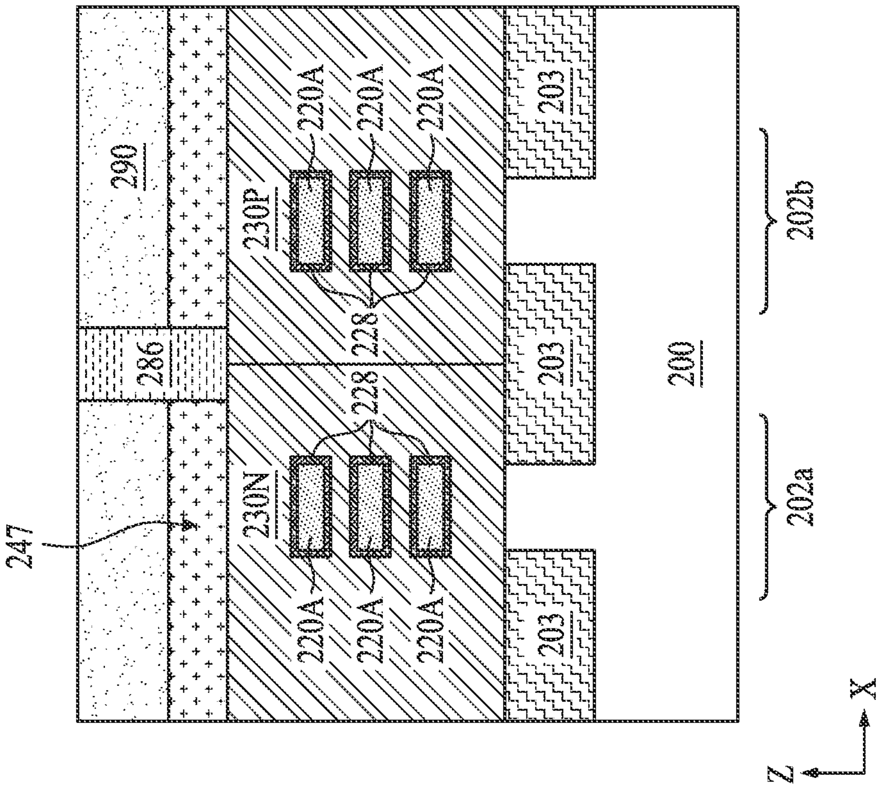
Figure 22C:
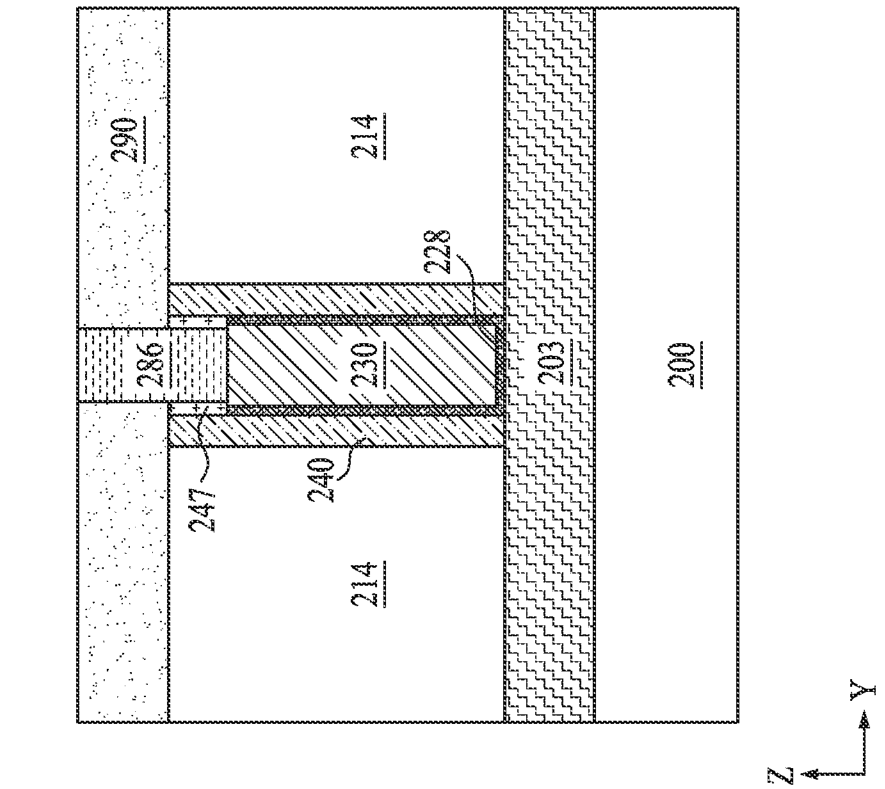
Figure 23B:
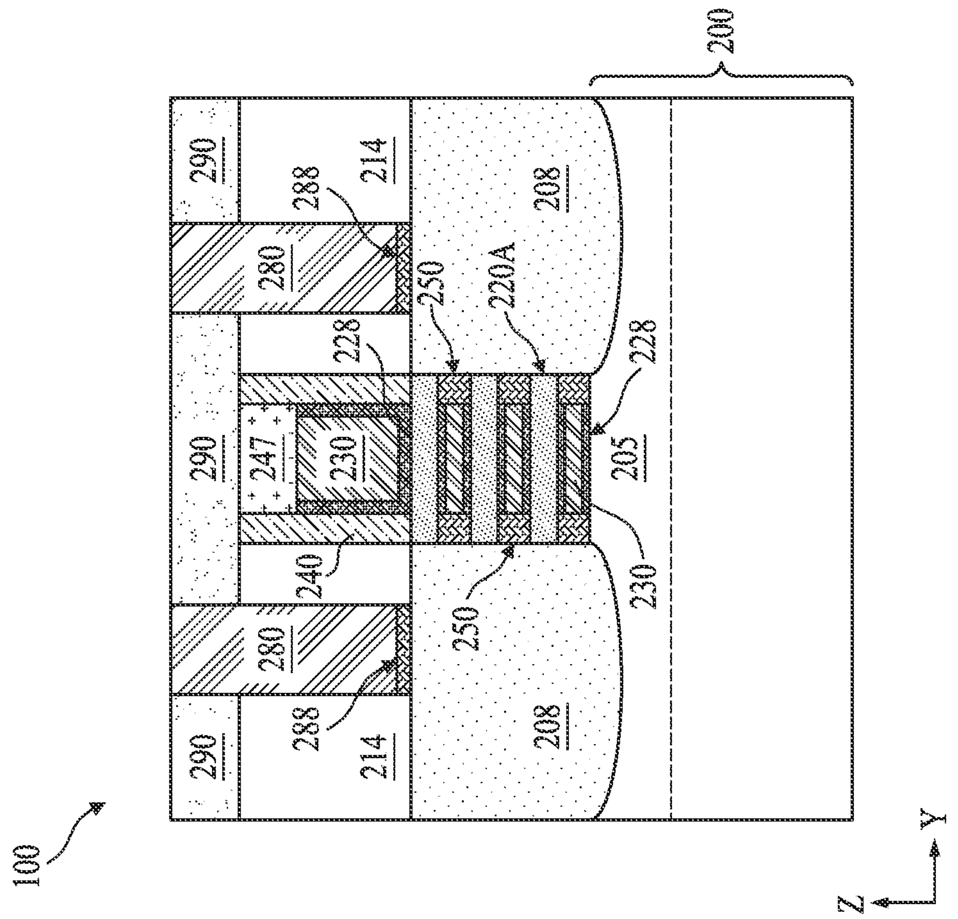
Figure 23A:
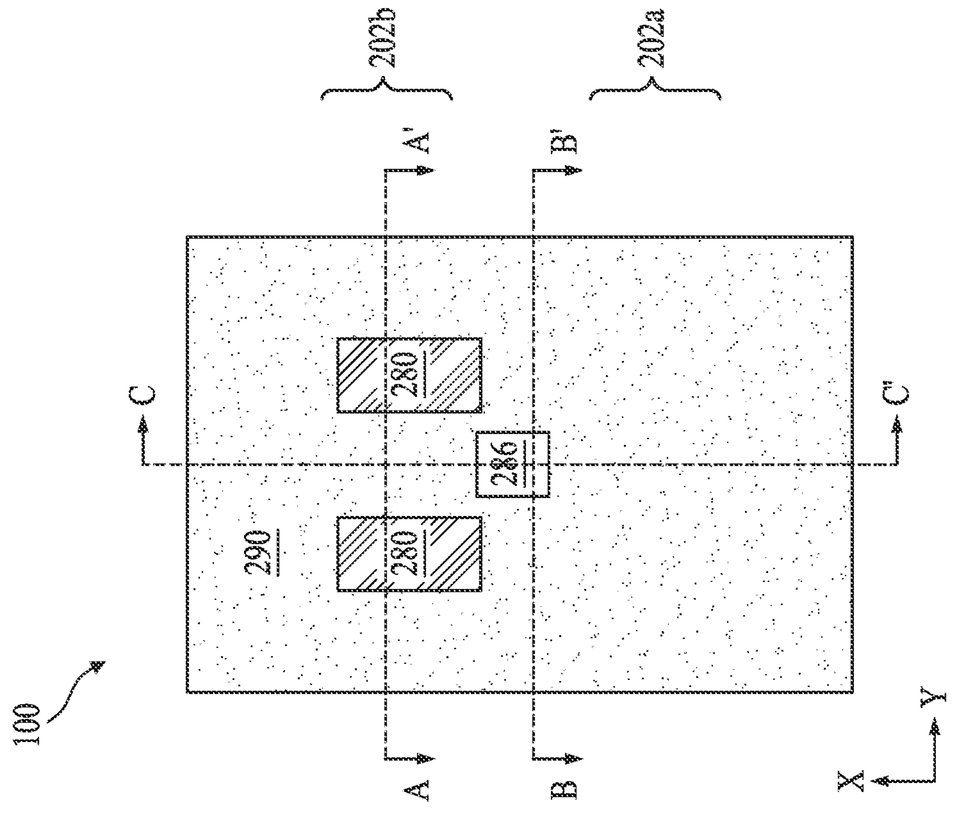
Figure 23D:
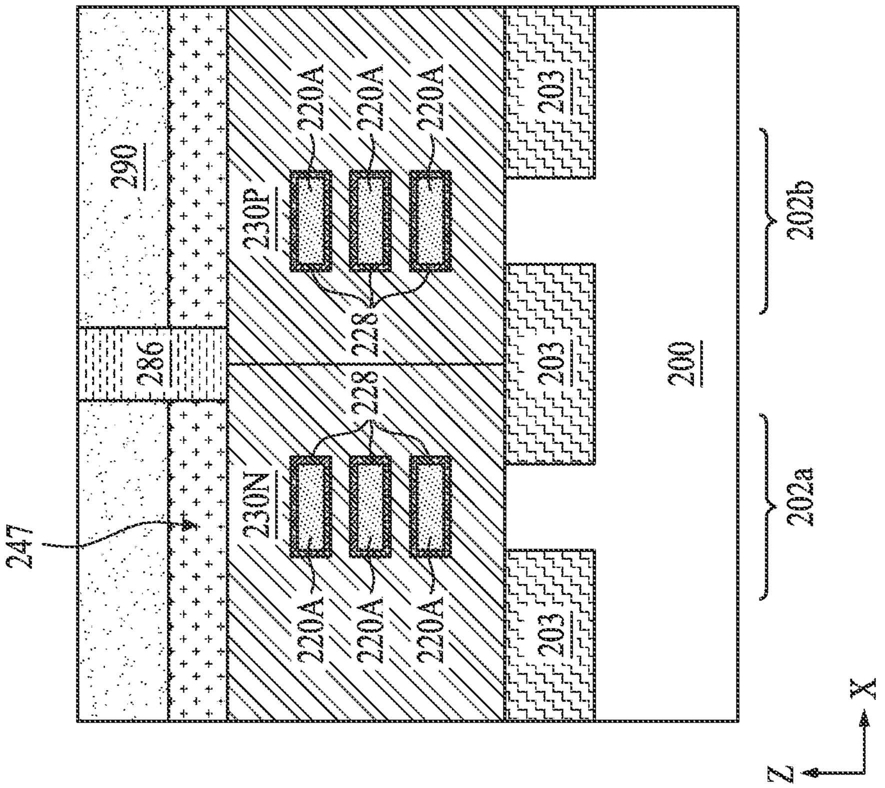
Figure 23C:
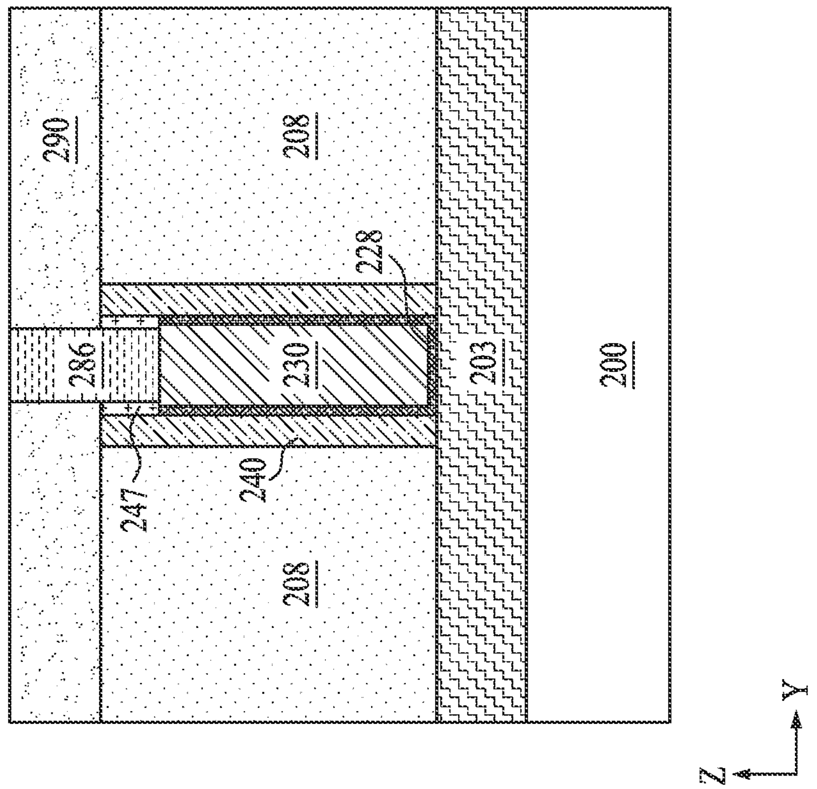
Figure 24B:
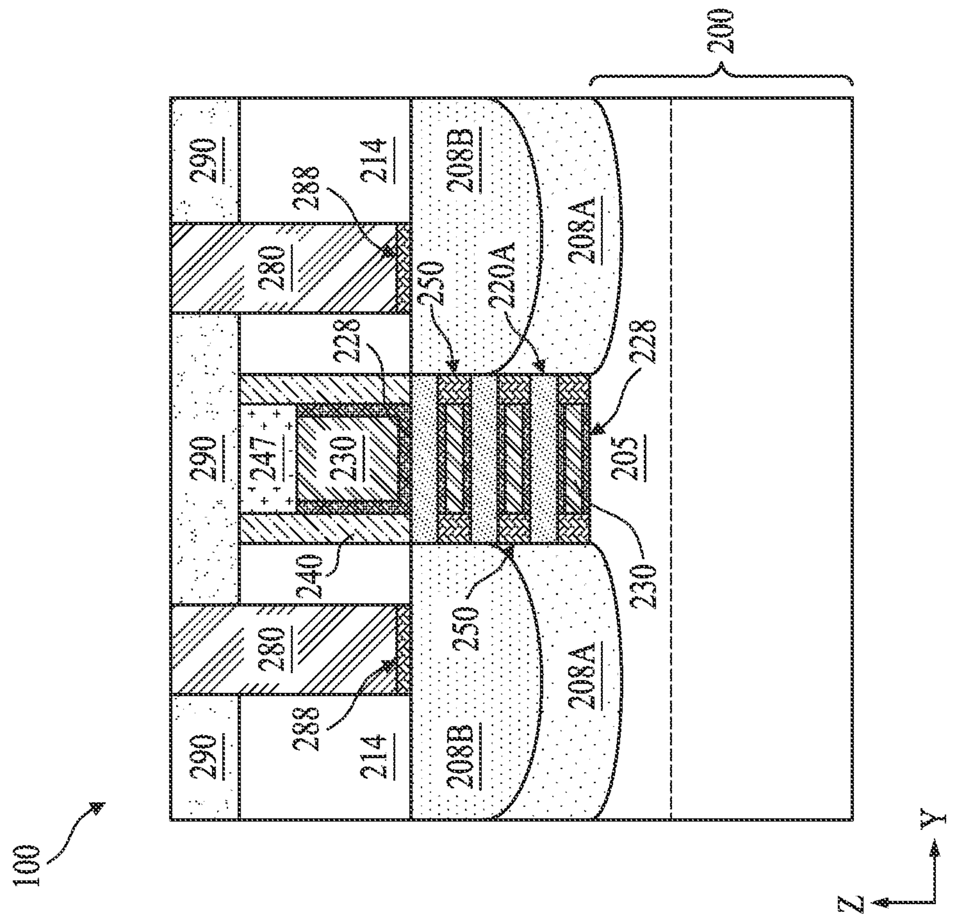
Figure 24A:
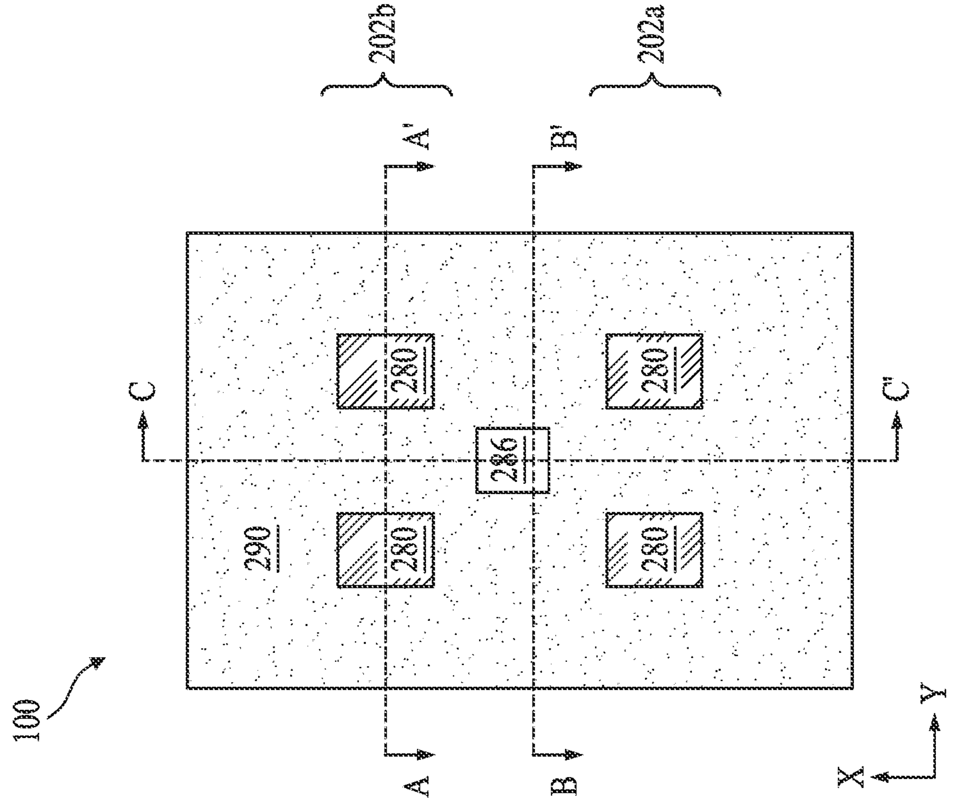
Figure 24D:
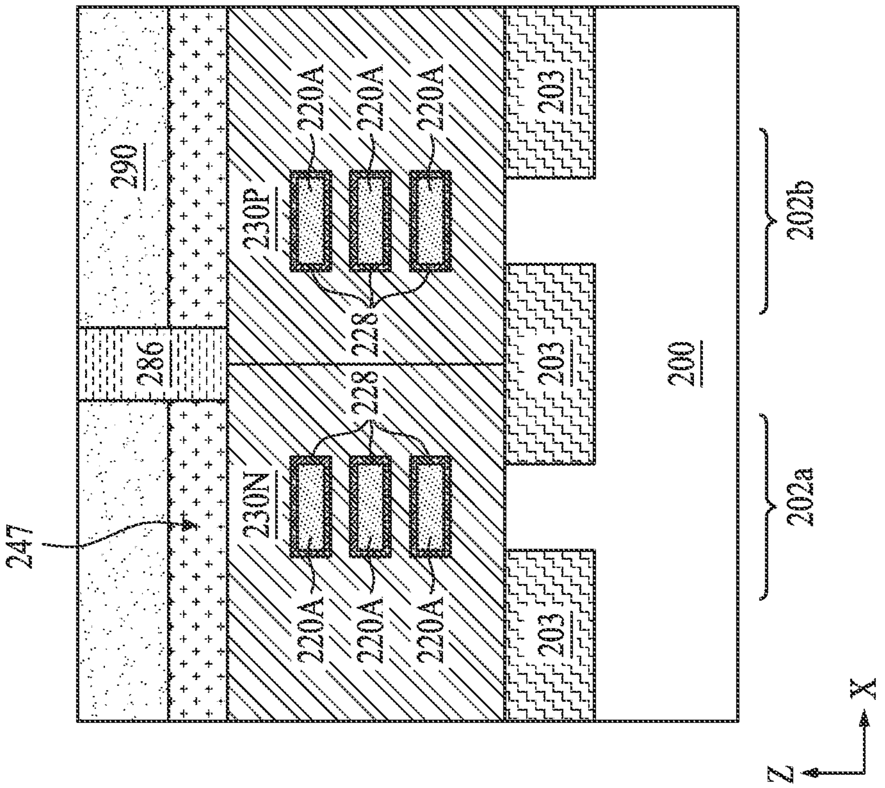
Figure 24C:
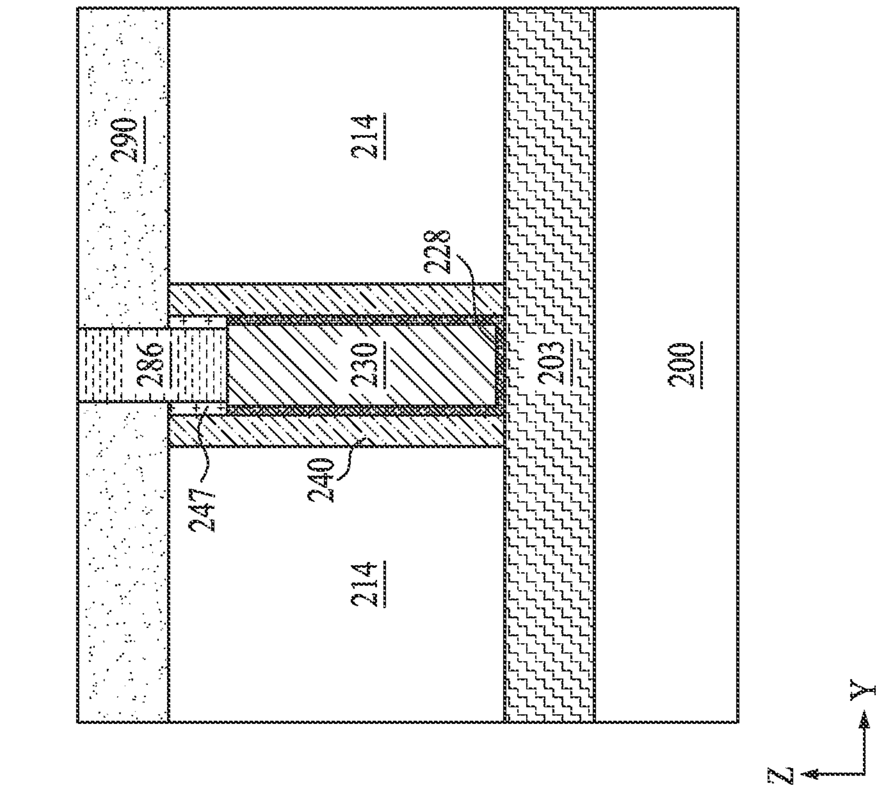

Referring to block 960 of FIG. 1C and FIGS. 19A-19D, the method 800 continues to form epitaxial source/drain features 208 in the recesses 151. Source/drain feature(s) may refer to a source or a drain, individually or collectively dependent upon the context. In some embodiments, one source/drain feature is a source electrode, and the other source/drain feature is a drain electrode. The semiconductor layers 220A that extend from one source/drain feature 208 to the other source/drain feature 208 may form channels of the GAA device 100. Multiple processes including etching and epitaxial growth processes may be employed to grow the epitaxial source/drain features 208. In the depicted embodiment, the epitaxial source/drain features 208 have top surfaces that are substantially aligned with the top surface of the topmost semiconductor layer 220A. However, in other embodiments, the epitaxial source/drain features 208 may alternatively have top surfaces that extend higher than the top surface of the topmost semiconductor layer 220A (e.g. in the Z-direction). In the depicted embodiment, the epitaxial source/drain features 208 occupy a lower portion of the recesses 151 (e.g. the portion defined by the inner spacers 250 and the semiconductor layers 220A), leaving an upper portion of the recesses 151 (e.g. the portion defined by the top spacers 240) open. In some embodiments, the epitaxial source/drain features 208 may merge together, for example, along the X-direction, to provide a larger lateral width than an individual epitaxial feature. In the depicted embodiments, as shown in FIG. 19A, the epitaxial source/drain features 208 are not merged.

The epitaxial source/drain features 208 may include any suitable semiconductor materials. For example, the epitaxial source/drain features 208 in an n-type GAA device may include Si, SiC, SiP, SiAs, SiPC, or combinations thereof; while the epitaxial source/drain features 208 in a p-type GAA device may include Si, SiGe, Ge, SiGeC, or combinations thereof. The source/drain features 208 may be doped in-situ or ex-situ. For example, the epitaxially grown Si source/drain features may be doped with carbon to form silicon:carbon (Si:C) source/drain features, phosphorous to form silicon:phosphor (Si:P) source/drain features, or both carbon and phosphorous to form silicon carbon phosphor (SiCP) source/drain features; and the epitaxially grown SiGe source/drain features may be doped with boron. One or more annealing processes may be performed to activate the dopants in the epitaxial source/drain features 208. The annealing processes may include rapid thermal annealing (RTA) and/or laser annealing processes.

The epitaxial source/drain features 208 directly interface with the continuous sidewall surfaces 171. During the epitaxial growth, semiconductor materials grow from the exposed top surface of the substrate 200 (e.g. the exposed top surface of doped region 205) as well as from the exposed side surfaces of the semiconductor layers 220A. It is noted that semiconductor materials do not grow from the surfaces of the inner spacers 250 and the top spacers 240 during the epitaxial growth process. Since the distance between horizontally adjacent portions of the semiconductor layer 220A decreases from the mouth of the trench 151 to the bottom 151*a* of the trenches 151, the epitaxial growth process fills up the bottom of the trench 151 prior to the top of the trenches 151. Consequently, the profile of the trenches 151 causes the epitaxial growth process to be a bottom-up conformal epitaxial growth process that fills the trenches 151, thereby preventing voids from being formed in the epitaxial source/drain features 208.

The GAA device 100 in the dashed box 253 of FIG. 19B is further illustrated in FIG. 19E. FIG. 19E is a top view of a portion of the GAA device 100 in the dashed box 253 of FIG. 19B. As illustrated in FIG. 19E, the inner spacers 250 laterally contact both the gate dielectric layer 228 and the gate electrode 230. The gate electrode 230 is separated and isolated from the source/drain feature 208 by inner spacer 250 without the gate dielectric layer 228 interposed between the inner spacer 250 and the gate electrode 230. Accordingly, as discussed above, the corner weak turn-on issues are eliminated.

In some embodiments, adjacent source/drain features 208 are formed to be merged together with increased top surface areas, such as illustrated in FIGS. 19F-19I.

Referring to block 970 of FIG. 1B and FIGS. 20A-20D, an interlayer dielectric (ILD) layer 214 is formed over the epitaxial source/drain features 208 in the remaining spaces of the trenches 151, as well as vertically over the isolation features 203. The ILD layer 214 may also be formed in between the adjacent gates 244 along the Y-direction, and in between the source/drain features 208 along the X-direction. The ILD layer 214 may include a dielectric material, such as a low-k material, an extreme low-k material, other suitable dielectric materials or a combination thereof. For example, other suitable dielectric materials for the ILD layer 214 may include $SiO_2$, SiOC, SiON, or combinations thereof. In some embodiments, the low-k dielectric material may include fluorinated silica glass (FSG), carbon doped silicon oxide, Black Diamond® (Applied Materials of Santa Clara, California), Xerogel, Aerogel, amorphous fluorinated carbon, Parylene, BCB (bis-benzocyclobutenes), SiLK (Dow Chemical, Midland, Michigan), polyimide, other suitable dielectric materials, or a combination thereof. The ILD layer 214 may include a single layer or multiple layers, and may be formed by a suitable technique, such as CVD, ALD, and/or spin-on techniques. In one embodiment, the ILD layer 214 includes a conformal etch stop layer (such as silicon nitride) disposed thereon and a low-k dielectric material disposed on the etch stop layer to fill the remaining spaces of the trenches 151. After forming the ILD layer 214, a CMP process may be performed to remove excessive portions of the ILD layer 214, thereby planarizing the top surface of the ILD layer 214. Among other functions, the ILD layer 214 provides electrical isolation between the various components of the GAA device 100.

Referring to block 980 of FIG. 1C, FIGS. 21A-21D and FIGS. 22A-22D, various contact features are formed in the ILD layer 214, including gate contact features 286 landing on gate electrodes 230, and source/drain contact features 280 landing on the source/drain features 208. The formation of the contact features includes a procedure that further includes patterning, deposition, and CMP process. In various embodiments, the source/drain contact features 280 and the gate contact features 286 may be collectively formed by a single procedure, or alternatively may be separately formed. In some embodiments, the source/drain contact features include two layers vertically stacked on and are formed by two procedures, each of which includes patterning, deposition, and CMP process.

In the described embodiment below, the gate contact features 286 and source/drain contact features 280 are collectively formed. This is for illustration and is not intended to limit the scope of the present disclosure.

Referring to FIGS. 21A-21D, contact holes are formed in the ILD layer 214. A patterned mask layer 290 is formed on the ILD layer 214 by a procedure that includes deposition, photolithography process and etch. The patterned mask layer 290 includes various openings that define regions for contact holes. The patterned mask layer 290 may include one or more dielectric layer, such as silicon oxide, silicon nitride or a combination thereof.

An etch process is applied to the ILD layer 214 using the patterned mask layer 290 as an etch mask. The etch process includes wet etch, dry etch, or a combination thereof, designed with etchant to selectively etch the ILD layer with no or minimized etch effect the patterned mask layer 290. In one embodiment for illustration, the ILD layer 214 includes silicon oxide and the patterned mask layer 290 includes silicon nitride, and the etch process includes wet etch with an etchant of hydrofluoric acid (HF) or buffered hydrofluoric acid (BHF).

Especially, the gate top cap 247 is utilized to further control the etch process to be self-aligned. In furtherance of the above embodiment, the gate top cap 247 also includes a material different from that of the ILD layer 214 and the patterned mask layer 290, such as polysilicon or silicon carbide, even an opening of the patterned mask layer 290 intended to a source/drain region is not completely aligned to the source/drain region and is shifted to the gate electrode 230, the gate top cap 247 can prevent the gate electrode 230 from being etched and avoid the short issue between the source/drain feature 208 and the gate electrode 230.

In some embodiments, the etch process includes more than one etch step. For example, the ILD layer 214 includes an etch stop layer and a bulky ILD layer, the etch process includes a first etch step with an etchant to selectively remove the bulky ILD layer and a second etch step with an etchant to selectively remove the etch stop layer.

In some embodiments, the etch process is designed to further etch the portions of the source/drain features 208 such that the source/drain features 208 are recessed with a curved top surface. The subsequently formed source/drain contacts can have increased contact area and reduced contact resistance.

Additionally, a portion of the gate top cap 247 is also removed to form contact hole 285 over the gate electrode 230. The contact hole 285 expose the metal layers of the gate electrode 230 for subsequent contact feature formation. Any appropriate methods may be used to form the contact holes 285 and may include multiple lithography and etching steps.

Referring to FIGS. 22A-22D, contact features 280 are formed within the contact holes 278. Accordingly, the contact features 280 are embedded within ILD 214, and electrically connect the epitaxial source/drain features 208 to external conductive features (not shown). Additionally, contact features 286 are also formed in the contact holes 285. Accordingly, the contact features 286 are embedded within the gate top cap 247 and electrically connect the gate structure 272 to external conductive features (not shown). The contact features 280 and the contact features 286 may each include Ti, TiN, TaN, Co, Ru, Pt, W, Al, Cu, or combinations thereof, respectively. Any suitable methods may be used to form the contact features 280 and the contact features 286. In some embodiments, additional features are formed in between the source/drain features 208 and the contact features 280, such as self-aligned silicide features 288. A CMP process may be performed to planarize the top surface of the GAA device 100.

In some embodiments, the contact features may include a barrier layer, such as a pair titanium and titanium nitride or a pair tantalum and tantalum nitride. A conformal barrier layer is deposited in the contact holes and the bulk fill metal is deposited on the barrier layer to fill in the contact holes. In some embodiments, the gate contact features 286 and the source/drain contact features 280 are formed separately and may include different materials for various fabrication and integration considerations. For example, the source/drain contact features 280 have a greater height than that of the gate contact features 286 and therefore chose a metal with better gap filling effect (such as tungsten) while the gate contact features 286 chose a metal with a higher conductivity (such as copper).

As discussed above, the dielectric constants for the top spacers 240 and the inner spacers 250 may be different. Whether the top spacer or the inner spacer should use a material with a lower dielectric constant may be a design choice. For example, the design choice may be made based on a comparison between the relative importance of the capacitance values of different device regions. For example, a designer may assign the material with the lower dielectric constant to the top spacer 240 rather than the inner spacer 250. On the other hand, if it is more important to have a higher capacitance in the source/drain-metal gate region, the designer may assign the material with the lower dielectric constant to the inner spacer 250 rather than the top spacer 240.

In some embodiments, adjacent source/drain features 208 are formed to be merged together with increased contact areas, such as FIGS. 19F-19I. In this case, the contact features may be designed differently. For example, a merged source/drain feature 208 may share a rectangle contact feature, such as those illustrated in FIGS. 23A-23D.

Adjacent source/drain features 208 may be formed with multiple layers. In some embodiments, such as illustrated in FIGS. FIGS. 24A-24D, the source/drain features 208 include two semiconductor layers 208A and 208B with different composition (such as silicon and silicon germanium), different dopant concentrations, or a combination thereof. In one example for p-type source/drain of a GAA transistor, the first semiconductor layer 208A includes silicon germanium with a first dopant concentration and the second semiconductor layer 208B includes silicon germanium with a second dopant concentration greater than the first dopant concentration. This structure of the source/drain feature has an advantage, among other benefits, In one example for p-type source/drain of a GAA transistor, the first semiconductor layer 208A includes silicon germanium with a first p-type dopant concentration and the second semiconductor layer 208B includes silicon germanium with a second p-type dopant concentration greater than the first p-type dopant concentration. The p-type dopant includes boron in one example. With an uneven dopant concentration, the source/drain resistance is reduced and diffusion from source/drain feature to the channel is minimized. During the epitaxial growth, the precursor includes dopant-containing chemical and corresponding gas flow can be tuned to achieve the above structure or even graded concentration doping profile.

In another example for n-type source/drain of a GAA transistor, the first semiconductor layer 208A includes silicon with a first n-type dopant concentration and the second semiconductor layer 208B includes silicon with a n-type second dopant concentration greater than the first n-type dopant concentration. The n-type dopant includes phosphorous in one example. The method 800 may include other operations implemented before, during or after the above described operations, such as a block 990 to form a final structure of the GAA device 100.

The present disclosure provides a GAA device structure and a method making the same. The gate structure is formed before the formation of the source/drain features. Though not intended to be limiting, embodiments of the present disclosure offer benefits for semiconductor processing and semiconductor devices. For example, the disclosed method allows better control to channel without weak corner turn-on issue. In another example, the channel dimension is further well controlled due to the channel length is determined by one etch process instead of two etch process, reducing the variations of the channel length. In another example, epitaxial source/drain loss is avoided during the channel release process. Furthermore, this present method also provides versatility allowing the designers to selectively optimize the capacitances of different regions of the GAA device according to design needs. As such, the present disclosure provides methods that improve the performance, functionality, and/or reliability of GAA devices. Stated differently, The GAA devices and methods of manufacture that are proposed in the present disclosure exhibit desirable properties, examples being: (1) gate first process to have better control to channels; (2) elimination of the weak corner turn on issue; (3) gate portions next to inner spacers may have different dimensions than portion next to gate spacer, which provides another way to tune the device performance when performing the lateral etching for inner spacers; (4) reduced source/drain loss; and (5) decreased capacitance between a source/drain region and an adjacent active gate structure.

In one example aspect, the present disclosure provides a method that includes forming a stack including first semiconductor layers and second semiconductor layers over a semiconductor substrate, wherein the first semiconductor layers and the second semiconductor layers have different material compositions and alternate with one another within the stack; forming a dummy gate structure over the stack, wherein the dummy gate structure wraps around top and sidewall surfaces of the stack; forming a gate spacer on sidewalls of the dummy gate structure, the gate spacer being disposed on the top of the stack; forming a dielectric layer with the dummy gate embedded therein; removing the dummy gate structure from the top and the sidewall surfaces of the stack, resulting in a gate trench in the dielectric layer; removing the second semiconductor layers through the gate trench such that the first semiconductor layers remain and form semiconductor sheets; forming a metal gate wrapping around the semiconductor sheets; and thereafter, forming a source/drain feature adjacent the metal gate and connecting to the semiconductor sheets.

In another example aspect, the present disclosure provides a method that includes forming a stack including first semiconductor layers and second semiconductor layers over a semiconductor substrate, wherein the first semiconductor layers and the second semiconductor layers have different material compositions and alternate with one another within the stack; forming a dummy gate structure over the stack, wherein the dummy gate structure wraps around top and sidewall surfaces of the stack; forming a dielectric layer with the dummy gate embedded therein; removing the dummy gate structure from the top and the sidewall surfaces of the stack, resulting in a gate trench in the dielectric layer; removing the second semiconductor layers through the gate trench such that the first semiconductor layers remain and form semiconductor sheets; forming a metal gate wrapping around the semiconductor sheets, the metal gate including a rare earth metal oxide layer; and thereafter, forming a source/drain feature adjacent the metal gate and connecting to the semiconductor sheets.

In yet another example aspect, the present disclosure provides an integrated circuit (IC) device that includes a semiconductor substrate having a top surface; a first source/drain feature and a second source/drain feature disposed on the semiconductor substrate; a plurality of semiconductor layers extending longitudinally in a first direction and connecting the first source/drain feature and the second source/drain feature, wherein the semiconductor layers are stacked over and spaced apart in a second direction perpendicular to the first direction, the second direction being normal to the top surface of the semiconductor substrate; a gate structure engaging and wrapping around center portions of the semiconductor layers, wherein the gate structure includes a gate dielectric layer and a gate electrode; and an inner spacer interposed between the first source/drain feature and the gate electrode, wherein the inner spacer contacts a sidewall of the gate dielectric layer and a sidewall of the gate electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a stack including first semiconductor layers and second semiconductor layers over a semiconductor substrate, wherein the first semiconductor layers and the second semiconductor layers have different material compositions and alternate with one another within the stack;

forming a dummy gate structure over the stack, wherein the dummy gate structure wraps around top and sidewall surfaces of the stack;

forming a gate spacer on sidewalls of the dummy gate structure, the gate spacer being disposed on the top of the stack;

forming a dielectric layer with the dummy gate embedded therein;

removing the dummy gate structure from the top and the sidewall surfaces of the stack, resulting in a gate trench in the dielectric layer;

removing the second semiconductor layers through the gate trench such that the first semiconductor layers remain and form semiconductor sheets;

forming a metal gate wrapping around the semiconductor sheets; and forming a source/drain feature adjacent the metal gate and connecting to the semiconductor sheets after the forming of the metal gate wrapping around the semiconductor sheets, wherein the forming a source/drain feature includes etching to selectively recess a source/drain region, thereby forming a source/drain recess, etching to laterally recess the metal gate from the source/drain recess, thereby forming a lateral recess such that a gate dielectric layer and a gate electrode of the metal gate is exposed in the lateral recess, forming inner spacers in the lateral recess, the inner spacers contacting the gate dielectric layer and the gate electrode, and forming a source/drain feature in the source/drain recess.

2. The method of claim 1, wherein the forming a metal gate includes depositing a first work function metal layer; and depositing a first rare earth metal oxide layer over the first work function metal layer.

3. The method of claim 2, wherein the forming a metal gate further includes depositing a second work function metal layer over the first rare earth metal oxide layer; and depositing a second rare earth metal oxide layer over the second work function metal layer.

4. The method of claim 2, wherein the forming a first rare earth metal oxide layer includes depositing a rare earth metal oxide that includes one of $La_2O_3$, $Dy_2O_3$, and a combination thereof.

5. The method of claim 1, wherein the etching to laterally recess the metal gate from the source/drain recess includes etching the metal gate from the source/drain recess such that a bottom portion of the metal gate has a first width different from a second width of a top portion of the metal gate.

6. The method of claim 1, wherein the forming inner spacers in the lateral recess includes forming an inner spacer physically contacting a sidewall of the gate dielectric layer and a sidewall of the gate electrode.

7. The method of claim 6, wherein the inner spacers and gate spacer are different in composition.

8. The method of claim 7, wherein the removing the second semiconductor layers through the gate trench includes performing an etch process such that the second semiconductor layers are recessed beyond the gate spacer.

9. The method of claim 1, wherein the forming a source/drain feature includes forming a source/drain feature merged with an adjacent source/drain feature.

10. The method of claim 1, wherein the forming a source/drain feature includes forming a source/drain feature with two semiconductor layers with different dopant concentrations.

11. The method of claim 1, wherein the removing the second semiconductor layers through the gate trench includes laterally recessing the second semiconductor layers beyond the gate spacer; and the forming a metal gate wrapping around the semiconductor sheets includes forming the gate dielectric layer and the gate electrode vertically overlapped with the gate spacer.

12. The method of claim 1, further comprising forming a gate contact landing on and electrically connecting to the gate electrode, wherein the gate contact includes a bottom surface below a bottom surface of the gate spacer.

13. A method, comprising:

forming a stack including first semiconductor layers and second semiconductor layers over a semiconductor substrate, wherein the first semiconductor layers and the second semiconductor layers have different material compositions and alternate with one another within the stack;

forming a dummy gate structure over the stack, wherein the dummy gate structure wraps around top and sidewall surfaces of the stack;

forming a dielectric layer with the dummy gate embedded therein;

removing the dummy gate structure from the top and the sidewall surfaces of the stack, resulting in a gate trench in the dielectric layer;

removing the second semiconductor layers through the gate trench such that the first semiconductor layers remain and form semiconductor sheets;

forming a metal gate wrapping around the semiconductor sheets, the metal gate including a rare earth metal oxide layer; and forming a source/drain feature adjacent the metal gate and connecting to the semiconductor sheets after the forming of the metal gate wrapping around the semiconductor sheets, wherein the forming a source/drain feature includes etching to selectively recess a source/drain region, thereby forming a source/drain recess, etching to laterally recess the metal gate from the source/drain recess, thereby forming a lateral recess such that a gate dielectric layer and a gate electrode of the metal gate is exposed in the lateral recess, forming inner spacers in the lateral recess, the inner spacers contacting both the gate dielectric layer and the gate electrode of the metal gate, and forming a source/drain feature in the source/drain recess.

14. The method of claim 13, wherein the forming a metal gate includes forming a gate dielectric layer and forming a gate electrode over the gate dielectric layer; and the forming a gate electrode includes depositing a first work function metal layer and depositing a first rare earth metal oxide layer over the first work function metal layer.

15. The method of claim 14, wherein the forming a metal gate electrode further includes depositing a second work function metal layer over the first rare earth metal oxide layer;

depositing a second rare earth metal oxide layer over the second work function metal layer; and depositing a fill metal layer over the second rare earth metal oxide.

16. The method of claim 15, wherein the first and second rare earth metal oxide layers include one of $La_2O_3$, $Dy_2O_3$, and a combination thereof.

17. The method of claim 14, wherein the etching to laterally recess the metal gate from the source/drain recess includes etching the metal gate from the source/drain recess such that a bottom portion of the metal gate has a first width different from a second width of a top portion of the metal gate.

18. The method of claim 14, wherein the forming inner spacers in the lateral recess includes forming an inner spacer physically contacting a sidewall of the gate dielectric layer and a sidewall of the gate electrode.

19. A method, comprising:

forming a stack including first semiconductor layers and second semiconductor layers over a semiconductor substrate, wherein the first semiconductor layers and the second semiconductor layers have different material compositions and alternate with one another within the stack;

forming a dummy gate structure over the stack, wherein the dummy gate structure wraps around top and sidewall surfaces of the stack;

forming a dielectric layer with the dummy gate embedded therein;

removing the dummy gate structure from the top and the sidewall surfaces of the stack, resulting in a gate trench in the dielectric layer;

removing the second semiconductor layers through the gate trench such that the first semiconductor layers remain and form semiconductor sheets;

forming a gate dielectric layer;

forming a gate electrode over the gate dielectric layer, wherein the gate electrode is wrapping around the semiconductor sheets, and wherein the gate electrode includes a rare earth metal oxide layer and a first work function metal layer;

forming inner spacers vertically interposed between the semiconductor sheets, the inner spacers contacting both the gate dielectric layer and the gate electrode; and forming a source/drain feature adjacent the gate electrode, contacting the inner spacers, and connecting to the semiconductor sheets after the forming of the gate dielectric layer and the forming of the gate electrode over the gate dielectric layer.

20. The method of claim 19, wherein the forming a gate electrode includes depositing the first work function metal layer;

depositing the first rare earth metal oxide layer over the first work function metal layer;

depositing a second work function metal layer over the first rare earth metal oxide layer; and depositing a second rare earth metal oxide layer over the second work function metal layer.

* * * * *